United States Patent
Yaegashi et al.

(10) Patent No.: US 10,317,797 B2
(45) Date of Patent: Jun. 11, 2019

(54) PATTERN FORMING METHOD FOR FORMING A PATTERN

(71) Applicants: Tokyo Electron Limited, Tokyo (JP); TOKYO OHKA KOGYO CO., LTD., Kanagawa (JP)

(72) Inventors: Hidetami Yaegashi, Tokyo (JP); Kenichi Oyama, Yamanashi (JP); Katsumi Ohmori, Kanagawa (JP); Yoshitaka Komuro, Kanagawa (JP); Takehiro Seshimo, Kanagawa (JP)

(73) Assignees: Tokyo Electron Limited, Tokyo (JP); TOKYO OHKA KOGYO CO., LTD., Kanagawa (JP)

( * ) Notice: Subject to any disclaimer, the term of this patent is extended or adjusted under 35 U.S.C. 154(b) by 0 days.

(21) Appl. No.: 15/817,724

(22) Filed: Nov. 20, 2017

(65) Prior Publication Data

US 2018/0143536 A1    May 24, 2018

(30) Foreign Application Priority Data

Nov. 22, 2016    (JP) .................. 2016-226896

(51) Int. Cl.
*G03F 1/36*    (2012.01)
*G03F 1/76*    (2012.01)
(Continued)

(52) U.S. Cl.
CPC ............... *G03F 7/202* (2013.01); *G03F 1/36* (2013.01); *G03F 1/76* (2013.01); *G06F 17/5081* (2013.01); *H01L 21/0337* (2013.01); *H01L 21/32139* (2013.01); *H01L 21/768* (2013.01); *H01L 23/544* (2013.01); *H01L 2223/54426* (2013.01)

(58) Field of Classification Search
CPC .. G03F 7/202; H01L 21/0337; H01L 21/3086
See application file for complete search history.

(56) References Cited

U.S. PATENT DOCUMENTS

2012/0115074 A1* 5/2012 Zhang ............... H01L 21/02115
430/5
2013/0243958 A1* 9/2013 Senzaki ............... C09D 133/18
427/264

(Continued)

FOREIGN PATENT DOCUMENTS

JP    2014-056864    3/2014

*Primary Examiner* — Changhyun Yi
(74) *Attorney, Agent, or Firm* — IPUSA, PLLC

(57) ABSTRACT

A pattern forming method includes forming a first film patterned in a line and space shape on an underlayer film, the line and space shape including lines and a space arranged therebetween, forming a second film to cover the first film, removing the second film to form the second film on a side surface of the first film in a line shape, forming a third film to cover the first film and the second film, removing the third film formed on the first film and the second film to form the third film on a side surface of the second film, and converting the third film after removing the third film formed on the first film and the second film, wherein the third film is comprised of an organic metal compound, the organic metal compound having characteristic to increase etching tolerance when the organic metal compound undergoes a predetermined process.

6 Claims, 56 Drawing Sheets

(51) Int. Cl.
*G03F 7/20* (2006.01)
*G06F 17/50* (2006.01)
*H01L 21/033* (2006.01)
*H01L 21/768* (2006.01)
*H01L 23/544* (2006.01)
*H01L 21/3213* (2006.01)

(56) References Cited

U.S. PATENT DOCUMENTS

| | | | |
|---|---|---|---|
| 2015/0235839 A1* | 8/2015 | Coskun | H01L 21/0274 438/694 |
| 2016/0223976 A1* | 8/2016 | Yumita | G03G 15/751 |
| 2017/0090306 A1* | 3/2017 | Inagaki | G03G 5/0696 |

* cited by examiner

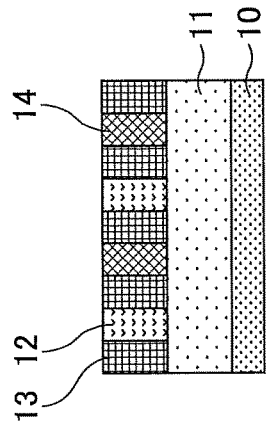
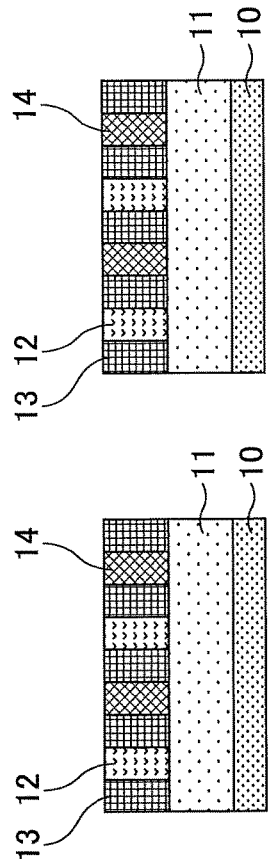
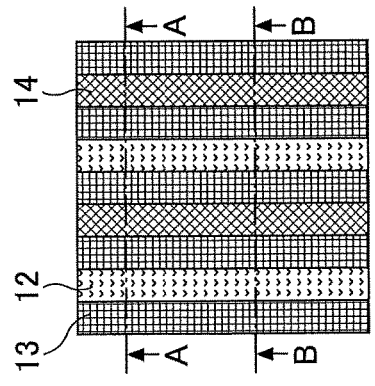
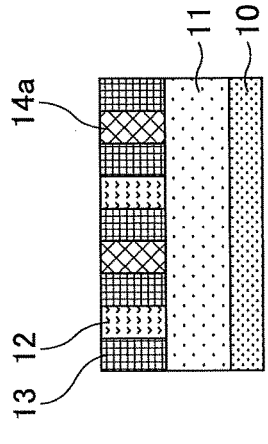
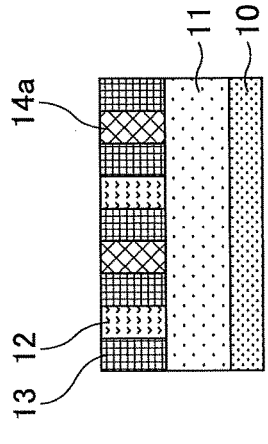
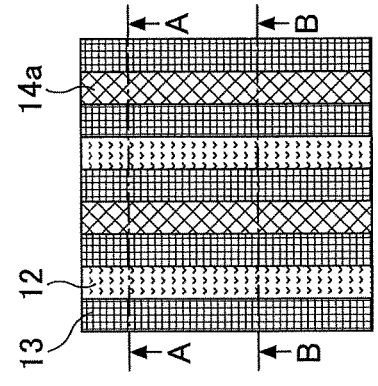

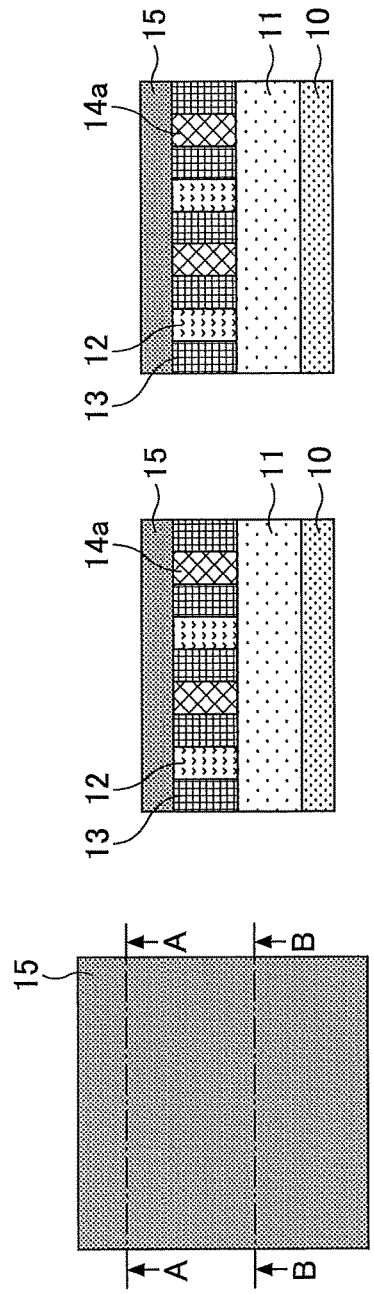
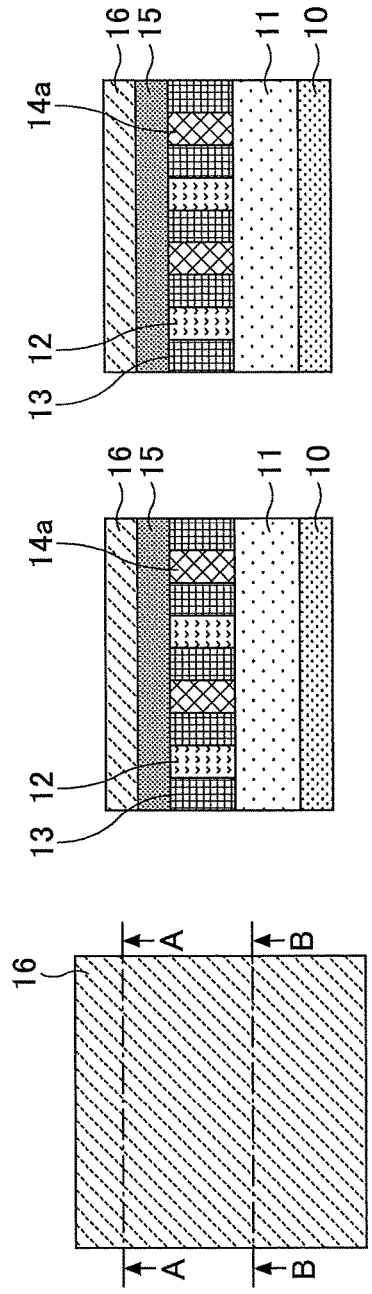

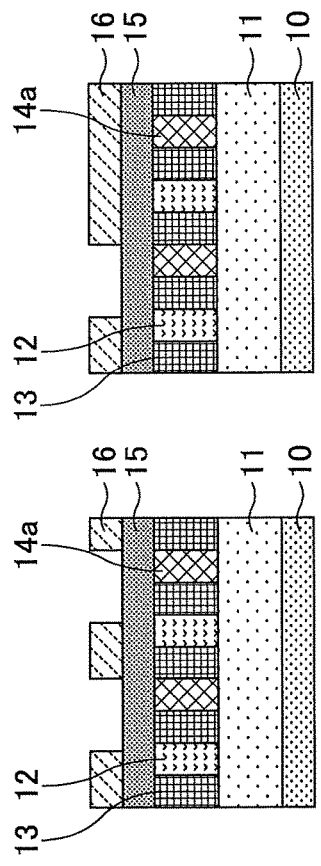
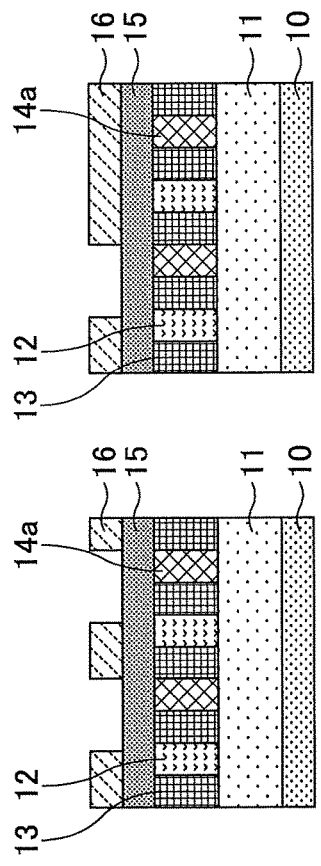
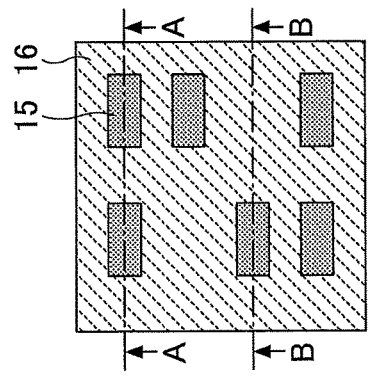
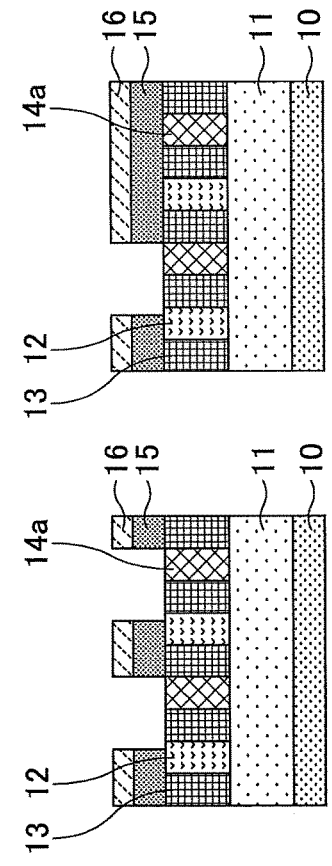
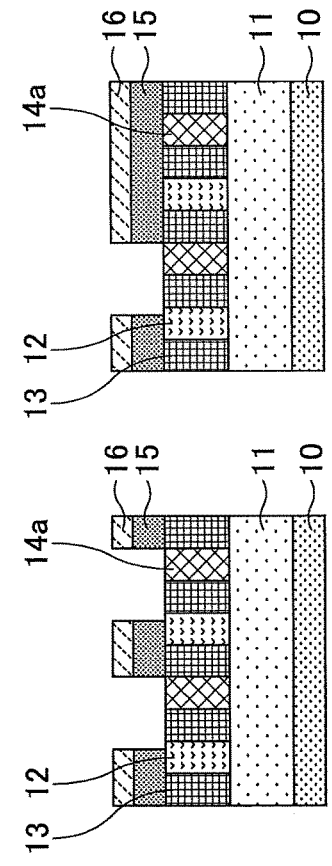
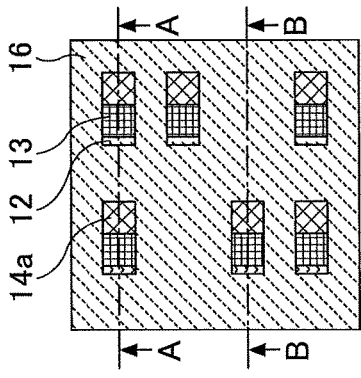

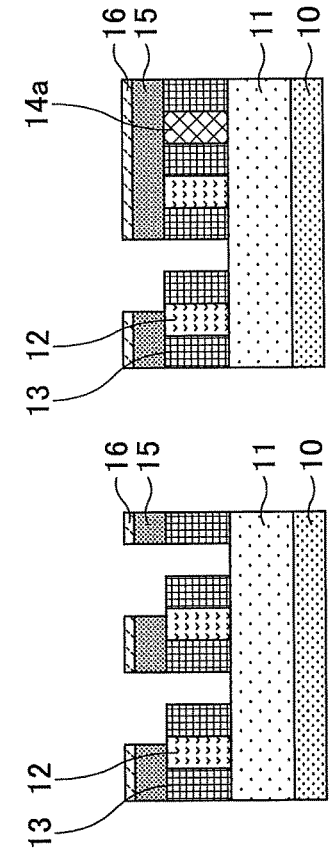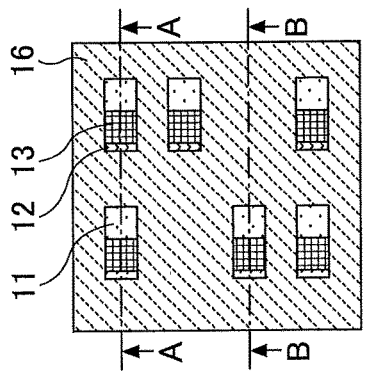
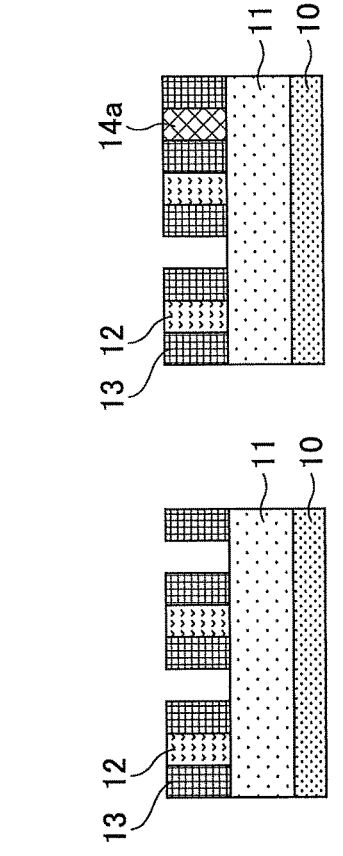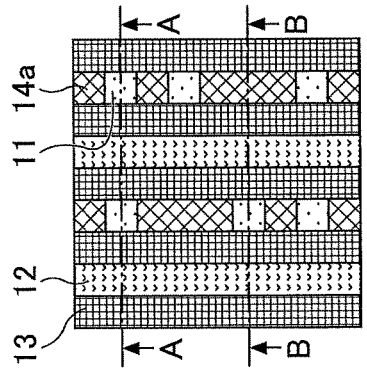

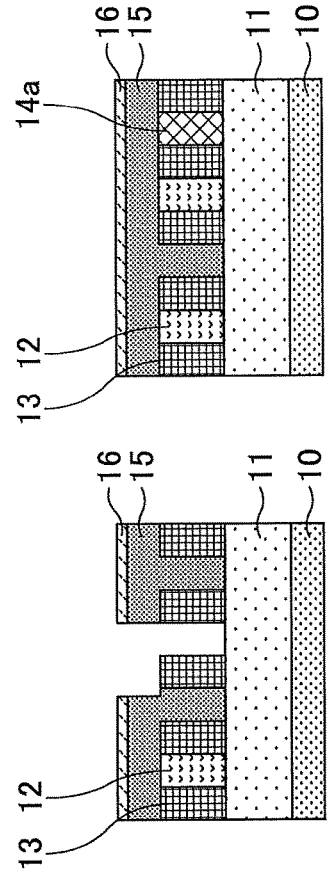
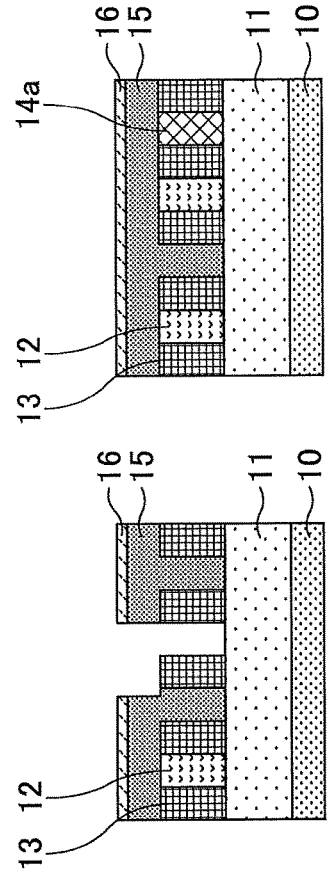
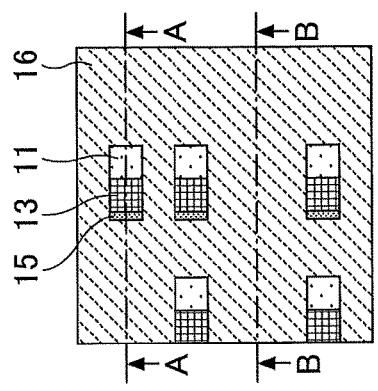
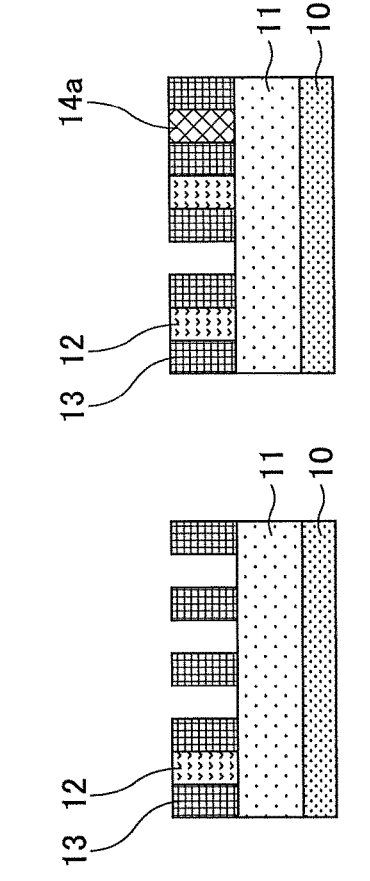
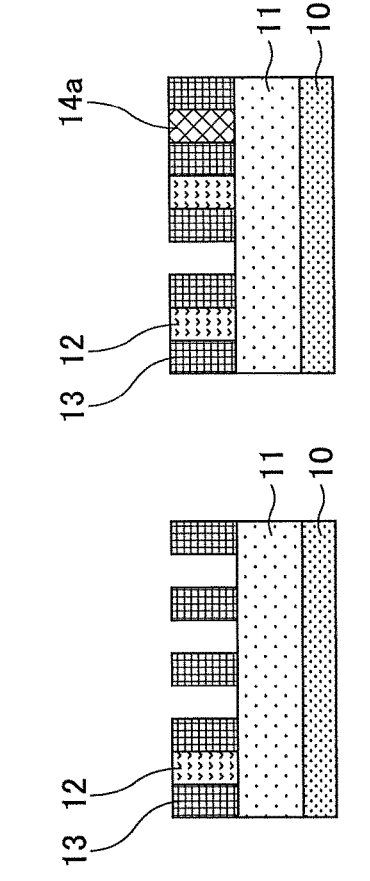
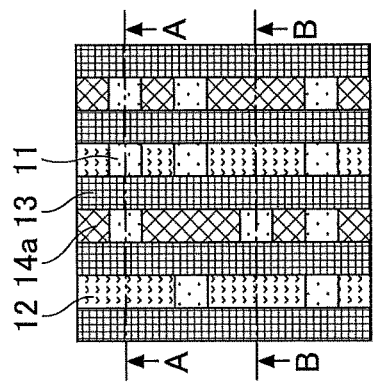

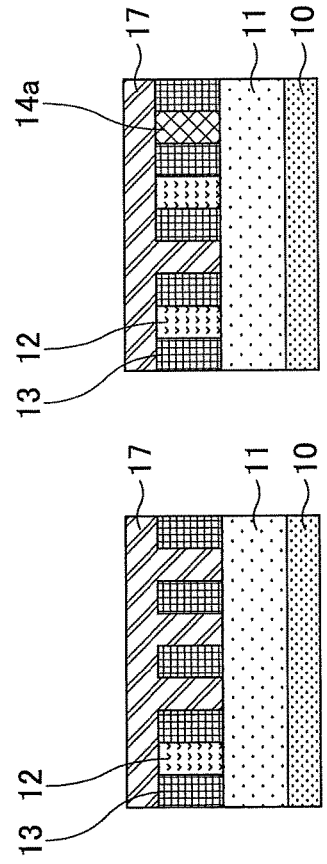 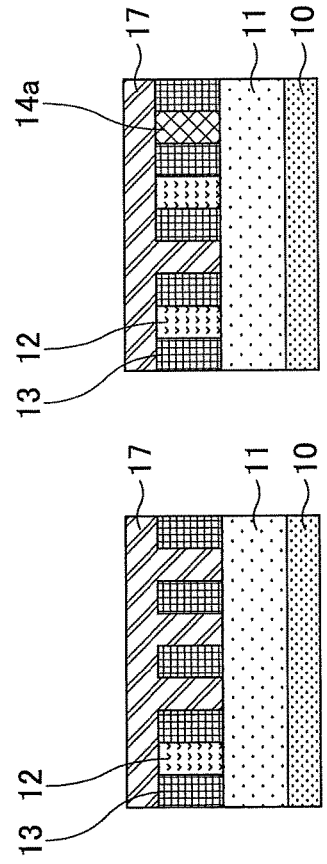 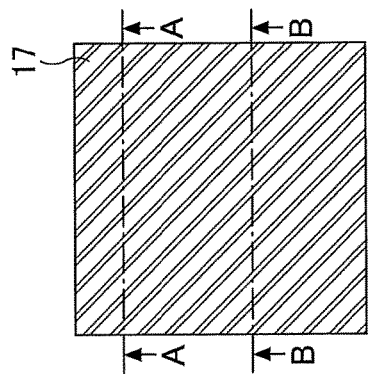
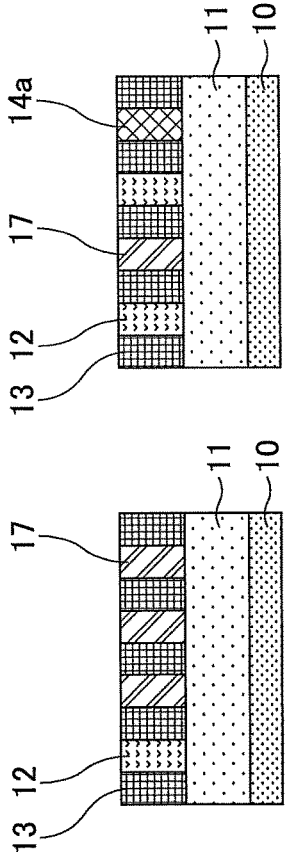 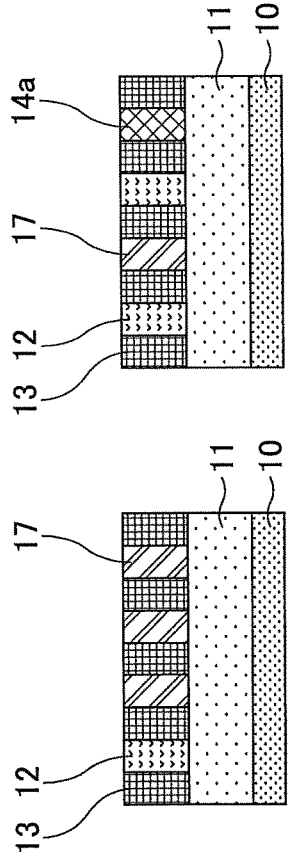 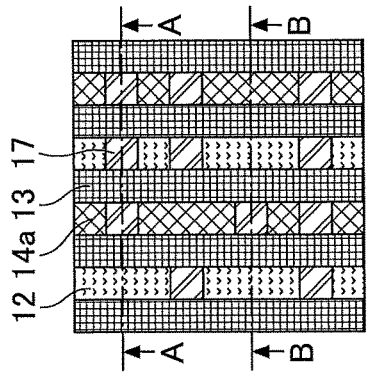

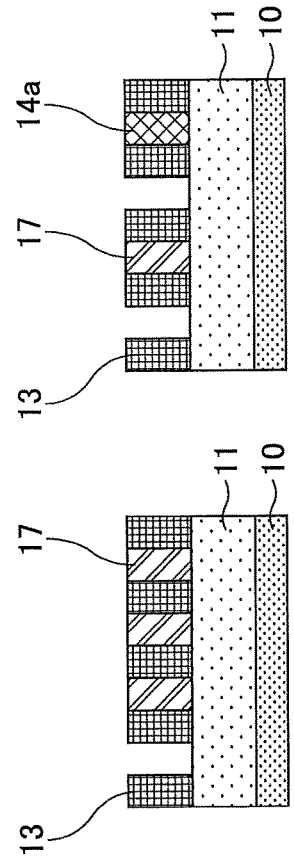
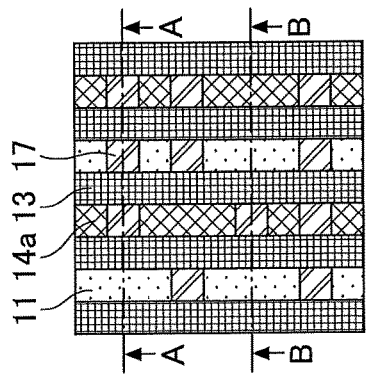
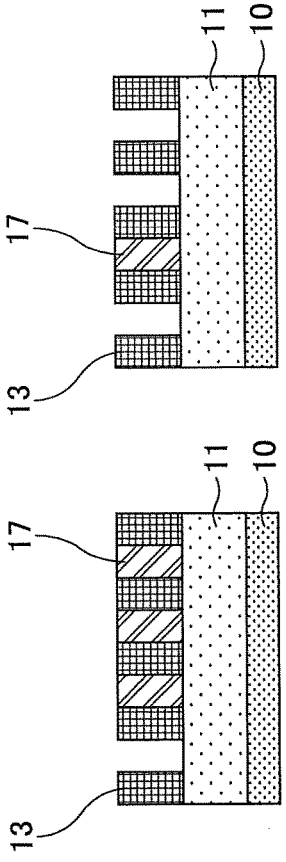
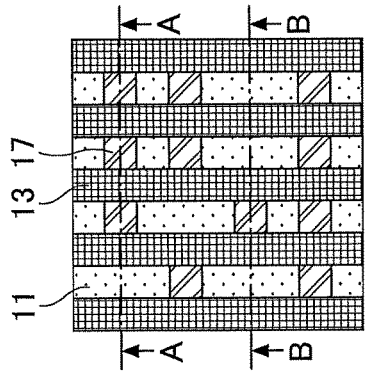

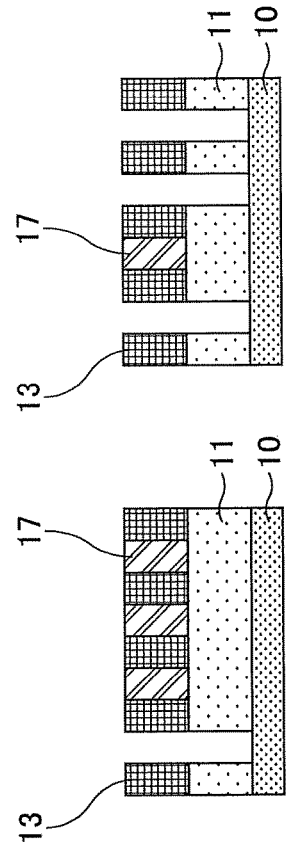
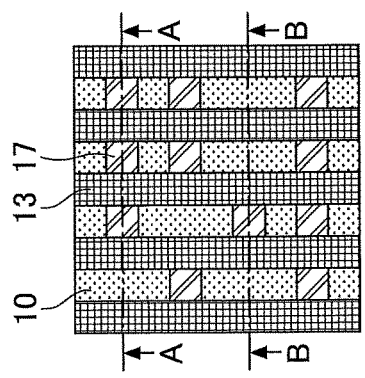
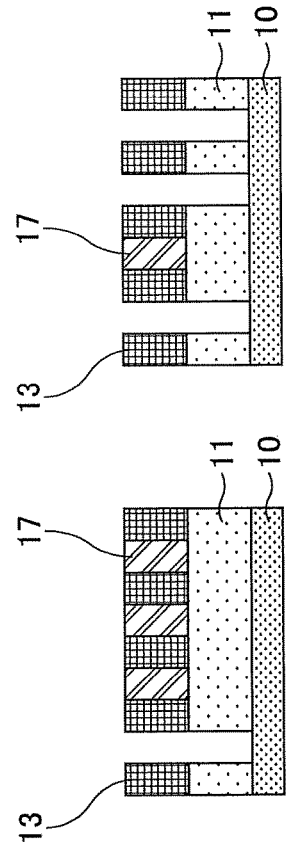
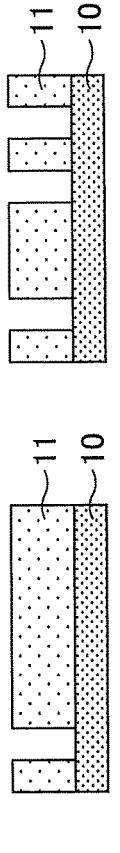
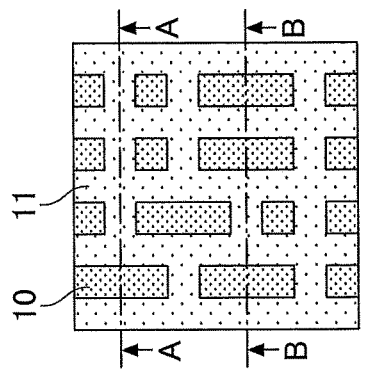
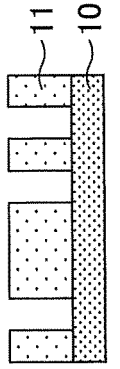

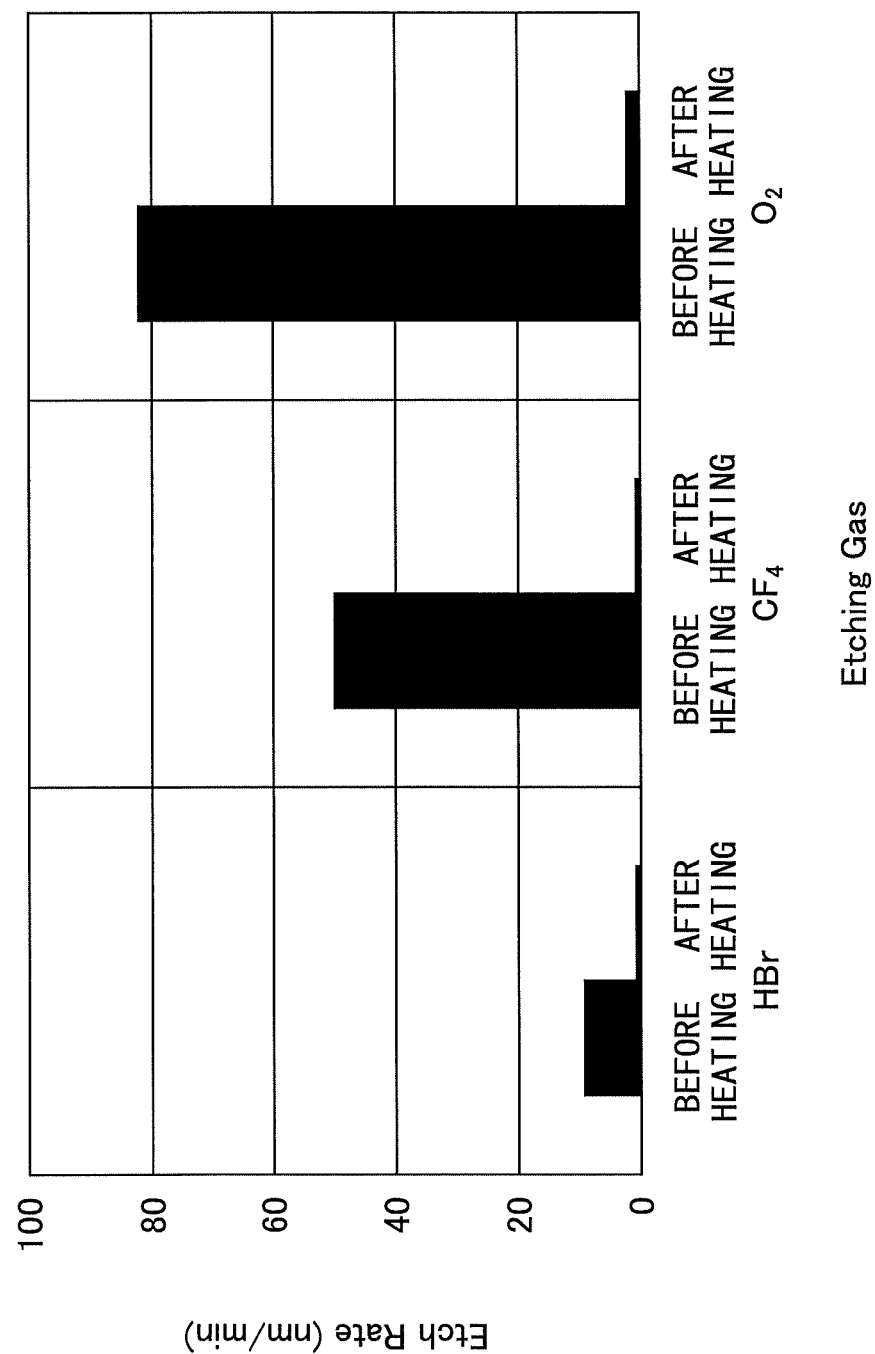

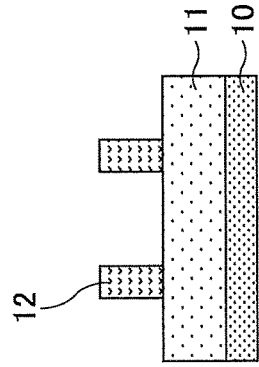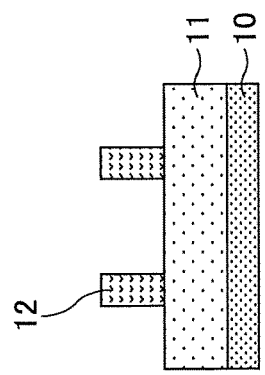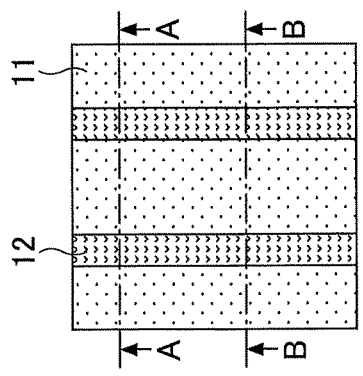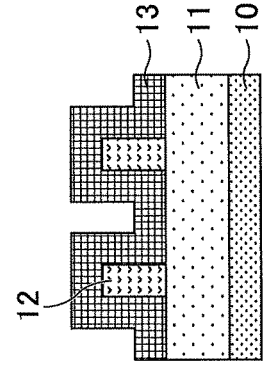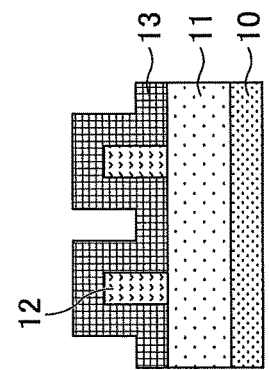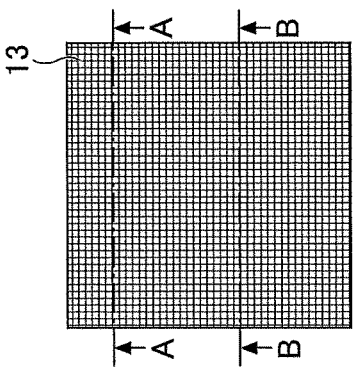

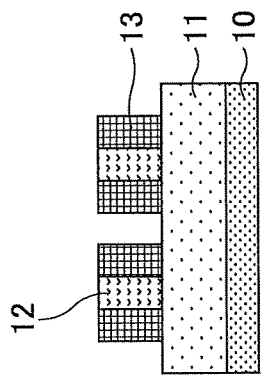
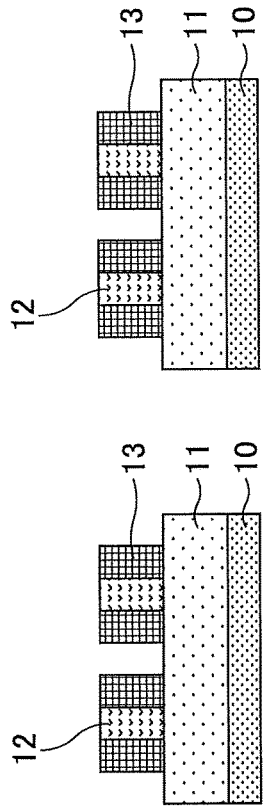
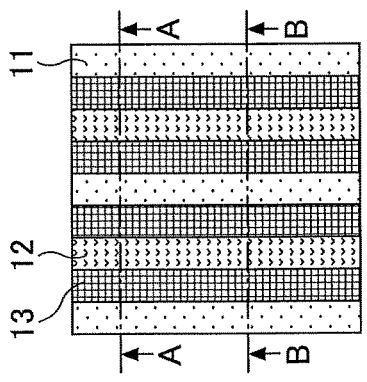
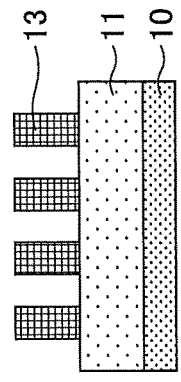
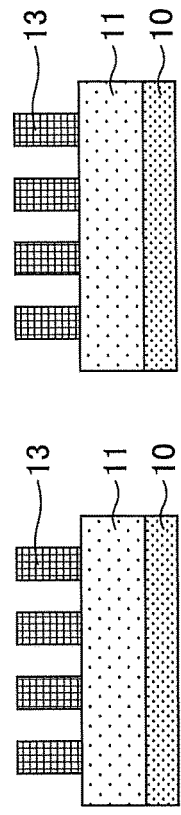
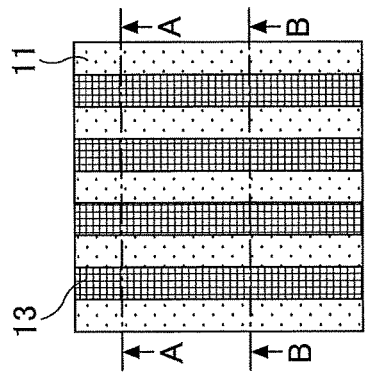

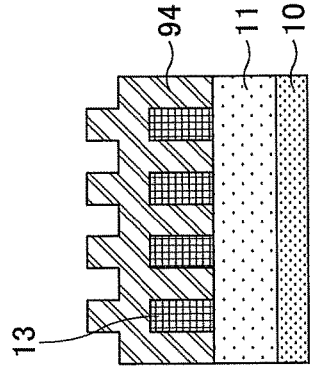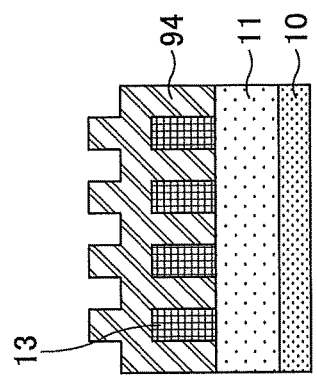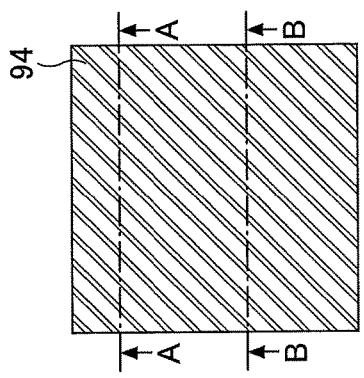
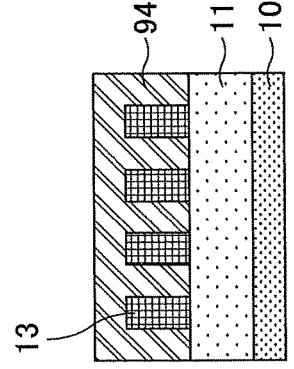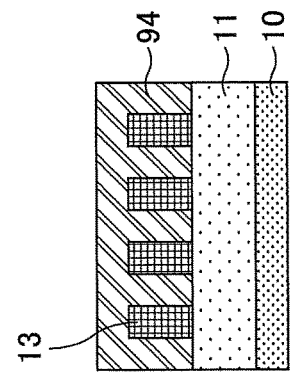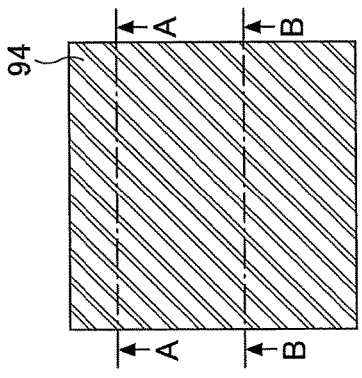

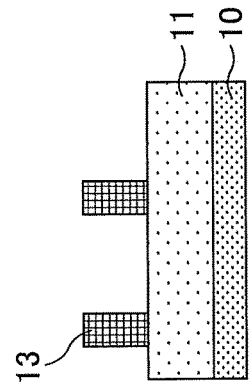 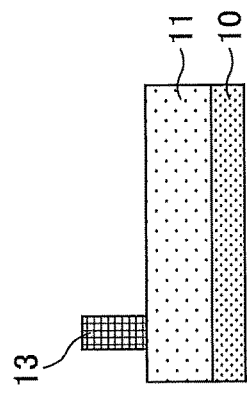 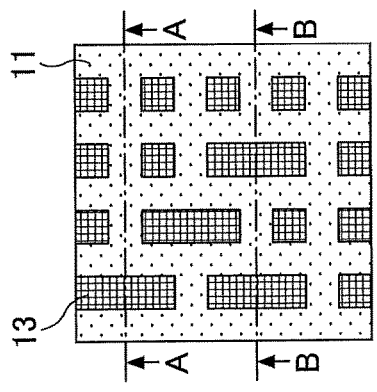
FIG.40A  FIG.40B  FIG.40C
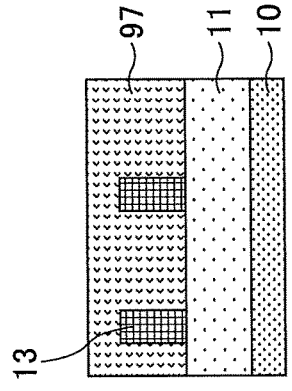 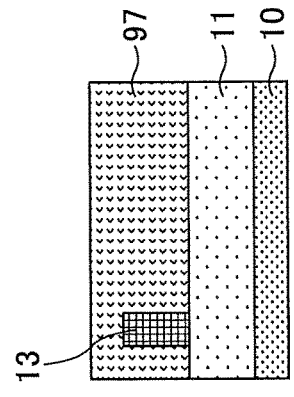 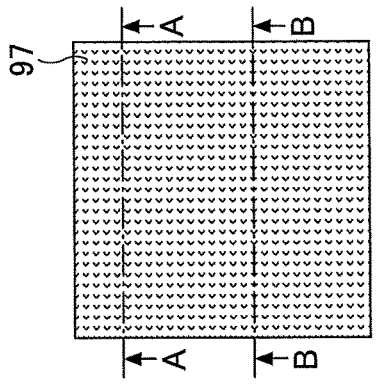
FIG.41A  FIG.41B  FIG.41C

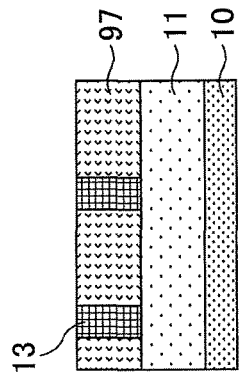
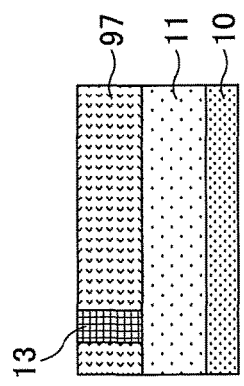
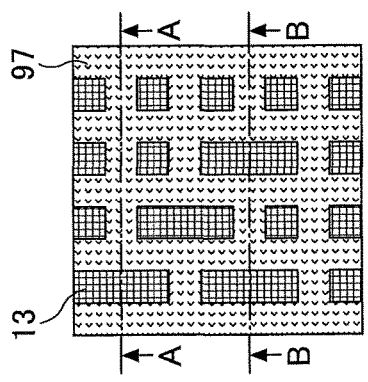
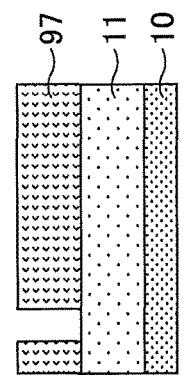
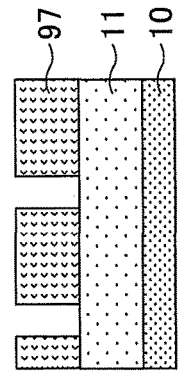
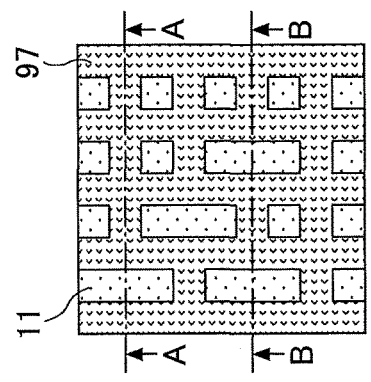

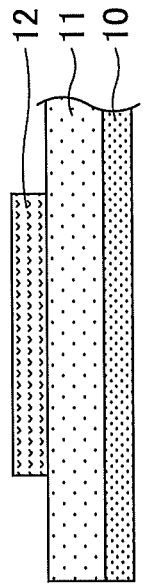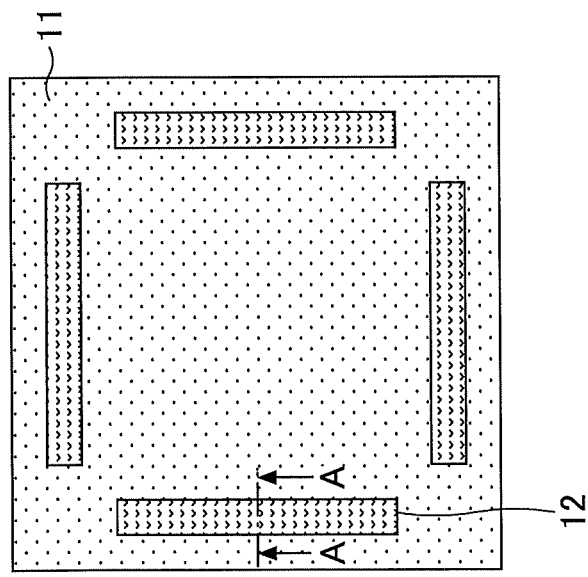

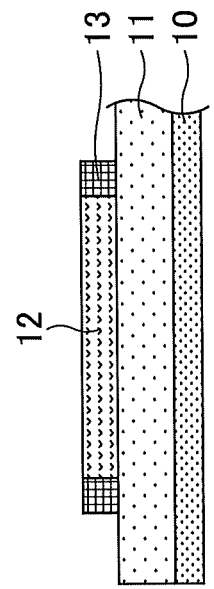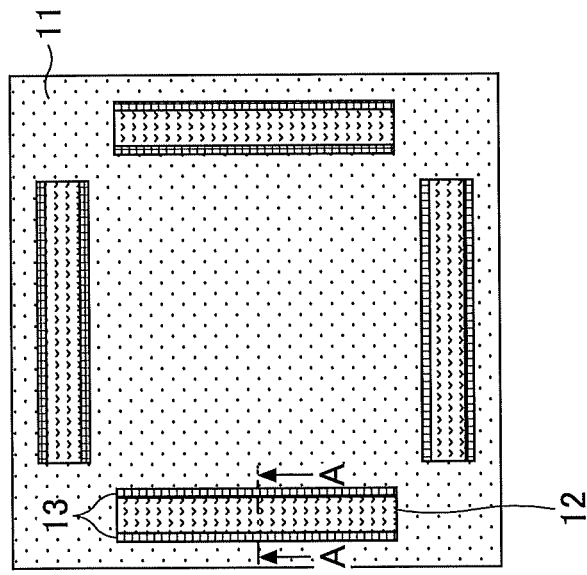

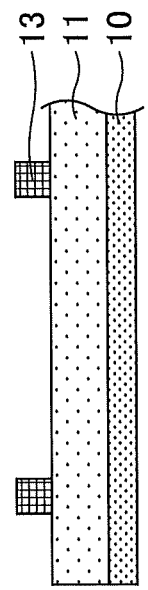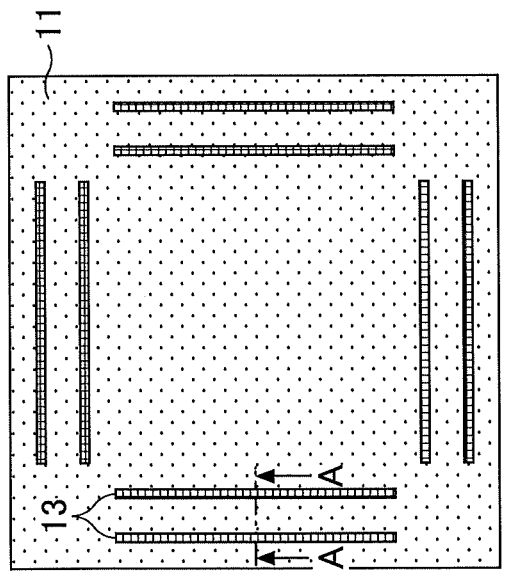

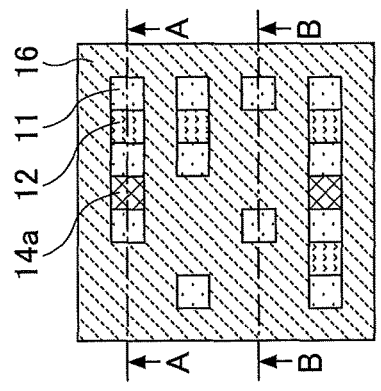
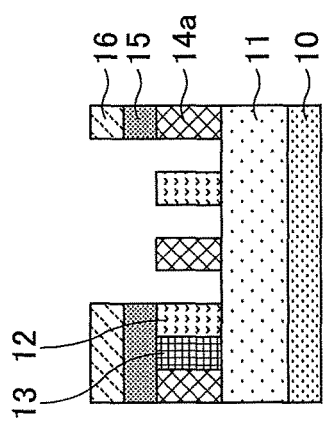
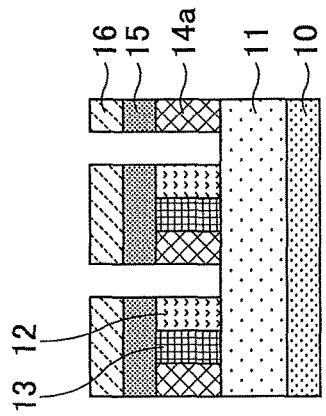
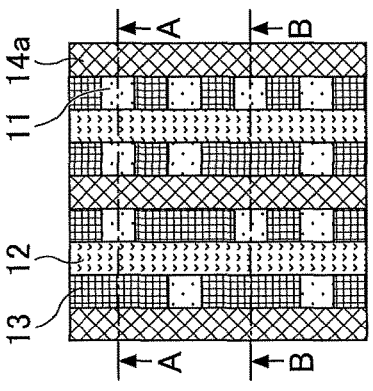
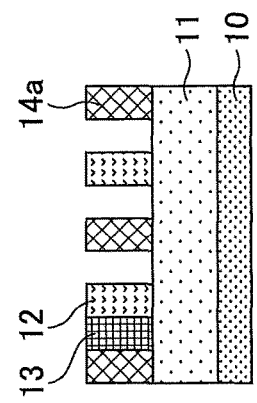
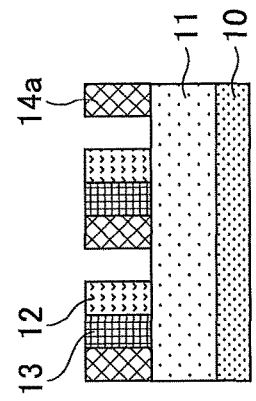

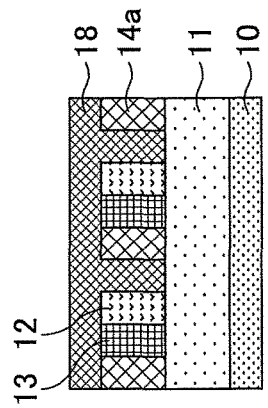 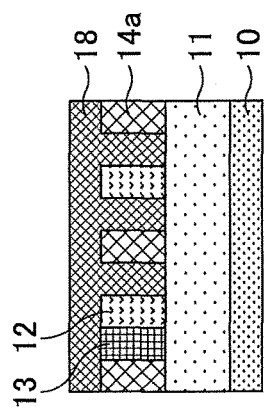 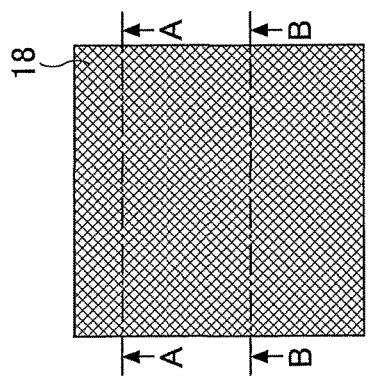
FIG.60A  FIG.60B  FIG.60C
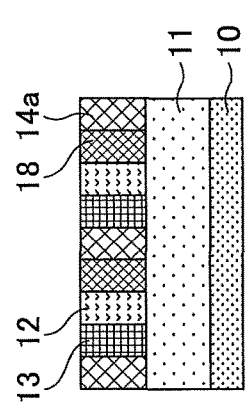 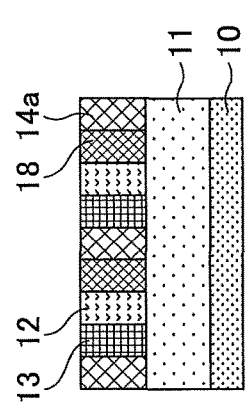 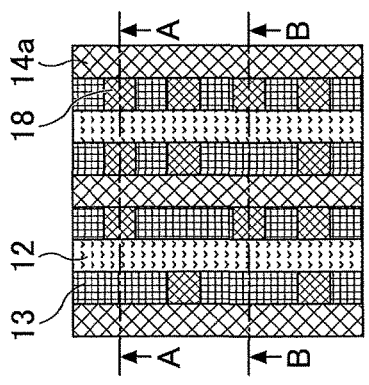
FIG.61A  FIG.61B  FIG.61C

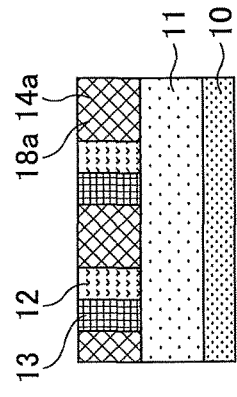
FIG.62C
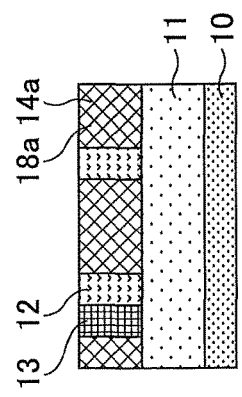
FIG.62B
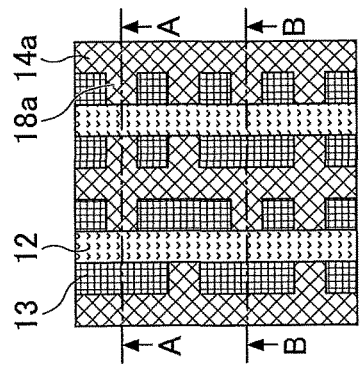
FIG.62A
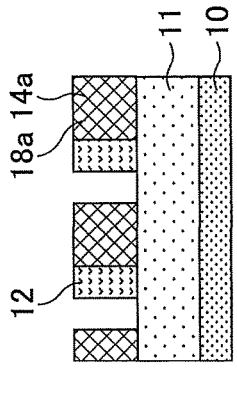
FIG.63C
FIG.63B
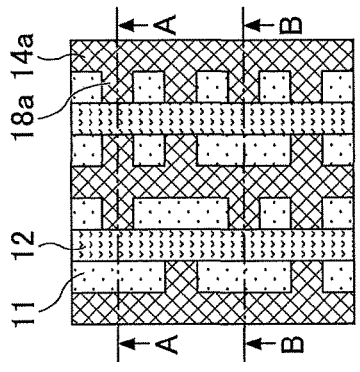
FIG.63A

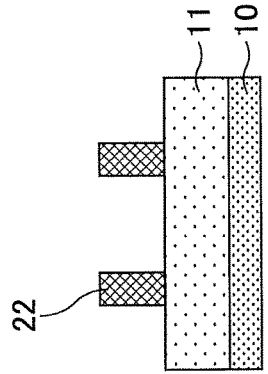
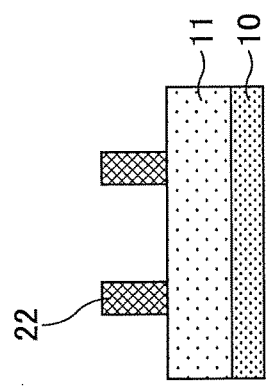
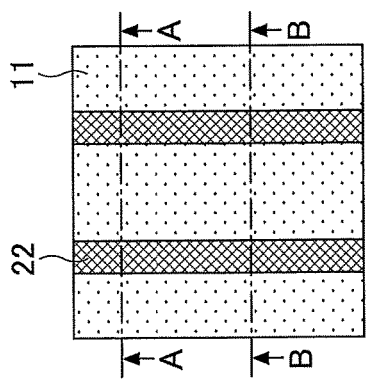
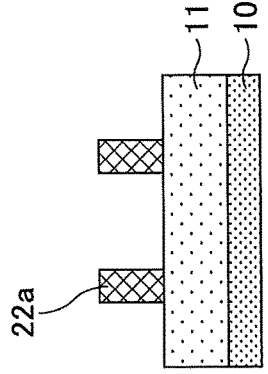
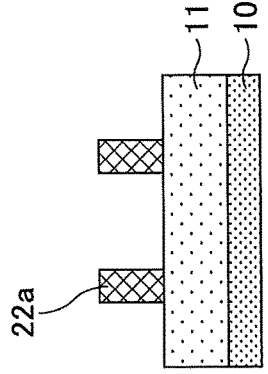
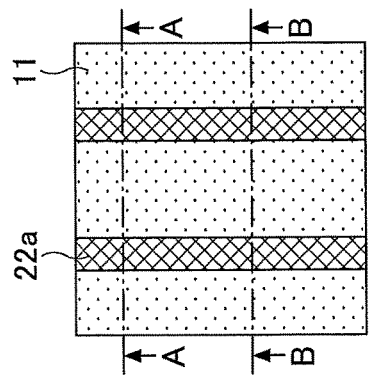

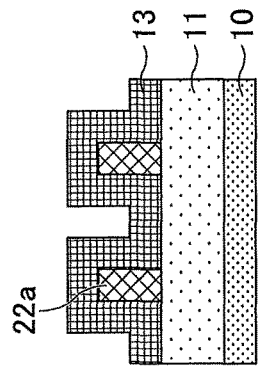
FIG.69A
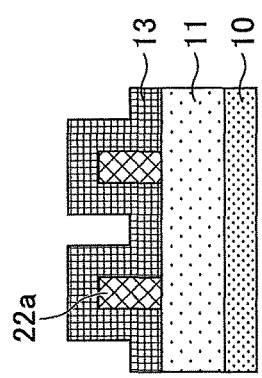
FIG.69B
FIG.69C
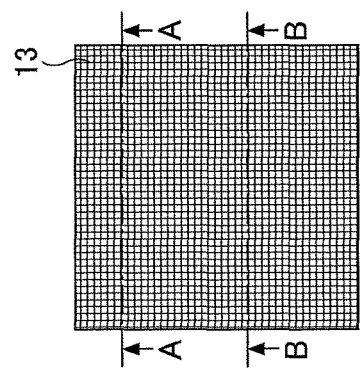
FIG.70A
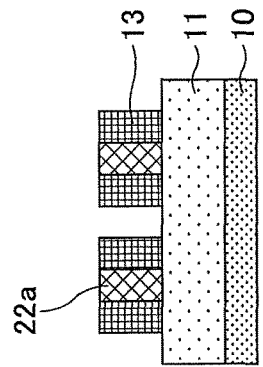
FIG.70B
FIG.70C

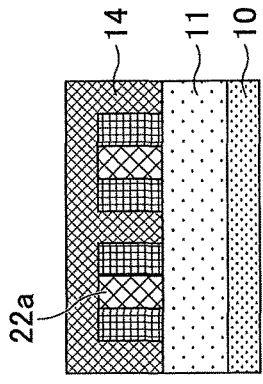
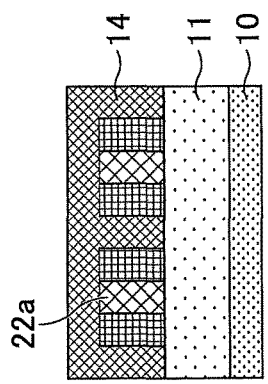
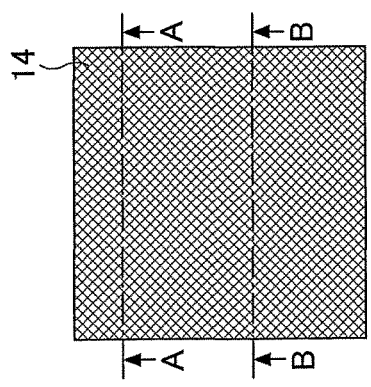
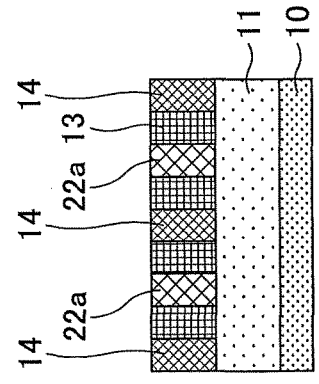
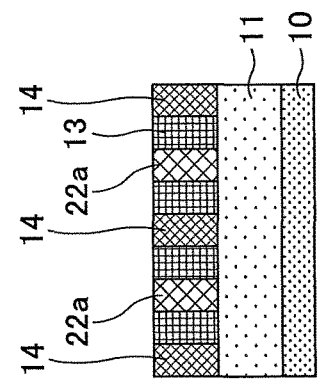
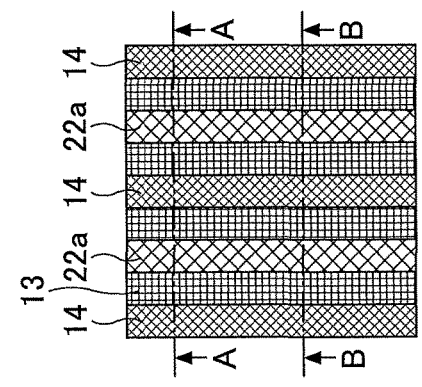

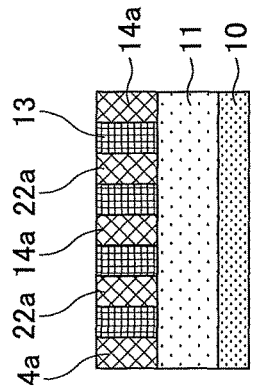
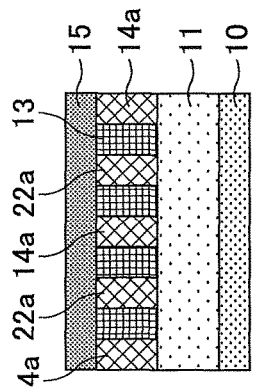
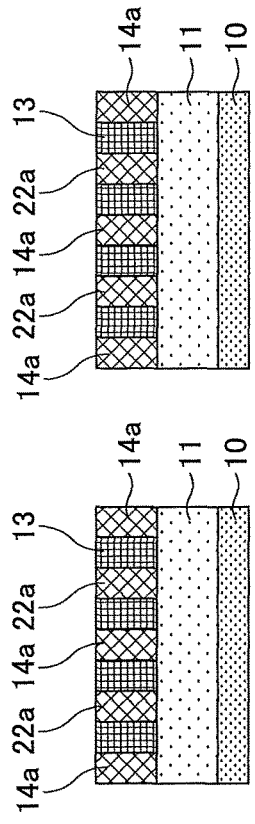
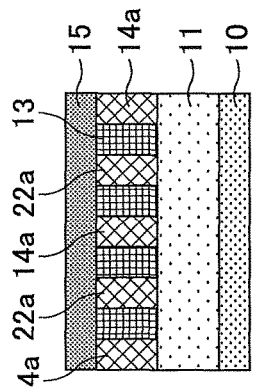
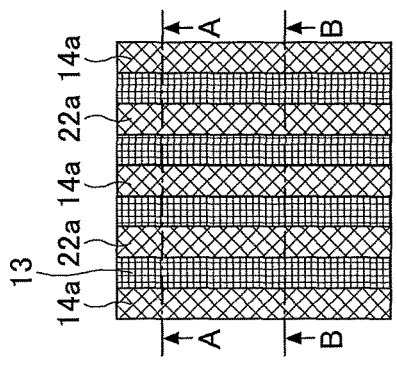
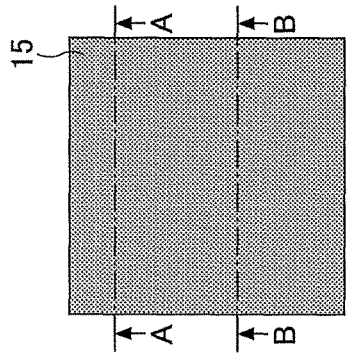

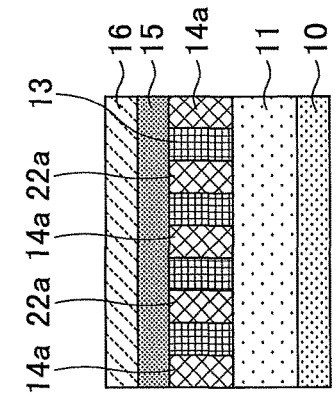
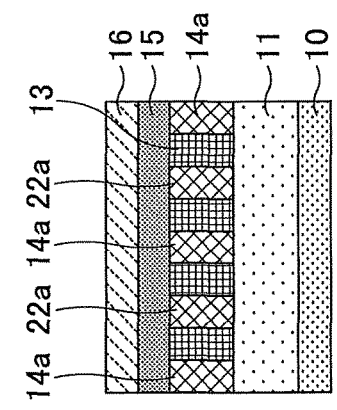
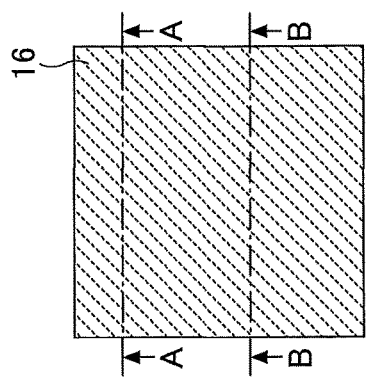
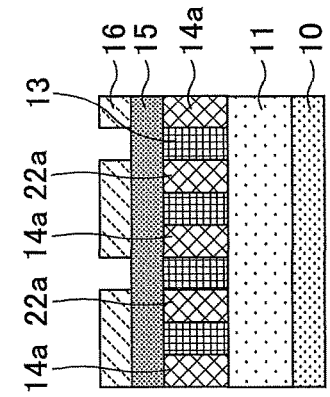
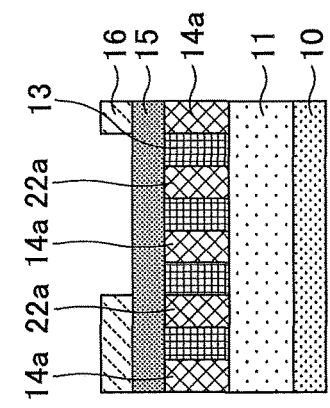
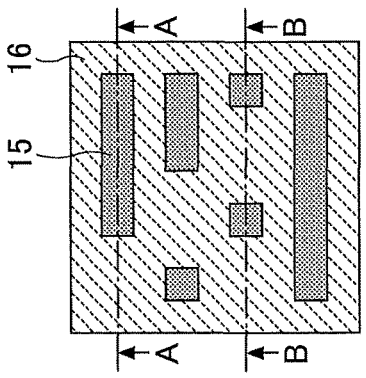

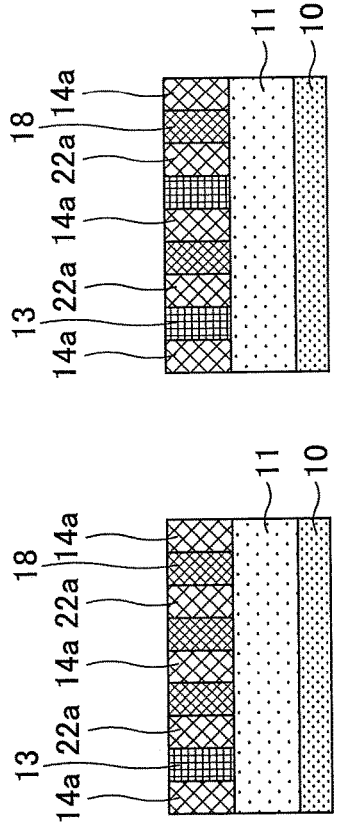
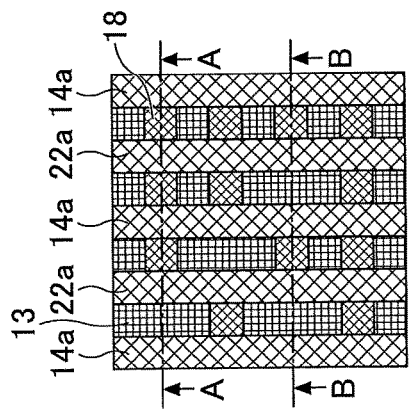
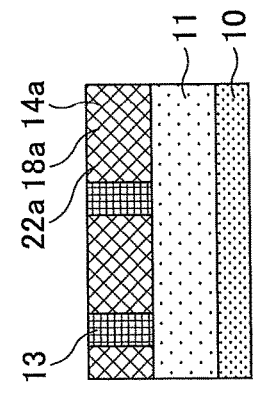
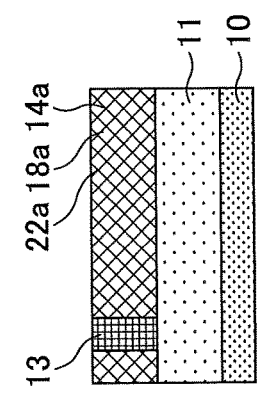
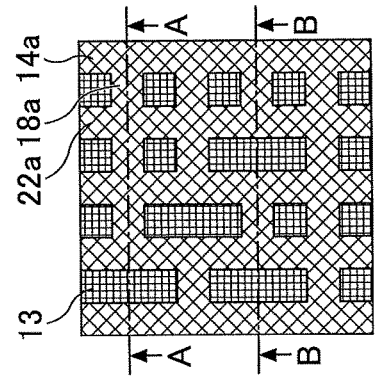

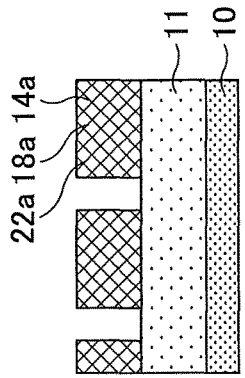
FIG.83B
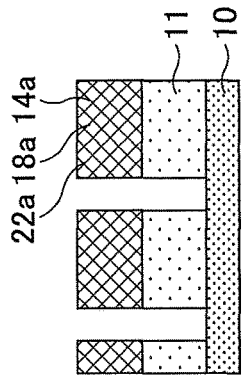
FIG.83C / FIG.84B / FIG.84C
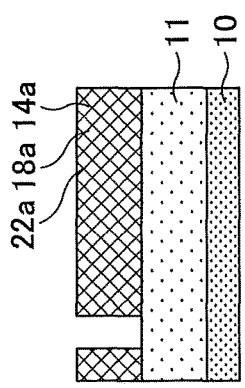
FIG.83A
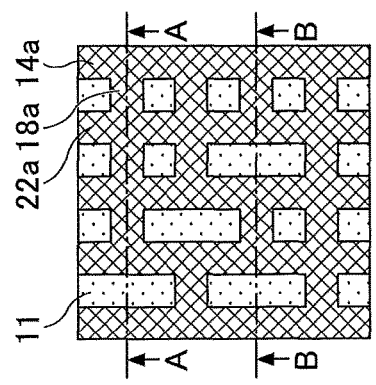
FIG.84A
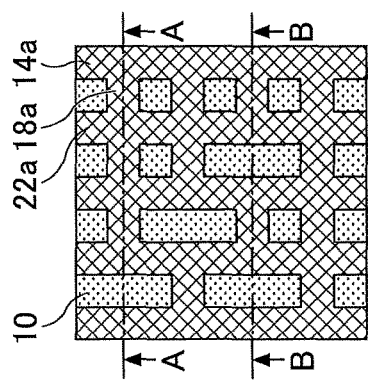

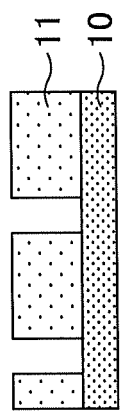
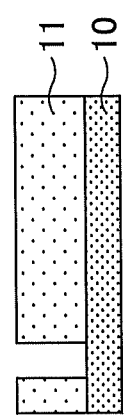
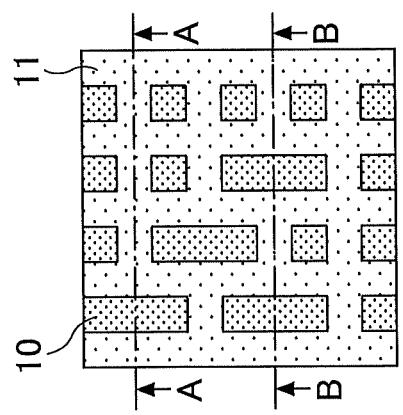

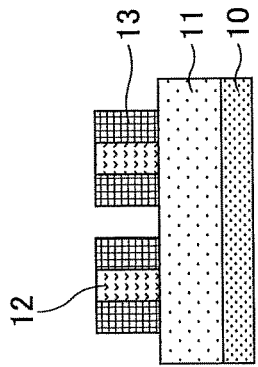
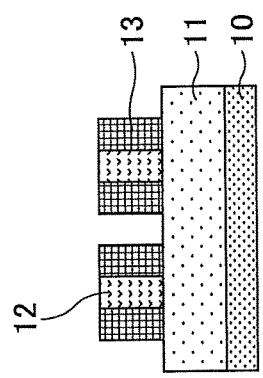
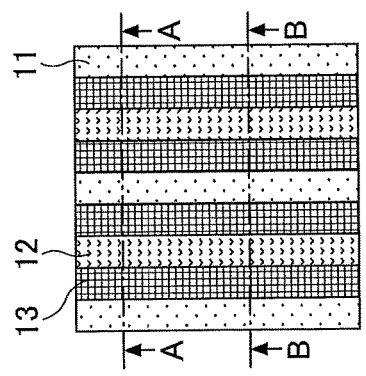
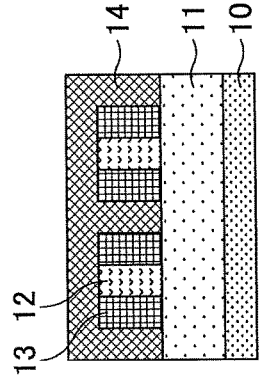
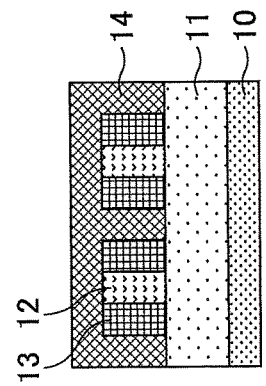
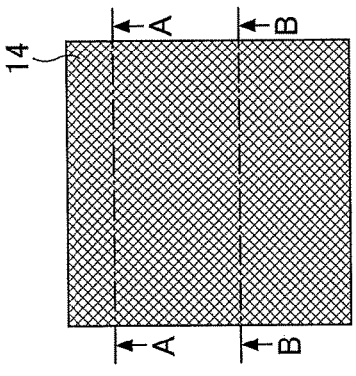
FIG.89A   FIG.89B   FIG.89C
FIG.90A   FIG.90B   FIG.90C

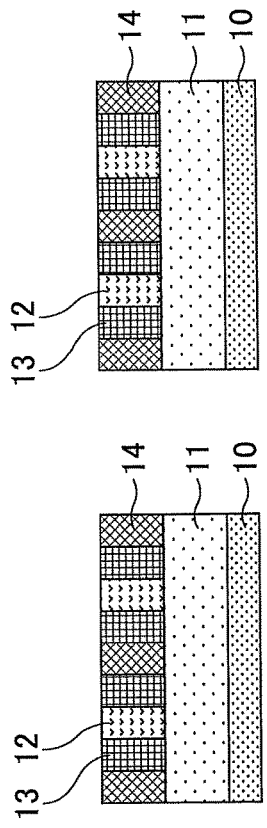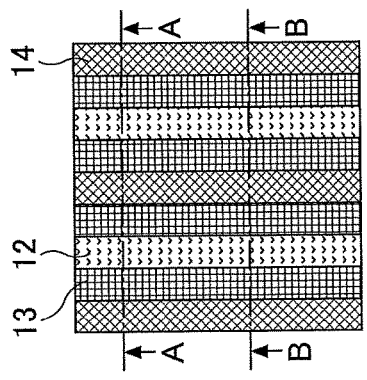
FIG.91A FIG.91B FIG.91C
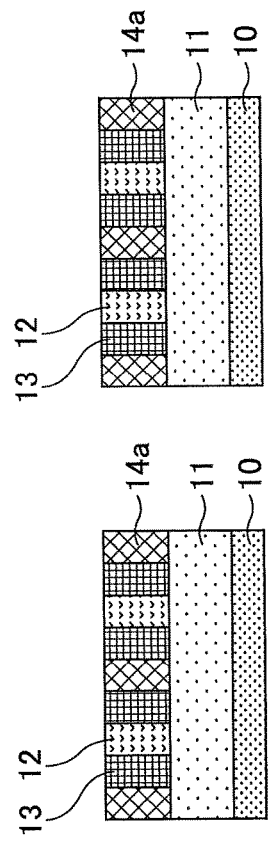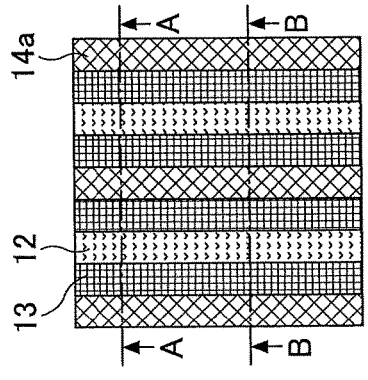
FIG.92A FIG.92B FIG.92C

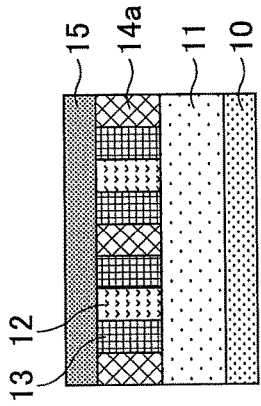
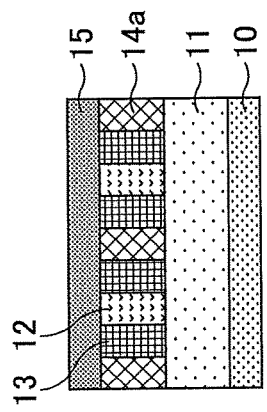
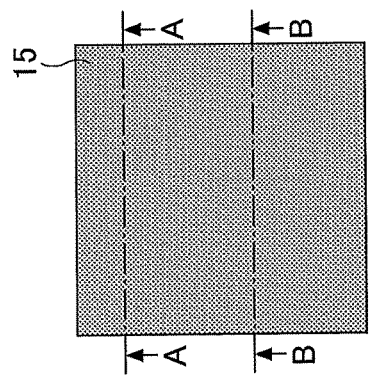
FIG.93A  FIG.93B  FIG.93C
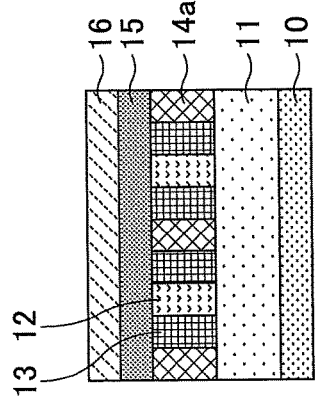
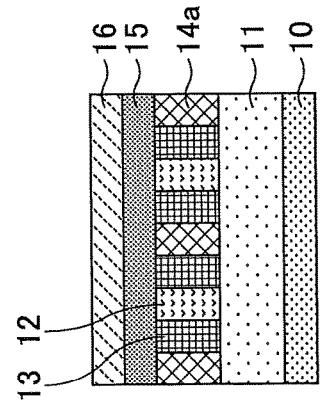
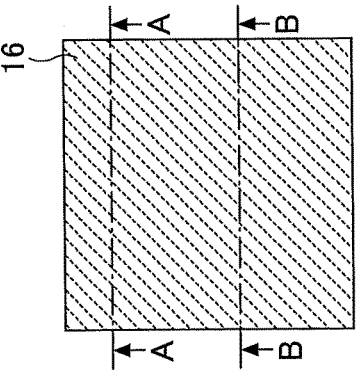
FIG.94A  FIG.94B  FIG.94C

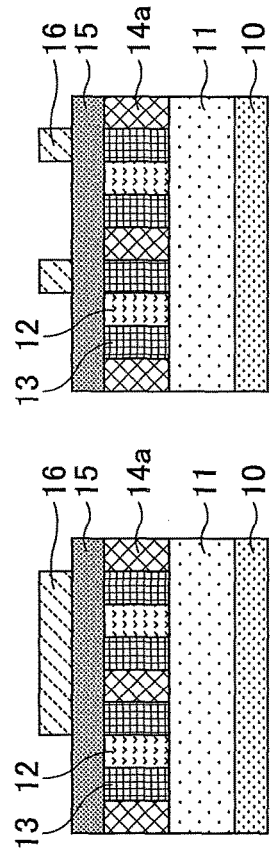
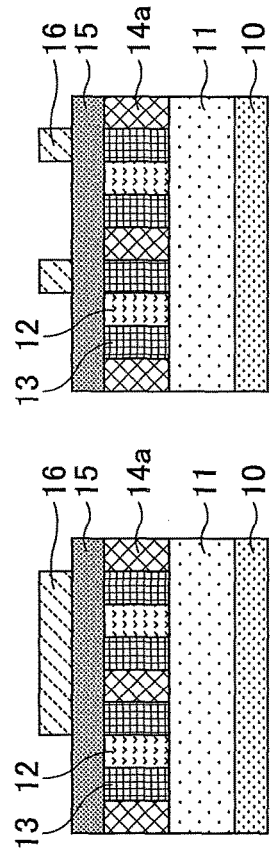
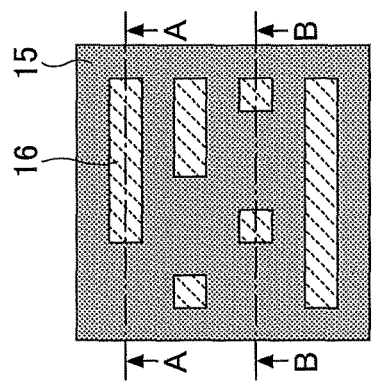
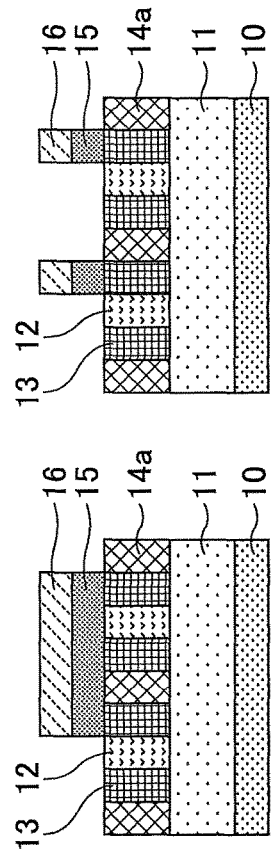
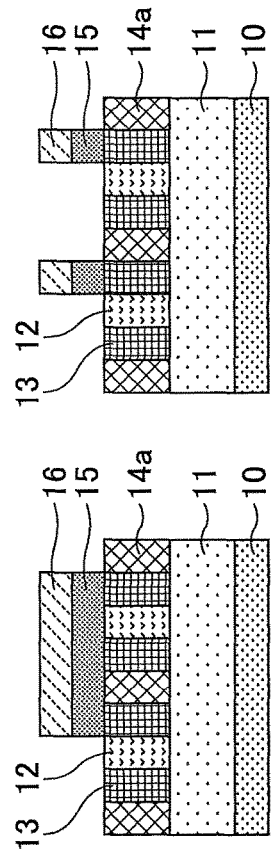
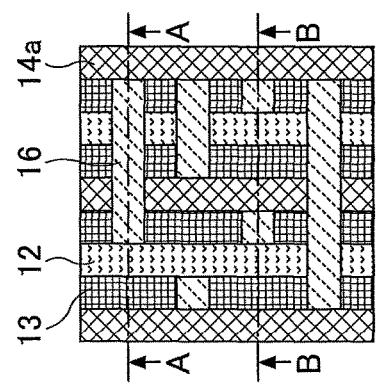

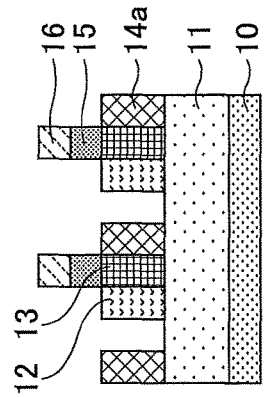
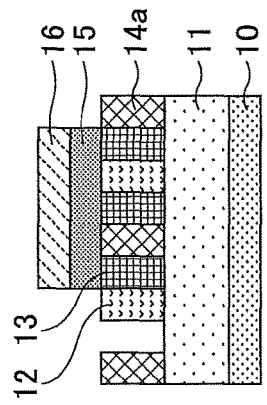
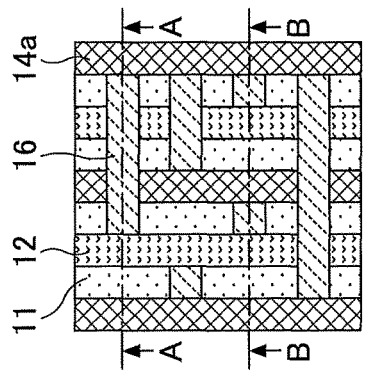
FIG.97A  FIG.97B  FIG.97C
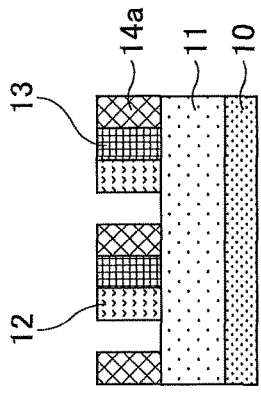
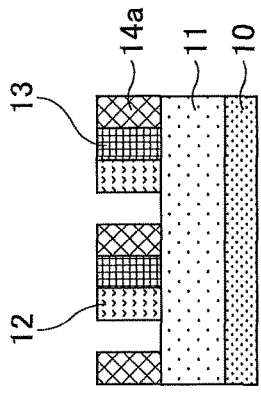
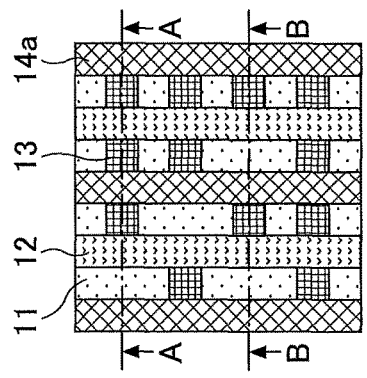
FIG.98A  FIG.98B  FIG.98C

US 10,317,797 B2

PATTERN FORMING METHOD FOR FORMING A PATTERN

CROSS-REFERENCE TO RELATED APPLICATIONS

This patent application is based upon and claims the benefit of priority of Japanese Patent Application No. 2016-226896 filed on Nov. 22, 2016, the entire contents of which are incorporated herein by reference.

BACKGROUND OF THE INVENTION

1. Field of the Invention

The present invention relates to a pattern forming method of forming a pattern.

2. Description of the Related Art

Patterns of wirings and separation widths required in a manufacturing process of manufacturing semiconductor devices tends to be miniaturized (fine) along with the tendency of higher integration. This fine pattern is formed by forming a resist pattern using a photolithography technique, using the resist pattern as a mask pattern, and etching underlying thin films as disclosed in Patent Document 1.

Therefore, in order to form the fine pattern, the photolithographic technique is important. However, the microminiaturization of recent semiconductor devices requires a resolution better than a resolution limit of the photolithographic technique. One method of forming the fine pattern having a resolution limit in the photolithography technique is a method of using a one dimension (1D) layout.

The method of using the 1D layout includes a cut process of cutting a repeated line and space shape having a fixed-pitch by a cut pattern at an arbitrary position of the line and space. The cut pattern may have multiple opening portions or multiple light shielding portions.

[Patent Document 1] Japanese Laid-open Patent Publication No. 2014-056864

SUMMARY OF THE INVENTION

Here, in pattern formation of a node of 10 nm or smaller using the 1D layout, securement of position accuracy and improvement in registration accuracy are especially desirable. In a conventional technique, after forming a spacer on a side surface of the line and space shape (a core), the core is etched so as to be removed. Therefore, readout accuracy of reading a registration mark is lowered. This occurs because the registration mark formed as the core is etched and the size of the registration mark becomes small.

Accordingly, embodiments of the present invention may provide a novel and useful pattern forming method solving one or more of the problems discussed above. More specifically, the embodiments of the present invention may provide a pattern forming method, with which readout accuracy of the registration mark can be improved.

A pattern forming method includes forming a first film patterned in a line and space shape on an underlayer film, the line and space shape including a plurality of lines and a space arranged between the lines, forming a second film to cover the first film, removing the second film formed on an upper surface of the first film to form the second film on a side surface of the first film in a line shape, forming a third film to cover the first film and the second film, removing the third film formed on the upper surface of the first film and an upper surface of the second film to form the third film on a side surface of the second film, and converting the third film after removing the third film formed on the upper surface of the first film and the upper surface of the second film, wherein the third film is comprised of an organic metal compound, the organic metal compound having characteristic to increase etching tolerance when the organic metal compound undergoes a predetermined process.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 6A, 6B, and 6C illustrate another one of the processes of the pattern forming method of the first embodiment.

FIGS. 7A, 7B, and 7C illustrate another one of the processes of the pattern forming method of the first embodiment.

FIGS. 8A, 8B, and 8C illustrate another one of the processes of the pattern forming method of the first embodiment.

FIGS. 9A, 9B, and 9C illustrate another one of the processes of the pattern forming method of the first embodiment.

FIGS. 10A, 10B, and 10C illustrate another one of the processes of the pattern forming method of the first embodiment.

FIGS. 11A, 11B, and 11C illustrate one of processes of the pattern forming method of the first embodiment.

FIGS. 12A, 12B, and 12C illustrate one of processes of the pattern forming method of the first embodiment.

FIGS. 13A, 13B, and 13C illustrate one of processes of the pattern forming method of the first embodiment.

FIGS. 18A, 18B, and 18C illustrate one of processes of the pattern forming method of the first embodiment.

FIGS. 19A, 19B, and 19C illustrate one of processes of the pattern forming method of the first embodiment.

FIGS. 20A, 20B, and 20C illustrate one of processes of the pattern forming method of the first embodiment.

FIGS. 21A, 21B, and 21C illustrate one of processes of the pattern forming method of the first embodiment.

FIGS. 22A, 22B, and 22C illustrate one of processes of the pattern forming method of the first embodiment.

FIGS. 23A, 23B, and 23C illustrate one of processes of the pattern forming method of the first embodiment.

FIGS. 24A, 24B, and 24C illustrate one of processes of the pattern forming method of the first embodiment.

FIGS. 25A, 25B, and 25C illustrate one of processes of the pattern forming method of the first embodiment.

FIG. 26 illustrates an etching rate of a first sacrificial film by HBr, $CF_4$, and $O_2$.

FIGS. 28A, 28B, and 28C illustrate another one of the processes of the conventional pattern forming method.

FIGS. 29A, 29B, and 29C illustrate another one of the processes of the conventional pattern forming method.

FIGS. 30A, 30B, and 30C illustrate another one of the processes of the conventional pattern forming method.

FIGS. 31A, 31B, and 31C illustrate another one of the processes of the conventional pattern forming method.

FIGS. 32A, 32B, and 32C illustrate another one of the processes of the conventional pattern forming method.

FIGS. 33A, 33B, and 33C illustrate another one of the processes of the conventional pattern forming method.

FIGS. 40A, 40B, and 40C illustrate another one of the processes of the conventional pattern forming method.

FIGS. 41A, 41B, and 41C illustrate another one of the processes of the conventional pattern forming method.

FIGS. 42A, 42B, and 42C illustrate another one of the processes of the conventional pattern forming method.

FIGS. 43A, 43B, and 43C illustrate another one of the processes of the conventional pattern forming method.

FIGS. 46A, 46B, 46C, 46D, 46E, and 46F illustrate a registration mark.

FIGS. 58A, 58B, and 58C illustrate another one of the processes of the pattern forming method of the second embodiment.

FIGS. 59A, 59B, and 59C illustrate another one of the processes of the pattern forming method of the second embodiment.

FIGS. 60A, 60B, and 60C illustrate another one of the processes of the pattern forming method of the second embodiment.

FIGS. 61A, 61B, and 61C illustrate another one of the processes of the pattern forming method of the second embodiment.

FIGS. 62A, 62B, and 62C illustrate another one of the processes of the pattern forming method of the second embodiment.

FIGS. 63A, 63B, and 63C illustrate another one of the processes of the pattern forming method of the second embodiment.

FIGS. 67A, 67B, and 67C illustrate one of processes of the pattern forming method of the third embodiment.

FIGS. 68A, 68B, and 68C illustrate another one of the processes of the pattern forming method of the third embodiment.

FIGS. 69A, 69B, and 69C illustrate another one of the processes of the pattern forming method of the third embodiment.

FIGS. 70A, 70B, and 70C illustrate another one of the processes of the pattern forming method of the third embodiment.

FIGS. 71A, 71B, and 71C illustrate another one of the processes of the pattern forming method of the third embodiment.

FIGS. 72A, 72B, and 72C illustrate another one of the processes of the pattern forming method of the third embodiment.

FIGS. 73A, 73B, and 73C illustrate another one of the processes of the pattern forming method of the third embodiment.

FIGS. 74A, 74B, and 74C illustrate another one of the processes of the pattern forming method of the third embodiment.

FIGS. 75A, 75B, and 75C illustrate another one of the processes of the pattern forming method of the third embodiment.

FIGS. 76A, 76B, and 76C illustrate another one of the processes of the pattern forming method of the third embodiment.

FIGS. 81A, 81B, and 81C illustrate another one of the processes of the pattern forming method of the third embodiment.

FIGS. 82A, 82B, and 82C illustrate another one of the processes of the pattern forming method of the third embodiment.

FIGS. 83A, 83B, and 83C illustrate another one of the processes of the pattern forming method of the third embodiment.

FIGS. 84A, 84B, and 84C illustrate another one of the processes of the pattern forming method of the third embodiment.

FIGS. 85A, 85B, and 85C illustrate another one of the processes of the pattern forming method of the third embodiment.

FIGS. 89A, 89B, and 89C illustrate another one of the processes of the pattern forming method of the fourth embodiment.

FIGS. 90A, 90B, and 90C illustrate another one of the processes of the pattern forming method of the fourth embodiment.

FIGS. 91A, 91B, and 91C illustrate another one of the processes of the pattern forming method of the fourth embodiment.

FIGS. 92A, 92B, and 92C illustrate another one of the processes of the pattern forming method of the fourth embodiment.

FIGS. 93A, 93B, and 93C illustrate another one of the processes of the pattern forming method of the fourth embodiment.

FIGS. 94A, 94B, and 94C illustrate another one of the processes of the pattern forming method of the fourth embodiment.

FIGS. 95A, 95B, and 95C illustrate another one of the processes of the pattern forming method of the fourth embodiment.

FIGS. 96A, 96B, and 96C illustrate another one of the processes of the pattern forming method of the fourth embodiment.

FIGS. 97A, 97B, and 97C illustrate another one of the processes of the pattern forming method of the fourth embodiment.

FIGS. 98A, 98B, and 98C illustrate another one of the processes of the pattern forming method of the fourth embodiment.

DETAILED DESCRIPTION OF EMBODIMENTS

Hereinafter, an embodiment of the present invention is described with reference to figures. Through the specification and figures illustrating the embodiments, the same references symbols are used for portions having the same function, and repetitive explanations of these portions are omitted.

The pattern forming method of the embodiment is to form a fine pattern having a resolution less than a resolution limit of the photolithography technique using the 1D layout.

According to a pattern forming method of the embodiment, after forming a spacer on a side surface of a line and space shape formed by a core, a line pattern formed by the spacer is cut. Because the registration mark formed as the core is not etched, the size of the registration mark does not become small. As a result, readout accuracy of the registration mark can be improved in a later process.

Described below is a pattern forming method of the first to fourth embodiments enabling readout accuracy in reading a registration mark to be improved in a pattern formation using the ID layout.

The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:
10: first underlayer film
11: second underlayer film;
12: core;
13: spacer;
14, 14a: first sacrificial film;
15: antireflection film;
16: resist film;
17: pattern reverse film;
18, 18a: second sacrificial film;
22, 22a: core;
94: planarizing film; and
97: pattern reverse film.

First Embodiment

Figure 1:
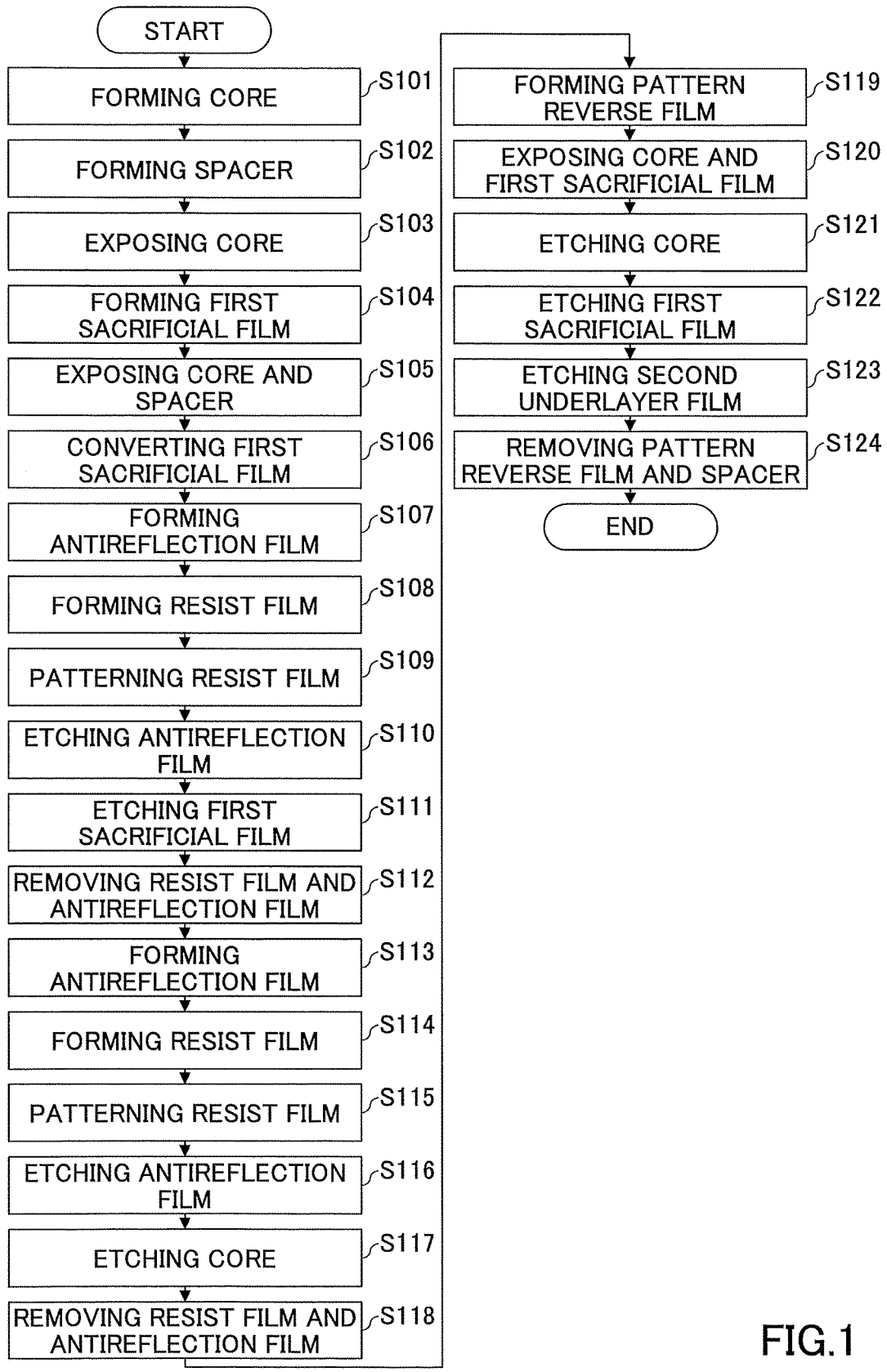
FIG. 1 is a flowchart illustrating an example of the pattern forming method of a first embodiment.

A pattern forming method for forming a pattern according to the first embodiment is described next. FIG. 1 is a flowchart illustrating the pattern forming method of the first embodiment.

The pattern forming method of the first embodiment includes: forming a core (step S101), forming a spacer (step S102), exposing the core (step S103), forming a first sacrificial film (step S104), exposing the core and spacer (step S105), converting a first sacrificial film (step S106), forming an antireflection film (step S107), forming a resist film (step S108), patterning the resist film (step S109), etching the antireflection film (step S110), etching the first sacrificial film (step S111), removing the resist film and the antireflection film (step S112), forming an antireflection film (step S113), forming a resist film (step S114), patterning the resist film (step S115), etching the antireflection film (step S116), etching the core (step S117), removing the resist film and the antireflection film (step S118), forming a pattern reverse film (step S119), exposing the core and the first sacrificial film (step S120), etching the core (step S121), etching the first sacrificial film (step S122), etching the second underlayer film (step S123), and removing the pattern reverse film and spacer (step S124).

Figure 2B:
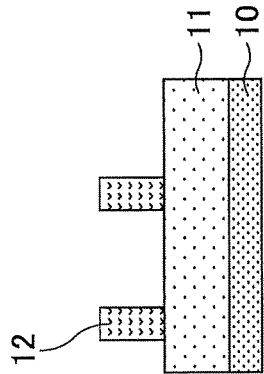
FIGS. 2A, 2B, and 2C illustrate one of processes of the pattern forming method of the first embodiment.
Figure 2C:
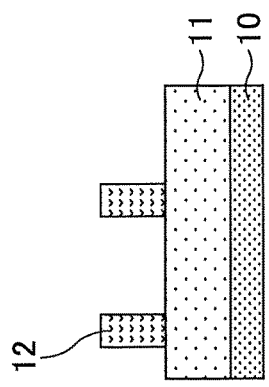
Figure 3B:
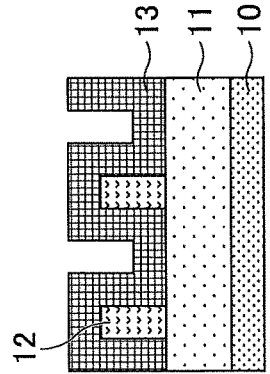
FIGS. 3A, 3B, and 3C illustrate another one of the processes of the pattern forming method of the first embodiment.
Figure 3C:
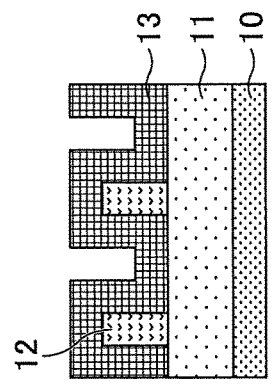
Figure 2A:
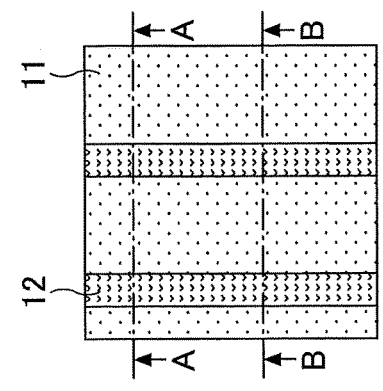
Figure 3A:
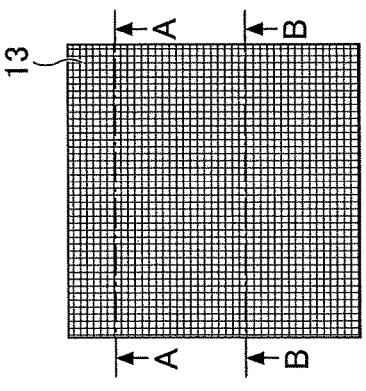

Hereinafter, the steps are described with reference to FIGS. 2A to 25C. FIGS. 2A to 25 schematically illustrate steps of the processes of the pattern forming method of the first embodiment. FIGS. 2A, 3A, . . . , 25A are plan views in each of the steps. FIGS. 2B, 3B, . . . , 25B are cross-sectional views taken along a dashed-dotted line A-A respectively of FIGS. 2A, 3A, . . . , 25A. FIGS. 2C, 3C, . . . , 25C are cross-sectional views taken along a dashed-dotted line B-B respectively of FIGS. 2A, 3A, . . . , 25A.

In step S101, the core is formed. Specifically, as illustrated in FIGS. 2A-2C, the core 12 is formed on the second underlayer film 11 formed on the first underlayer film 10 by, for example, chemical vapor deposition (CVD). Subsequently, light exposure having a wavelength of 193 nm using ArF and development undergo so as to pattern the core to have a line and space shape, which includes lines arranged while interposing a predetermined distance. Next, a process (hereinafter, referred to as "slimming processing") of thinning the line width of the patterned core 12 is performed to form a fine pattern having a size smaller than a resolution limit of the photolithography technique. The first underlayer film 10 is, for example, an interlayer insulating film such as Inter Level Dielectric (ILD). The second underlayer film 11 is, for example, a titanium nitride film (TiN film). The core is an example of the first film such as polysilicon.

In step S102, the spacer is formed. Specifically, as illustrated in FIGS. 3A-3C, the spacer 13 having a film thickness substantially the same as the line width of the core 12 is formed so as to cover the surface (the upper surface and the side surface) of the core 12 by, for example, chemical vapor deposition (CVD) or atomic layer deposition (ALD). The spacer 13 is an example of the second film which is made of, for example, a silicone oxide film (an $SiO_2$ film).

Figure 4A:
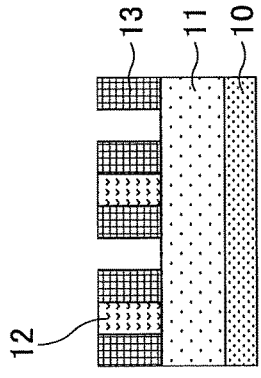
FIGS. 4A, 4B, and 4C illustrate another one of the processes of the pattern forming method of the first embodiment.
Figure 4B:
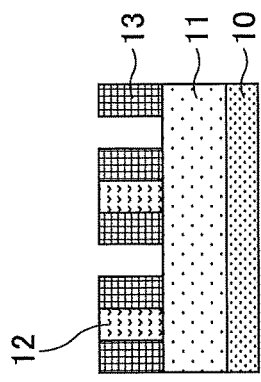
Figure 4C:
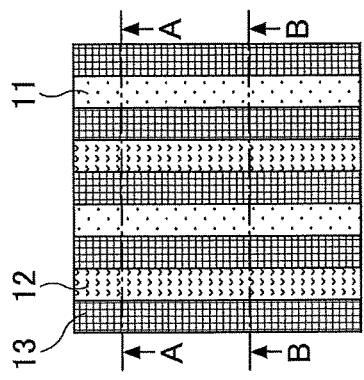

In step S103, the core is exposed. Specifically, as illustrated in FIGS. 4A to 4C, the spacer 13 is etched until the upper surface of the core 23 is exposed by dry etching such as reactive ion etching. At this time of etching, the spacer 13 remains on the side surface of the core 12. An etching gas is, for example, carbon tetrafluoride ($CF_4$).

Figure 5A:
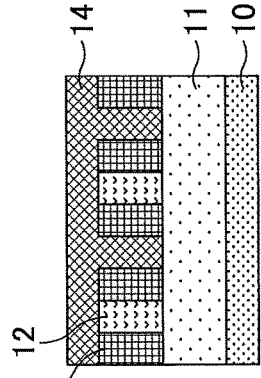
FIGS. 5A, 5B, and 5C illustrate another one of the processes of the pattern forming method of the first embodiment.
Figure 5B:
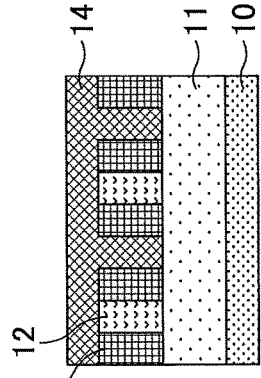
Figure 5C:
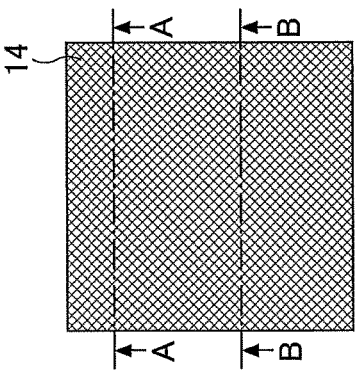

In step S104, a first sacrificial film is formed. Specifically, as illustrated in FIGS. 5A to 5C, the first sacrificial film 14 is formed so as to cover the surface of the core 12 and the surface of the spacer 13 by conducting spin coating of a liquid solution containing the first sacrificial film 14. Because the first sacrificial film 14 is formed by conducting the spin coating, the upper surface of the first sacrificial film can be smoothed to expand a lithography margin. After conducting the spin coating with a liquid solution containing the material of the first sacrificial film 14, the liquid solution may be heated, if necessary, at a low temperature (for example, 100° C.) and then dried. The first sacrificial film 14 is an example of a third film, and is made of an organic metal compound, with which etching tolerance for an etching gas used at a time of etching the semiconductor, the insulating film, and the organic film by a predetermined process is improved.

The organic metal compound is a complex such as a metal complex and an organic metal complex. The complex is preferably represented by the following Formula 1.

$[MZ_4]$  [Formula 1]

(In this general formula, M designates hafnium (Hf) or zirconium (Zr), and Z designates a ligand.)

The ligand is an atom or an atom group which undergoes coordinate bond with a central atom (Hf, Zr) of the complex. Although the ligand Z is not specifically limited, the ligand is preferably made of a conjugate base of an acid whose acid dissociation constant (pKa) is 3.8 or smaller. The ligand is, for example, made of a conjugate base of a chemical compound containing a sulfonic acid group or a carboxylic acid group. Here, the "acid dissociation constant (pKa)" is an index ordinarily used to designate an acid strength of an object substance. The value of pKa can be obtained by an ordinary method. Further, the value of pKa can be obtained by simulation using known software such as "ACD/Labs" produced by Advanced Chemistry Development, Inc. Further, the value of pKa may be a literature value. The pKa of the acid corresponding to the conjugate base is preferably 3.8 or smaller, more preferably 3.5 or smaller, further more preferably 3.0 or smaller. The lower limit is not specifically limited and, for example, −10 or greater. Within the above range of pKa of the acid, the structure of the metal complex can be stabilized.

At least one of the ligand Z in the organic metal compound may be a ligand having a polymeric basis, and is, for example, a complex represented by the following Formula 2.

$[MX_nY_{4-n}]$ [Formula 2]

(In Formula 2, M designates hafnium (Hf) or zirconium (Zr), X designates a ligand including a polymeric basis, Y designates a ligand without including a polymeric basis, and n designates an integer between 1 to 4.)

The "polymeric basis" is a basis enabling a chemical compound including the polymeric basis to polymerize by radical polymerization or the like. The polymeric basis is, for example, a basis including a multiple bond among carbon atoms such as an ethylenic double bond.

The polymeric basis is, for example, a vinyl group, an allyl group, an acryloyl group, methacryloyl group, an acryloyloxy group, a methacryloyloxy group, an acrylamide group, a metacrylamide group, an acryloylaryl group, a metacryloylaryl group, a norbornyl group, and so on.

X in Formula 2 is, for example, ligands respectively represented by the following Formula 3.
[Formula 3]

$R^1-Y^1-SO_3^\ominus$ 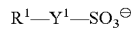 (1)

$R^2-Y^2-COO^\ominus$ 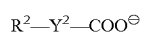 (2)

(In Formula 3, $R^1$ is a polymeric basis including a basis selected from a group represented by (X-01) to (X-07) of Formula 4. $Y^1$ is a bivalent linking group or a single bond. In Formula 3, $R^2$ is a polymeric basis including a basis selected from the group represented by (X-01) to (X-07) of Formula 4. $Y^2$ is a bivalent linking group or a single bond.)

[Formula 4]

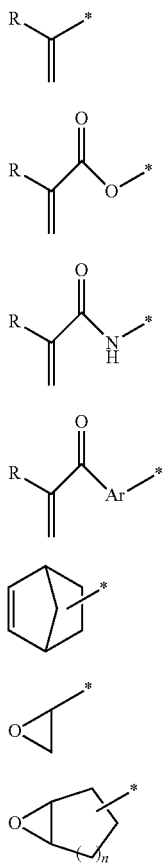

(In Formula 4, R designates a hydrogen atom, an alkyl group having a carbon number of 1 to 5, and a fluorinated alkyl group having a carbon number of 1 to 5. Ar designates an aromatic hydrocarbon group. n designates an integer of 0, 1, or 2. * designates an atomic bonding.)

In Formula 3, $R^1$ is a polymeric basis including a basis selected from the group represented by (X-01) to (X-07) of Formula 4.

(In (X-01) to (X-04) of Formula 4, R designates a hydrogen atom, an alkyl group having a carbon number of 1 to 5, and a fluorinated alkyl group having a carbon number of 1 to 5. The alkyl group having a carbon number of 1 to 5 in R is preferably a straight-chain alkyl group or a branched-chain alkyl group, and is specifically a methyl group, an ethyl group, a propyl group, an isopropyl group, a n-butyl group, an isobutyl group, a tert-butyl group, a pentyl group, an isopentyl group, and a neopentyl group. The fluorinated alkyl group having a carbon, number of 1 to 5 is a group, in which a part or all of the hydrogen atoms of the alkyl group having a carbon number of 1 to 5 is replaced by a fluorine atom.

In the above (X-04), an aromatic hydrocarbon group in Ar is a bivalent hydrocarbon group including at least one aromatic ring. This aromatic ring is not specifically limited and may be monocyclic or polycyclic as long as the aromatic ring is a circular conjugated system including n electrons equal to 4n+2. The carbon number of the aromatic ring is preferably 5 to 30, more preferably 6 to 12. The aromatic ring is specifically an aromatic hydrocarbon ring such as benzene, naphthalene, anthracene, and phenanthrene, a heteroaromatic ring in which a part of carbon atoms comprising the aromatic hydrocarbon ring is replaced by a heteroatom. The heteroatom in the heteroaromatic ring is an oxygen atom, a sulfur atom, a nitrogen atom, or the like. The heteroaromatic ring is specifically a pyridine ring, a thiophene ring, or the like. The aromatic hydrocarbon group in Ar is specifically a group (an arylene group or a heteroarylene group) in which two hydrogen atoms are removed from the aromatic hydrocarbon ring or the heteroaromatic ring, a group in which two hydrogen atoms are removed from the aromatic compound (for example, biphenyl, fluorine, or the like) including at least two aromatic rings; and a group (for example, one more hydrogen atom is removed from an aryl group of an aryl alkyl group such as a benzyl group, a phenethyl group, a 1-naphthyl methyl group, a 2-naphthyl methyl group, a 1-naphthyl ethyl group, and a 2-naphthyl ethyl group) in which one hydrogen atom of the aromatic hydrocarbon ring or the heteroaromatic ring is replaced by an alkylene group. The carbon number of the alkylene group bonding with the aromatic hydrocarbon ring or the heteroaromatic ring is preferably 1 to 4, more preferably 1 to 2, furthermore preferably 1.

In (X-07), n is an integer of 0 to 2.

In Formula 3, $Y^1$ is a bivalent linking group or a single bond. The bivalent linking group in $Y^1$ is, for example, an alkylene group, an arylene group, an alkylene group having an ether bond, an alkylene group having a thioether bond, an alkylene group having an ester bond, a fluorinated alkylene group.

The alkylene group in $Y^1$ preferably has a carbon number of 1 to 20, more preferably 1 to 10, furthermore preferably 1 to 5. Specifically, this alkylene group is, for example, a methylene group [—$CH_2$—], an ethylene group [—$(CH_2)_2$—], and a trimethylene group [—$(CH_2)_3$—].

The arylene group in $Y^1$ is similar to a group, in which two hydrogen atoms are removed from the aromatic hydrocarbon ring exemplified in the explanation related to Ar in (X-04) of Formula 4.

In $Y^1$, the carbon number of the alkylene group having the ether bond, the alkylene group having the thioether bond, and the alkylene group having the ester bond is preferably 1 to 20, more preferably 1 to 10.

In $Y^1$, the carbon number of the alkylene group of the fluorinated alkylene group is preferably 1 to 20, more preferably 1 to 10. Regarding the fluorinated alkylene group, a part or all of the hydrogen atoms of the alkylene group may be replaced with a fluorine atom.

Among the described above, the methylene group [—$CH_2$—], the ethylene group [—$(CH_2)_2$—], and the trimethylene group s[—$(CH_2)_3$—] are especially preferable.

Among the ligands expressed by (1) of Formula 3, a ligand made of a conjugate base of an acid whose acid dissociation constant (pKa) is 3.8 or smaller is more preferable. This ligand is, for example, a conjugate base of 3-(methacryloyloxy)-1-propanesulfonic acid (pKa1.53), a conjugate base of 3-(acryloyloxy)-1-propanesulfonic acid (pKa1.53), a conjugate base of vinylsulfonic acid (pKa-1.32), and a conjugate base styrenesulfonic acid (pKa-2.8).

In Formula 3, $R^2$ is a polymeric basis including a basis selected from the group represented by (X-01) to (X-07) in Formula 4.

In (2) of Formula 3, $Y^2$ is a bivalent linking group or a single bond. The bivalent linking group in $Y^2$ is, for example, a methylene group [—CH2-], an arylene group, an alkylene group having an ether bond, an alkylene group having a thioether bond, an alkylene group having an ester bond, a fluorinated alkylene group, and so on.

The arylene group in $Y^2$ is similar to a group, in which two hydrogen atoms are removed from the aromatic hydrocarbon ring exemplified in the explanation related to Ar in (X-04) of Formula 4.

In $Y^2$, the carbon number of the alkylene group having the ether bond, the alkylene group having the thioether bond, and the alkylene group having the ester bond is preferably 1 to 20, more preferably 1 to 10.

In $Y^2$, the carbon number of the alkylene group of the fluorinated alkylene group is preferably 1 to 20, more preferably 1 to 10. Regarding the fluorinated alkylene group, a part or all of the hydrogen atoms of the alkylene group may be replaced with a fluorine atom.

Within the above, the methylene group [—CH2-] is especially preferable as $Y^2$.

The ligand represented by (2) of Formula 3 is a conjugate base of carboxymethylmethacrylate (pKa2.53), a conjugate base of carboxymethylacrylate (pKa2.53), a conjugate base of bicyclo [2.2.1] hept-5-ene-2-carboxylic acid (pKa2.53), a conjugate base of 2-(acryloxy)-5-oxo-4-oxatricyclo [4.2.1.03,7]nonane-9-carboxylic acid (pKa2.53), a conjugate base of (bicyclo[2.2.1]hepto-5-en-2-ylthio)bicyclo [2.2.1]heptane-2-carboxylic acid (pKa4.83), a conjugate base of 7-oxabicyclo[4.1.0]heptan-1-carboxylic acid (pKa4.85), a conjugate base of 7-oxabicyclo[4.1.0]heptane-3-carboxylic acid (pKa4.82), a conjugate base of 3-oxatricyclo[3.2.0.0.2,4]octane-6-carboxylic acid (pKa4.82), and a conjugate base of 3,8-dioxatricyclo[5.1.0.0.2.4]octane-6-carboxylic acid (pKa4.82). Among these ligands, a ligand made of a conjugate base of an acid whose acid dissociation constant (pKa) is 3.8 or smaller is more preferable such as a conjugate base of carboxymethylmethacrylate (pKa2.53) and a conjugate base of carboxymethylacrylate (pKa2.53).

X in Formula 2 may be formed of one kind or at least two kinds, and is preferably a ligand made of a conjugate base represented by the above general formula (1) of Formula 3 or at least one ligand selected from ligands each made of a conjugate base represented by the above general formula (2) of Formula 3. More preferably, X is a ligand made of a conjugate base of at least one acid selected from a group of carboxymethylacrylate, carboxymethylmethacrylate, 3-(acryloyloxy)-1-propanesulfonic acid, and 3-(methacryloyloxy)-1-propanesulfonic acid.

In Formula 2, Y is a ligand without having a polymeric basis. Y may be derived from, for example, an oxygen atom, a sulfur atom, a nitrogen atom, a chlorine atom, a methyl group, an ethyl group, an ethylene group, a methoxy group, an ethoxy group, a propoxy group, a butoxy group, an isopropoxy group, a 2-methoxyethoxy group, a 2-ethylhexoxy group, cyclohexanolate, bicyclo[2.2.1]heptan-2-olate, a phenoxy group, a naphthoxy group, methanethiolate, ethanethiolate, propanethiolate, butanethiolate, isopropanethiolate, 2-ethylhexanethiolate, cyclohexanethiolate, bicyclo[2.2.1]heptanthiolate, benzenethiolate, naphthalenethiolate, acetate, propanoate, butanoate, 2-methylpropanoate, 2-ethylhexanoate, 2-bromo-5-oxo-4-oxatricyclo [4.2.1.03,7]nonane-9-carboxylate, 6-(2-neftilthio) bicyclo [2.2.1]heptane-2-carboxylate, ethanethioate, propanthioate, butanethioate, 2-methylpropanthioate, 2-ethylhexanthioate, methanesulfonate, ethanesulfonate, propansulfonate, butansulfonate, cyclohexanesulfonate, [(1S,4R)-7,7-dimethyl-2-oxobicyclo[2.2.1]hepto-1-yl] methane sulfonate, 4-methylbenzenesulfonate, oxalate, accetoacetonate, 1,3-diphenyl propane-1,3-dione, 2,2,6,6-tetramethyl heptane-3,5-dione, 2,2-dimethyl-4,6-dioxo-1,3-dioxane-5-ide, dicyanomethanide, cyclopenta-2,4-dienide, phenylethynide, nitromethane, nitroethylene, methonitrate, phenylazide, methylisocyanate, allylisocyanate, trimethylamine, ethylenediamine, triphenylarsine, triphenylphosphine, t-butylphosphine, and trimethylphosphine.

Y in Formula 2 may be formed of one kind or at least two kinds.

Y in Formula 2 may be appropriately selected in consideration of stability, solvent solubility, developer solubility, and coating characteristics of the complex.

In Formula 2, n is an integer of 1 to 4, preferably 2 to 4, more preferably 4.

Hereinafter, specific examples of the complex represented by the general formula in Formula 2 are (1-1) to (1-4) of Formula 5.

[Formula 5]

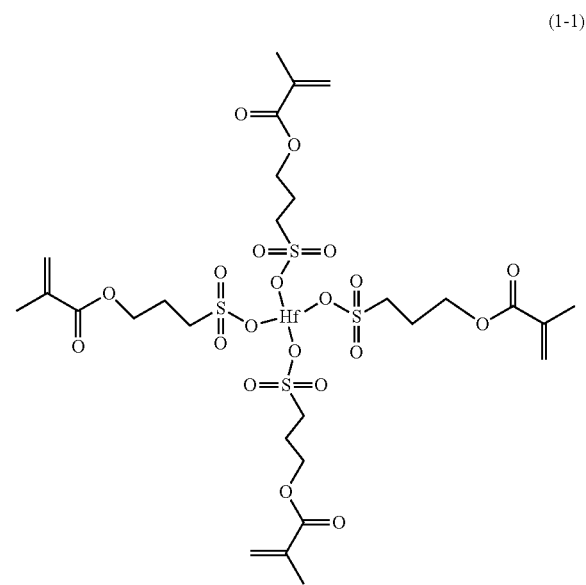

(1-1)

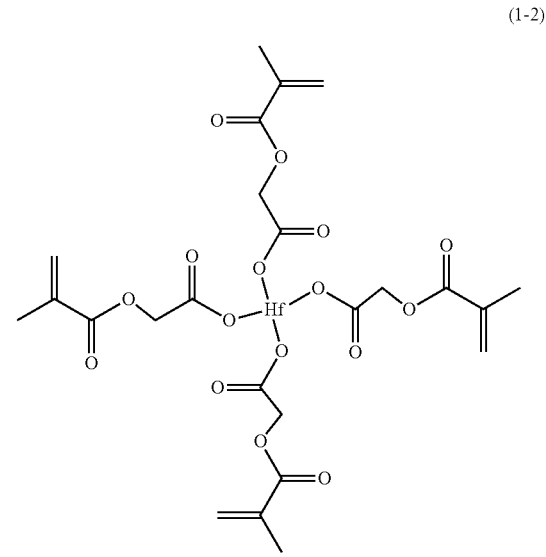

(1-2)

(1-3)

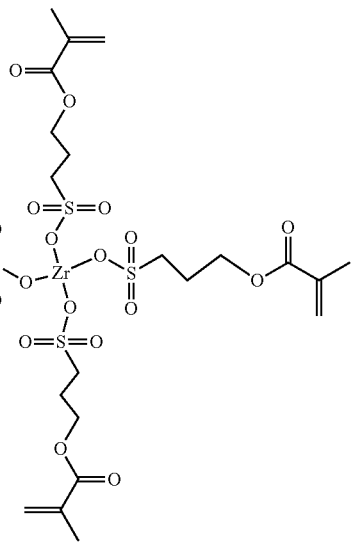

(1-4)

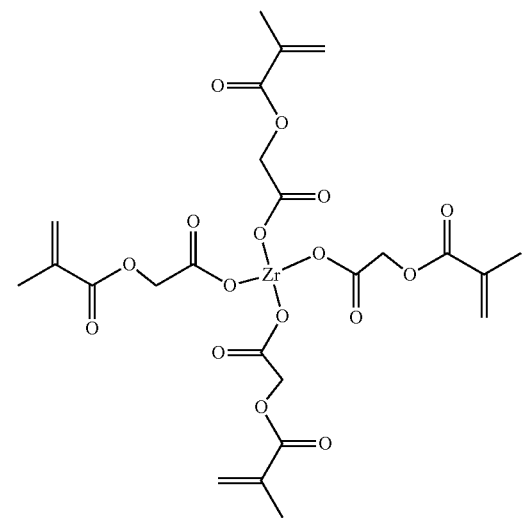

The organic metal compound may be prepared as an application liquid using an organic solvent. The organic solvent is sufficient to be able to dissolve or disperse elements to be used so as to be an even liquid solution. An arbitrary organic solvent may be properly selected from among known organic solvents. The organic solvent is, for example, lactone such as γ-butyrolactone; ketone such as acetone, methyl ethyl ketone, cyclohexanone, methyl-n-pentylketone, methylisopentylketone, and 2-heptanone; polyhydric alcohol such as ethyleneglycol, diethyleneglycol, propyleneglycol, and dipropyleneglycol; a chemical compound including an ester bond such as ethyleneglycolmonoacetate, diethyleneglycolmonoacetate, propyleneglycolmonoacetate, dipropyleneglycolmonoacetate; a derivative (preferably, propylenglycolmonomethyl etheracetate (PG-MEA) and propyleneglycol monomethylether (PGME)) of a polyhydric alcohol monoalkylether such as monomethylether, monopropylether, and monobuthylether or a chemical compound including an ether bond such as monophenylether, of the polyhydric alcohol or the chemical compound including the ester bond; ester such as cyclic ether like dioxane, methyllactate, ethyllactate (EL), methylacetate, ethylacetate, butylacetate, methylpyruvate, ethylpyruvate, methoxypropionatemethyl, and methoxypropionateethyl; an organic solventaromatic series-based organic solvent such as anisole, ethylbenzylether, cresylmethylether, diphenylether, dibenzylether, phenetol, butylphenylether, ethylbenzene, diethylbenzene, pentylbenzene, isopropylbenzene, toluene, xylene, cymene, and mesitylene; dimethylsulfoxide; or the like. One kind or at least two kinds of these may be mixed and used.

The used amount of the organic solvent is sufficient to be properly prepared depending on a mode of application and the film thickness. For example, the concentration of the organic metal compound is in a range of 0.1 to 20 mass %, preferably 0.5 to 5 mass %, more preferably 1 to 3 mass %.

For example, hydrogen bromide (HBr) is used as an etching gas for etching a semiconductor. The etching gas used at a time of etching the insulating film is, for example, $CF_4$. The etching gas used at a time of etching the organic film is, for example, oxygen $O_2$. As illustrated in FIG. 26, the first sacrificial film 14 may be made of a material whose etching tolerance for HBr, $CF_4$, and $O_2$ is improved by heating. FIG. 26 indicates the etching rates (nm/min) for HBr, $CF_4$, and $O_2$ of the first sacrificial film 14 before and after heating at 200° C. The etching tolerance is higher as the etching rate is smaller. The material of the first sacrificial film 14 is specifically described later.

In step S105, the core and the spacer are exposed. Specifically, as illustrated in FIGS. 6A to 6C, the first sacrificial film 14 is etched by wet etching until the upper surface of the core 12 and the upper surface of the spacer 13 are exposed from the first sacrificial film 14. At this time of etching, the first sacrificial film 14 is left on the side surface of the spacer 13. The wet etching is conducted by supplying, for example, an organic solvent to the first sacrificial film 14. The organic solvent may be selected depending on the material of the first sacrificial film 14. The organic solvent may be selected from that exemplified as the solvent, which is used to prepare the application liquid of the organic metal compound. The organic solvent for wet etching may be the same as the organic solvent used for the application liquid for the organic metal compound, or an organic solvent of a different type or an organic solvent of a different type. From the view point that the etching amount for the first sacrificial film 14 can be easily controlled, it is preferable to use a solvent having a slow solution rate of solving the first sacrificial film 14.

In step S106, the first sacrificial film is converted. Specifically, as illustrated in FIGS. 7A to 7C, a predetermined process is applied to the first sacrificial film 14 so as to improve etching tolerance. Hereinafter, the first sacrificial film 14 after the conversion is referred to as a "first sacrificial film 14a". The predetermined process can be determined depending on the material of the first sacrificial film 14. For example, in a case where the material of the first sacrificial film 14 has improved etching tolerance when it is heated to have a high temperature (e.g., 300° C.), the first sacrificial film 14 is heated at a high temperature so as to convert the first sacrificial film 14. For example, in a case where the material of the first sacrificial film 14 has improved etching tolerance when it is irradiated by an ultraviolet ray, the first sacrificial film 14 is irradiated by the ultraviolet ray so as to convert the first sacrificial film 14.

In step S107, an antireflection film is formed. Specifically, as illustrated in FIGS. 8A to 8C, an antireflection film 15 is formed by conducting, for example, spin coating on the core 12, the spacer 13, and the first sacrificial film 14a. The antireflection film 15 is a laminated film of, for example, a Silicon-containing Anti-Reflective Coating (SiARC) and Spin On Carbon (SOC).

In step S108, a resist film is formed. Specifically, as illustrated in FIGS. 9A to 9C, the resist film 16 is formed on the antireflection film 15. The material of the resist film 16 may be, for example, a chemically amplified resist. The material of the resist film 16 may be a non-chemically amplified resist.

In step S109, the resist film is patterned. Specifically, as illustrated in FIGS. 10A to 10C, the resist film 16 is exposed to light of ArF having a wavelength of 193 nm or EUV having a wavelength of 13.5 nm while intervening, for example, a dark field mask having an opening portion at a predetermined position as an exposure mask. The predetermined position corresponds to a position, from which the first sacrificial film 14a is removed in step S111. Said differently, the predetermined position overlaps a position of the first sacrificial film 14a, which is removed in step S111, in a plan view. In step S109, it is preferable to pattern the resist film 16 so that the opening portion is formed only at the predetermined position. However, formation of the opening portion only at the predetermined position may be difficult due to lack of a registering accuracy for an exposure mask. As illustrated in FIGS. 10A to 10C, there may be a case where an opening portion is formed at a position other than the predetermined position, for example, a position corresponding to the core and spacer 13, said differently, a position overlapping a position where the core 12 and the spacer 13 are formed in the plan view.

In step S110, an antireflection film is etched. Specifically, as illustrated in FIGS. 11A to 11C, the antireflection film 15 is etched by dry etching such as RIE using the resist film 16 as the etching mask.

In step S111, the first sacrificial film is etched. Specifically, as illustrated in FIGS. 12A to 12C, the first sacrificial film 14a is etched by dry etching such as RIE using the resist film 16 as the etching mask. For example, chlorine ($Cl_2$) can be used as the etching gas. At this time, the core 12 is made of material (for example, polysilicon) having a high etching tolerance for $Cl_2$. The spacer 13 is made of material (for example, an $SiO_2$ film) having a high etching tolerance for $Cl_2$. Therefore, the selection ratio of the first sacrificial film 14a relative to the core 12 and the selection ratio of the first sacrificial film 14a relative to the spacer 13 increase. Therefore, as illustrated in FIG. 11, the position of the resist film 16 as the etching mask shifts so that the core 12 and the spacer 13 are prevented from being etched as illustrated in FIGS. 12A to 12C even in a case where an opening portion is formed at a position corresponding to the core 12 or the spacer 13. As a result, the processing accuracy of the patterning is improved.

In step S112, the resist film and the antireflection film are removed. Specifically, as illustrated in FIGS. 13A to 13C, the resist film 16 and the antireflection film 15 remaining on the core 12, the spacer 13 and the first sacrificial film 14a are removed by dry etching such as RIE.

Figure 14C:
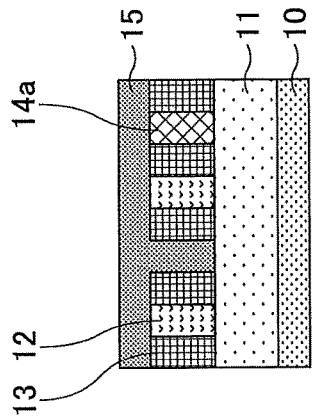
FIGS. 14A, 14B, and 14C illustrate one of processes of the pattern forming method of the first embodiment.
Figure 14B:
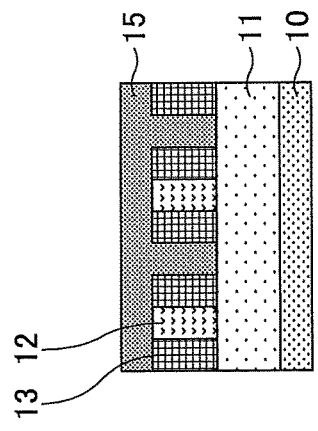
Figure 14A:
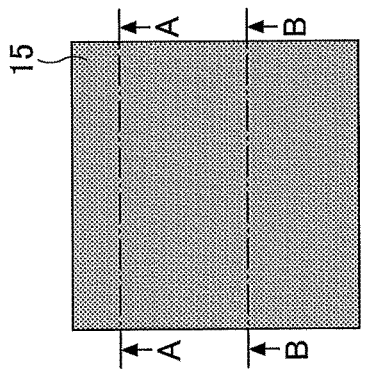

In step S113, an antireflection film is formed. Specifically, as illustrated in FIGS. 14A to 14C, an antireflection film 15 is formed by conducting, for example, spin coating on the core 12, the spacer 13, and the first sacrificial film 14a. The antireflection film 15 is, for example, the same as the film used in step S107.

Figure 15C:
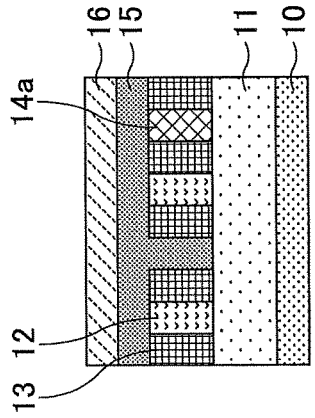
FIGS. 15A, 15B, and 15C illustrate one of processes of the pattern forming method of the first embodiment.
Figure 15B:
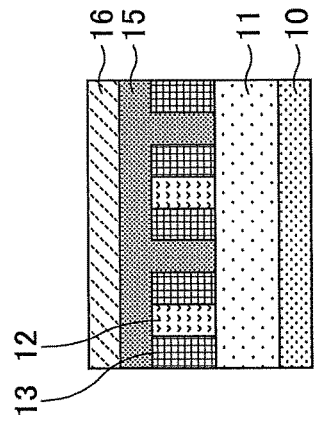
Figure 15A:
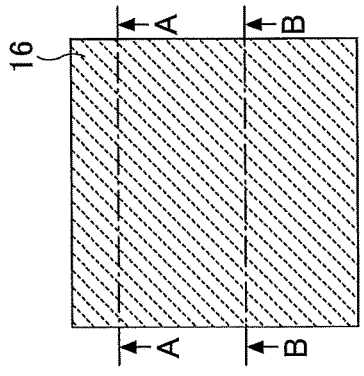

In step S114, the resist film is formed. Specifically, as illustrated in FIGS. 15A to 15C, the resist film 16 is formed on the antireflection film 15. The material of the antireflection film 16 is, for example, the same as the material used in step S107.

Figure 16A:
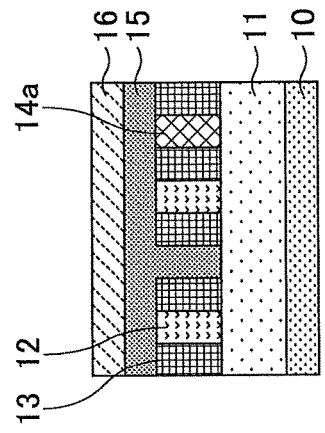
FIGS. 16A, 16B, and 16C illustrate one of processes of the pattern forming method of the first embodiment.
Figure 16B:
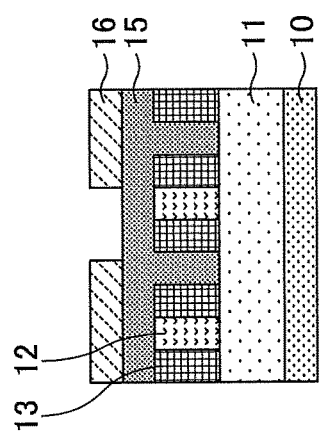
Figure 16C:
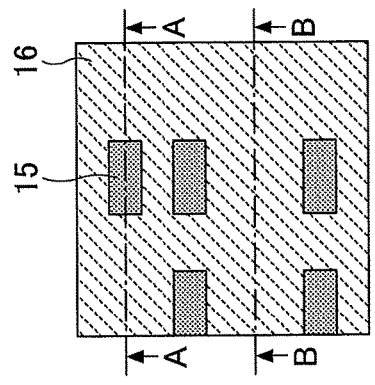

In step S115, the resist film is patterned. Specifically, as illustrated in FIGS. 16A to 16C, the resist film 16 is exposed to ArF having a wavelength of 193 nm and developed to pattern the resist film 16. Here, the exposure mask is a dark field mask having the opening portion at a predetermined position in a case where a resist of a positive tone image is used, and a bright field mask in a case where a resist of a negative tone image is used, for example. The exposure wavelength may be 13.5 nm by using EUV. The predetermine position is a position at which the core 12 is removed in step S117 described below, said differently, a position overlapping the core 112 to be removed in step S117 in the plan view. In step S115, it is preferable to pattern the resist film 16 so that the opening portion is formed only at the predetermined position. However, formation of the opening portion only at the predetermined position may be difficult due to lack of the registering accuracy for the exposure mask. As illustrated in FIGS. 16A to 16C, there may be a case where an opening portion is formed at a position other than the predetermined position, for example, a position corresponding to the spacer 13, said differently, a position overlapping a position where the spacer 13 is formed in the plan view.

Figure 17A:
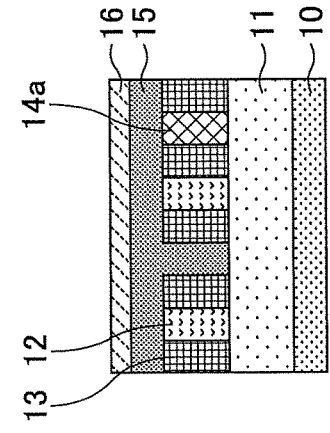
FIGS. 17A, 17B, and 17C illustrate one of processes of the pattern forming method of the first embodiment.
Figure 17B:
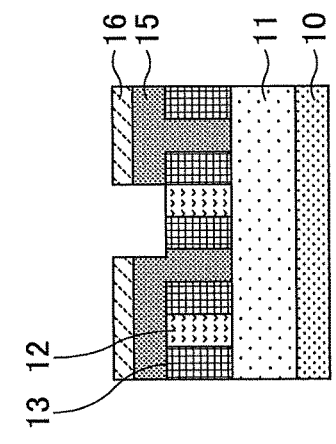
Figure 17C:
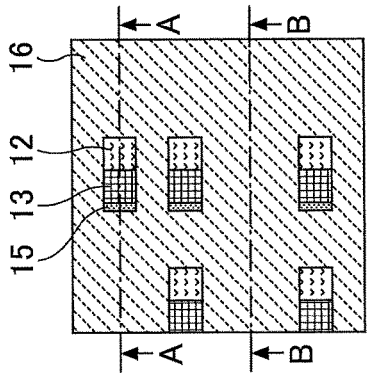

In step S116, the antireflection film is etched. Specifically, as illustrated in FIGS. 17A to 17C, the antireflection film 15 is etched by dry etching such as RIE using the resist film 16 as the etching mask.

In step S117, the core is etched. Specifically, as illustrated in FIGS. 18A to 18C, the core 12 is etched by dry etching such as RIE using the resist film 16 as the etching mask. For example, HBr or Cl can be used as the etching gas. At this time, the spacer 13 is made of a material (for example, an $SiO_2$ film) having a high etching tolerance for Hbr and Cl. With this, the selection ratio of the core 12 for the spacer 13 increases. Therefore, as illustrated in FIGS. 17A to 17C, the position of the resist film 16 as the etching mask shifts so that the spacer 13 is prevented from being etched as illustrated in FIGS. 18A to 18C even in a case where an opening portion is formed at a position corresponding to the spacer 13. As a result, the processing accuracy of the patterning is improved.

In step S118, the resist film and the antireflection film are removed. Specifically, as illustrated in FIGS. 19A to 19C, the resist film 16 and the antireflection film 15 remaining on the core 12, the spacer 13, and the first sacrificial film 14a are removed by dry etching such as RIE.

In step S119, a pattern reverse film is formed. Specifically, as illustrated in FIGS. 20A to 20C, a pattern reverse film 17 is formed to cover surfaces of the core 12, the spacer 13, and the first sacrificial film 14a, which are formed on the second underlayer film, by, for example, CVD. The pattern reverse film 17 is, for example, the $SiO_2$ film or Spin On Glass (SOG).

In step S120, the core and the first sacrificial film are exposed. Specifically, as illustrated in FIG. 21, the pattern reverse film 17 is etched until the upper surface of the core 12 and the upper surface of the first sacrificial film 14a are exposed. For example, $CF_4$ can be used as the etching gas.

In step S121, the core is etched. Specifically, as illustrated in FIG. 22, the core 12 is removed by dry etching such as RIE. For example, HBr can be used as the etching gas.

In step S122, the first sacrificial film is etched. Specifically, as illustrated in FIG. 23, the first sacrificial film 14a is etched by dry etching such as RIE. For example, $Cl_2$ can be used as the etching gas.

In step S123, the second underlayer film is etched. Specifically, as illustrated in FIGS. 24A to 24C, the second underlayer film 11 is etched by dry etching such as RIE using the pattern reverse film 17 as the etching mask.

In step S124, the pattern reverse film and the spacer are removed. Specifically, as illustrated in FIG. 25, the pattern reverse film 17 and the spacer 13 are removed by dry etching such as RIE. In a case where the pattern reverse film 17 is the SiO2 film or the SOG, the pattern reverse film 17 and the spacer 13 can be simultaneously removed. IN this case, For example, $CF_4$ can be used as the etching gas.

With the above processes, a desirable pattern can be formed.

Comparative Example

Figure 27:
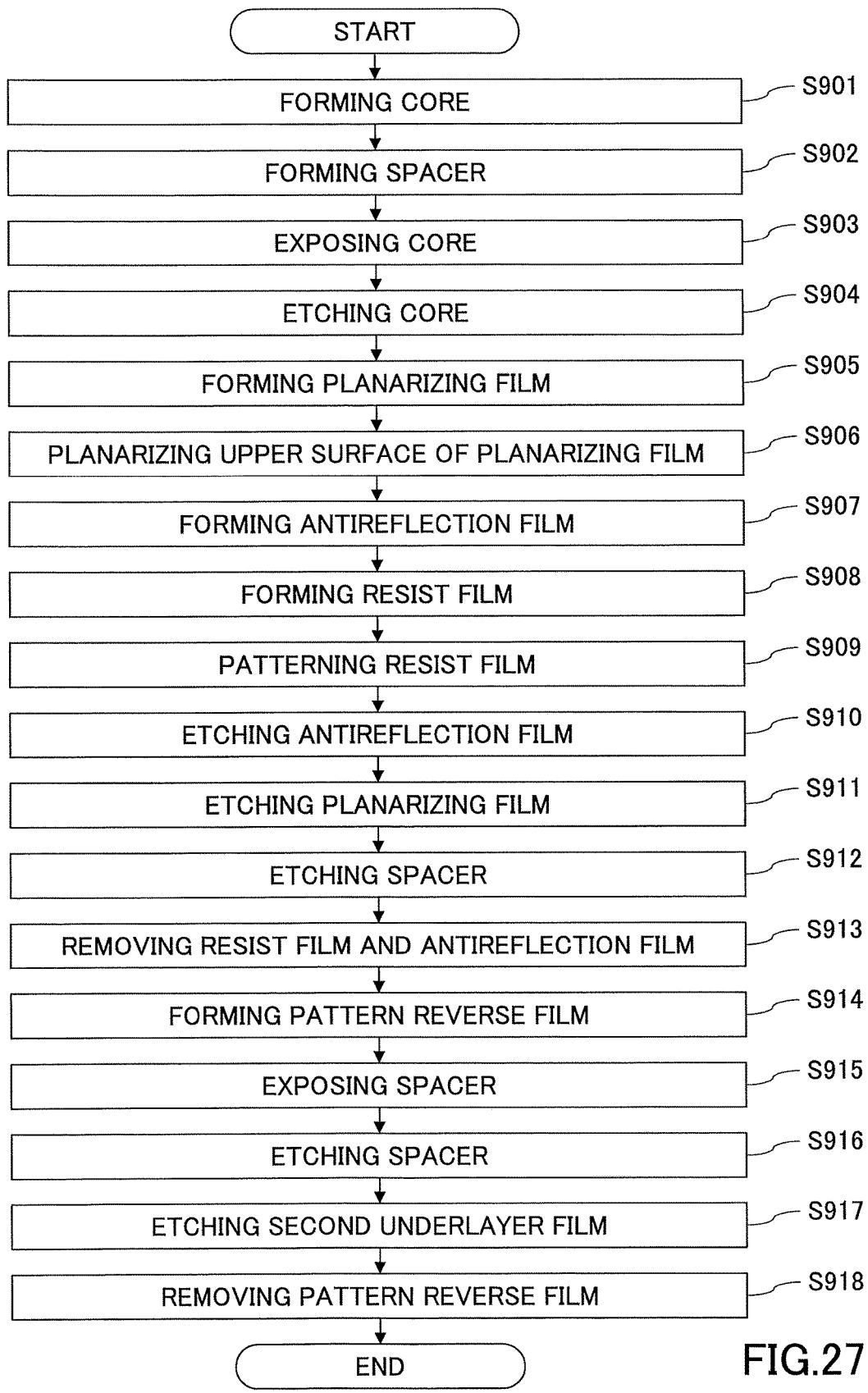
FIG. 27 is a flowchart illustrating an example of a conventional pattern forming method of a first embodiment.

A pattern forming method of a comparative example is described to compare with the pattern forming method of the first embodiment. FIG. 27 is a flowchart illustrating the pattern forming method of the comparative example.

The pattern forming method of the comparative example differs from the pattern forming method of the first embodiment at a point that the core is etched and removed after a process of exposing the core and the spacer in the pattern forming method of the first embodiment.

As illustrated in FIG. 27, the pattern forming method of the comparative example includes: forming a core (step S901), forming a spacer (step S902), exposing the core (step S903), etching the core (step S904), forming a planarizing film (step S905), planarizing an upper surface of the planarizing film (step S906), forming an antireflection film (step S907), forming a resist film (step S908), patterning the resist film (step S909), etching the antireflection film (step S910), etching the planarizing film (step S911), etching the spacer (step S912), removing the resist film and the antireflection film (step S913), forming a pattern reverse film (step S914), exposing the spacer (step S915), etching the spacer (step S916), etching the second underlayer film (step S917), and removing the pattern reverse film (step S918).

Hereinafter, the steps are described with reference to FIGS. 28A to 45C. FIGS. 28A to 45C schematically illustrate processes of the pattern forming method of the comparative example. FIGS. 28A, 29A, . . . , 45A are plan views in each of the steps. FIGS. 28B, 29B, . . . , 45B are cross-sectional views taken along a dashed-dotted line A-A respectively of FIGS. 28A, 29A, . . . , 45A. FIGS. 28C, 29C, . . . , 45C are cross-sectional views taken along a dashed-dotted line B-B respectively of 28A, 29A, . . . , 45A.

In step S901, the core is formed. Specifically, as illustrated in FIGS. 28A to 28C, the core 12 is formed on the second underlayer film 11 formed on the first underlayer film 10 by, for example, CVD. Subsequently, light exposure having a wavelength of 193 nm using ArF and development undergo so as to pattern the core 12 to have a line and space shape, which includes lines arranged while interposing a predetermined distance. In case of a front end, the first underlayer film 10 is made of, for example, polysilicon, and the second underlayer film 11 is made of, for example, an SiN film, and the core 12 is made of polysilicon. In case of a back end, the first underlayer film 10 is made of, for example, ILD, and the second underlayer film 11 is made of, for example, a TiN film, and the core 12 is made of polysilicon.

In step S902, the spacer is formed. Specifically, as illustrated in FIGS. 29A to 29C, the spacer 13 having a film thickness substantially the same as the line width of the core 12 is formed so as to cover the surface (the upper surface and the side surface) of the core 12 by, for example, chemical vapor deposition (CVD) or atomic layer deposition (ALD). The spacer 13 is, for example, an $SiO_2$ film.

In step S903, the core is exposed. Specifically, as illustrated in FIGS. 30A to 30C, the spacer 13 is etched until the upper surface of the core 12 is exposed by dry etching such as reactive ion etching (RIE). At this time of etching, the spacer 13 is left on the side surface of the core 12. For example, $CF_4$ can be used as the etching gas.

In step S904, the core is etched. Specifically, as illustrated in FIG. 31, the core 12 is removed by dry etching such as RIE. For example, HBr can be used as the etching gas.

In step S905, a planarizing film is formed. Specifically, as illustrated in FIGS. 32A to 32C, a planarizing film 94 is formed on the second underlayer film 11, in which the spacer 13 is formed, by, for example, CVD. In case of the front end, the planarizing film 94 is made of, for example, polysilicon or amorphous silicon. In case of the back end, the planarizing film 94 is made of, for example, polysilicon or amorphous silicon.

In step S906, the upper surface of the planarizing film is planarized. Specifically, as illustrated in FIGS. 33A to 33C, the upper surface of the planarizing film 94 is planarized by, for example, Chemical Mechanical Planarization (CMP).

Figure 34A:
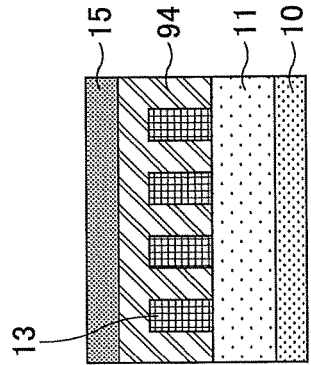
FIGS. 34A, 34B, and 34C illustrate another one of the processes of the conventional pattern forming method.
Figure 34B:
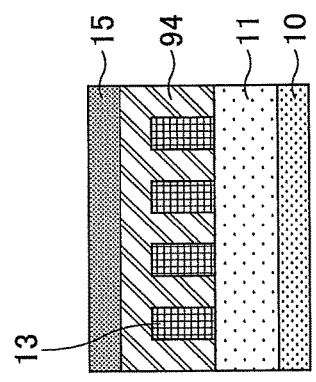
Figure 34C:
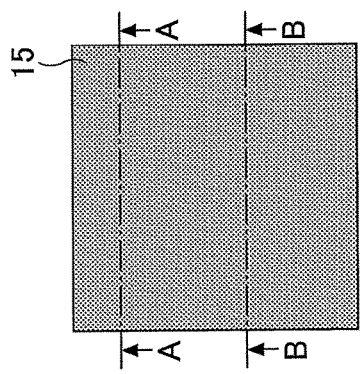

In step S907, an antireflection film is formed. Specifically, as illustrated in FIGS. 34A to 34C, the antireflection film 15 is formed on the planarizing film 94, by conducting, for example, spin coating. The antireflection film 15 is a laminated film of, for example, SOC and SiARC.

Figure 35A:
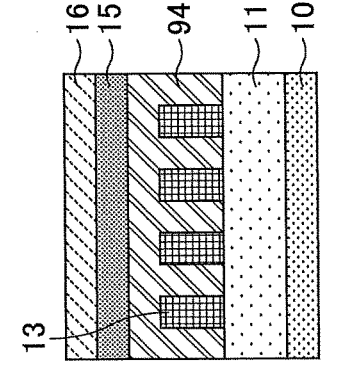
FIGS. 35A, 35B, and 35C illustrate another one of the processes of the conventional pattern forming method.
Figure 35B:
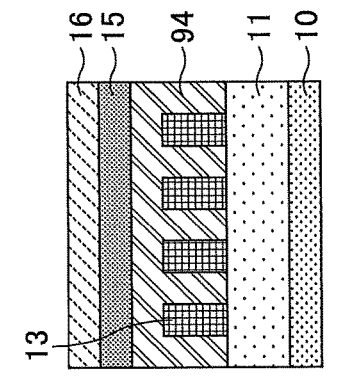
Figure 35C:
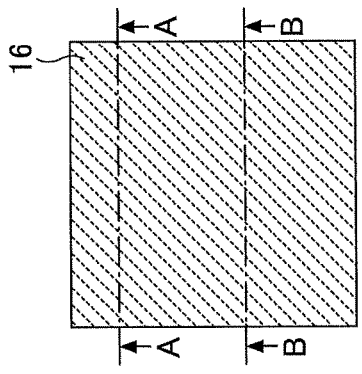

In step S908, the resist film is formed. Specifically, as illustrated in FIGS. 35A to 35C, the resist film 16 is formed on the antireflection film 15. The material of the resist film 16 may be, for example, a chemically amplified resist.

Figure 36A:
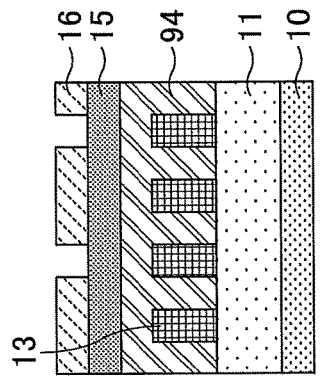
FIGS. 36A, 36B, and 36C illustrate another one of the processes of the conventional pattern forming method.
Figure 36B:
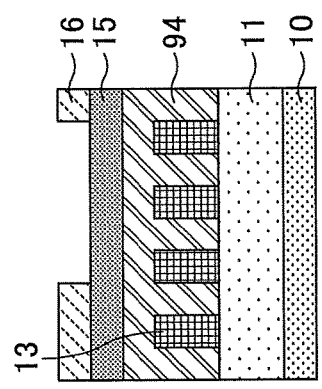
Figure 36C:
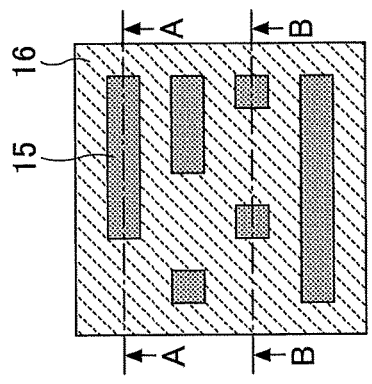

In step S909, the resist film is patterned. Specifically, as illustrated in FIGS. 36A to 36C, a dark field mask having multiple openings at predetermined positions is used as the exposure mask so as to expose the resist film 16 to the light having a wavelength of 193 nm emitted by ArF and develop the resist film 16. In a case where a resist of the negative tone image for patterning the resist film 16, a bright field mask may be used.

Figure 37A:
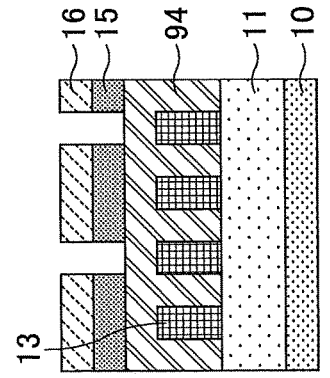
FIGS. 37A, 37B, and 37C illustrate another one of the processes of the conventional pattern forming method.
Figure 37B:
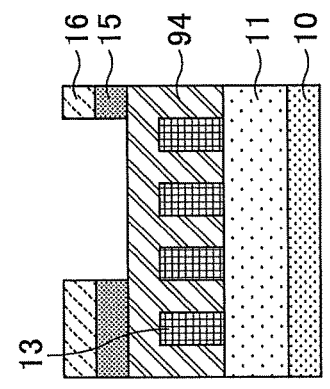
Figure 37C:
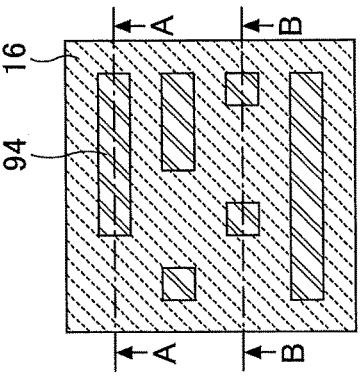

In step S910, the antireflection film is etched. Specifically, as illustrated in FIGS. 37A to 37C, the antireflection film 15 is etched by dry etching such as RIE using the resist film 16 as the etching mask.

Figure 38C:
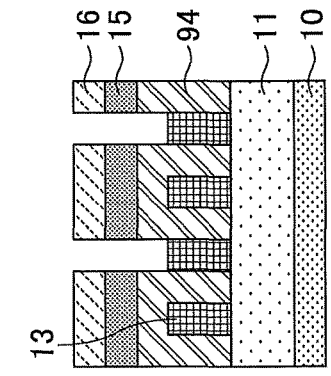
FIGS. 38A, 38B, and 38C illustrate another one of the processes of the conventional pattern forming method.
Figure 38B:
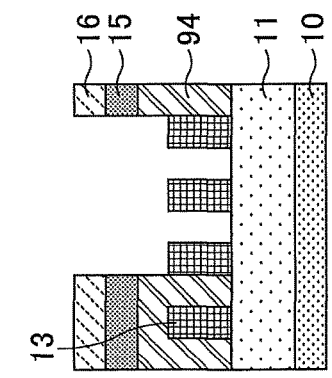
Figure 38A:
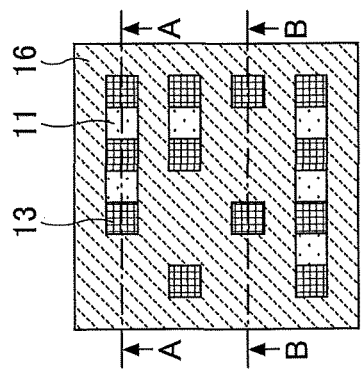

In step S911, the planarizing film 94 is etched. Specifically, as illustrated in FIGS. 38A to 38C, the planarizing film 94 is etched by dry etching such as RIE using the resist film 16 as the etching mask. HBr or Cl can be used as the etching gas in a case where the planarizing film 94 is made of polysilicon.

Figure 39C:
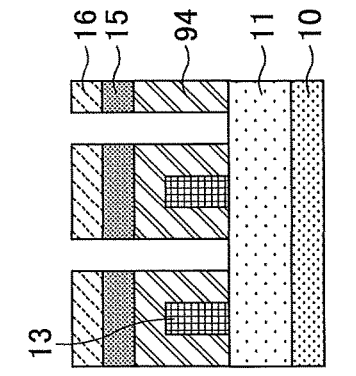
FIGS. 39A, 39B, and 39C illustrate another one of the processes of the conventional pattern forming method.
Figure 39B:
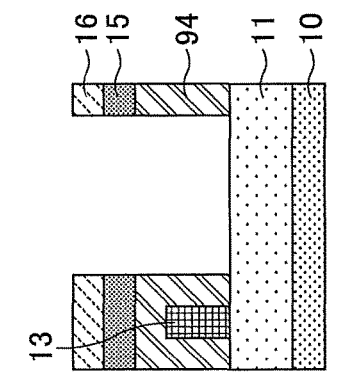
Figure 39A:
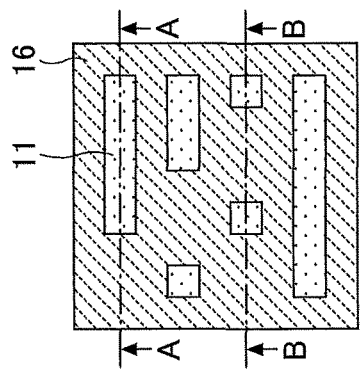

In step S912, the spacer is etched. Specifically, as illustrated in FIGS. 39A to 39C, the spacer 13 is etched by dry etching such as RIE using the resist film 16 as the etching mask. With this, a line pattern formed by the spacer 13 is cut. For example, $CF_4$ can be used as the etching gas.

In step S913, the resist film and the antireflection film are removed. Specifically, as illustrated in FIGS. 40A to 40C, the resist film 16 and the antireflection film 15 are removed by dry etching such as RIE using the resist film 16 as the etching mask.

The above process enables to form the desired pattern in case of the front end.

In step S914, a pattern reverse film is formed. Specifically, as illustrated in FIGS. 41A to 41C, the pattern reverse film 97 is formed so as to cover the surface of the spacer 13 on the second underlayer film 11, in which the spacer 13 is formed, by, for example, CVD. The pattern reverse film 97 is, for example, a silicon nitride film (a SiN film).

In step S915, the spacer is exposed. Specifically, as illustrated in FIGS. 42A to 42C, the pattern reverse film 97 is etched until the upper surface of the spacer 13 12 is exposed by dry etching such as RIE.

In step S916, the spacer is etched. Specifically, as illustrated in FIG. 43, the spacer 13 is etched by dry etching such as RIE.

Figure 44C:
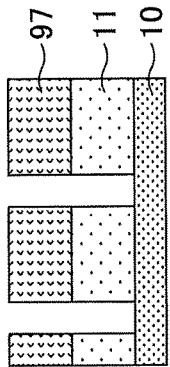
FIGS. 44A, 44B, and 44C illustrate another one of the processes of the conventional pattern forming method.
Figure 44B:
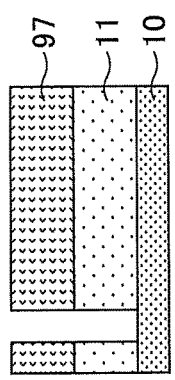
Figure 44A:
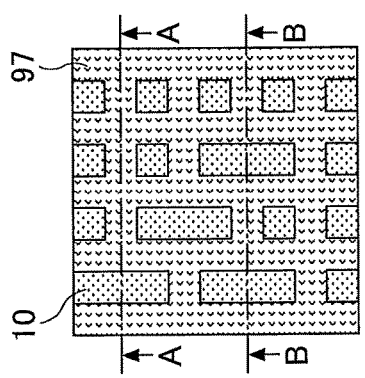

In step S917, the second underlayer film is etched. Specifically, as illustrated in FIGS. 44A to 44C, the second underlayer film 11 is etched by dry etching such as RIE using the pattern reverse film 97 as the etching mask.

Figure 45C:
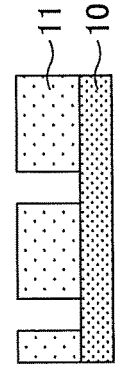
FIGS. 45A, 45B, and 45C illustrate another one of the processes of the conventional pattern forming method.
Figure 45B:
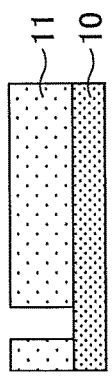
Figure 45A:
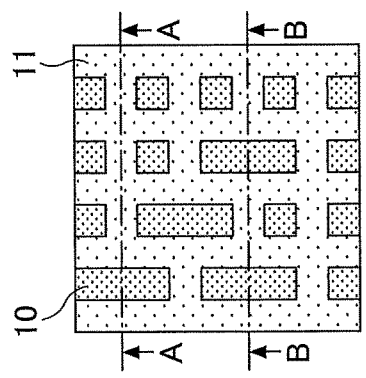

In step S918, the pattern reverse film 97 is formed. Specifically, as illustrated in FIGS. 45A to 45C, the pattern reverse film 97 is removed by dry etching such as RIE.

The above process enables to form the desired pattern in case of the back end.

Heretofore, the first embodiment and the comparative example have been described. According to the first embodiment, the following function and effect are obtainable.

FIGS. 46A, 46B, 46C, 46D, 46E, and 46F illustrate a registration mark. Specifically, FIGS. 46A and 46B schematically illustrates a registration mark formed by the core 12. FIG. 46A is a plan view of illustrating the upper surface, and FIG. 46B is a cross-sectional view taken along the dashed-dotted line A-A of FIG. 46A. FIGS. 46C and 46D schematically illustrate a registration mark when the core 12 is not removed. FIG. 46C is a plan view of illustrating the upper surface, and FIG. 46D is a cross-sectional view taken along a dashed-dotted line A-A of FIG. 46C. FIGS. 46E and 46F schematically illustrate a registration mark when the core 12 is removed. FIG. 46F is a plan view of illustrating the upper surface, and FIG. 46E is a cross-sectional view taken along a dashed-dotted line A-A of FIG. 46E.

Within the first embodiment, a desired pattern formation is conducted without removing the core 12 formed on the second underlayer film 11. Therefore, the registration mark used at a time of reading an overlap of the patterns is not etched. Specifically, in step S101, the core 12 formed on the second underlayer film 11 is patterned to form the registration mark having a predetermined shape. Next, in step S102, the spacer 13 is formed so as to cover the surface of the core 12. In step S103, the spacer 13 formed on the upper surface is removed. At this time, the spacer 13 is left on the core 12 and the side surface of the core 12 in the registration mark as illustrated in FIGS. 46C and 46D. Said differently, the size of the registration mark in the plan view is not small. As a result, readout accuracy of the registration mark can be improved in a later process.

Meanwhile, in the comparative example, after forming the spacer 13 on the side surface of the core 12 formed on the second underlayer film 11, the core 12 is etched and removed. Therefore, the registration mark formed of the core 12 is etched, the size of the registration mark in the plan view becomes small. Specifically, in step S901, the core 12 formed on the second underlayer film 11 is patterned to form the registration mark having a predetermined shape as illustrated in FIGS. 46A and 46B. Next, in step S902, the spacer 13 is formed so as to cover the surface of the core 12. In step S903, the spacer 13 formed on the upper surface of the core 12 is removed. Thereafter, in step S904, the core 12 is etched. At this time, because the core 12 is etched and disappears, the registration mark has a shape such that only the spacer 13 formed on the side surface of the core 12 remains as illustrated in FIGS. 46E and 46F. Said differently, the size of the registration mark in the plan view becomes small. As a result, readout accuracy of the registration mark degrades in a later process.

Although the registration mark has been described, an effect similar thereto is obtainable for an alignment mark, which is used to align positions of a pattern and an exposure mask, in use of the pattern forming method of the first embodiment.

Second Embodiment

Figure 47:
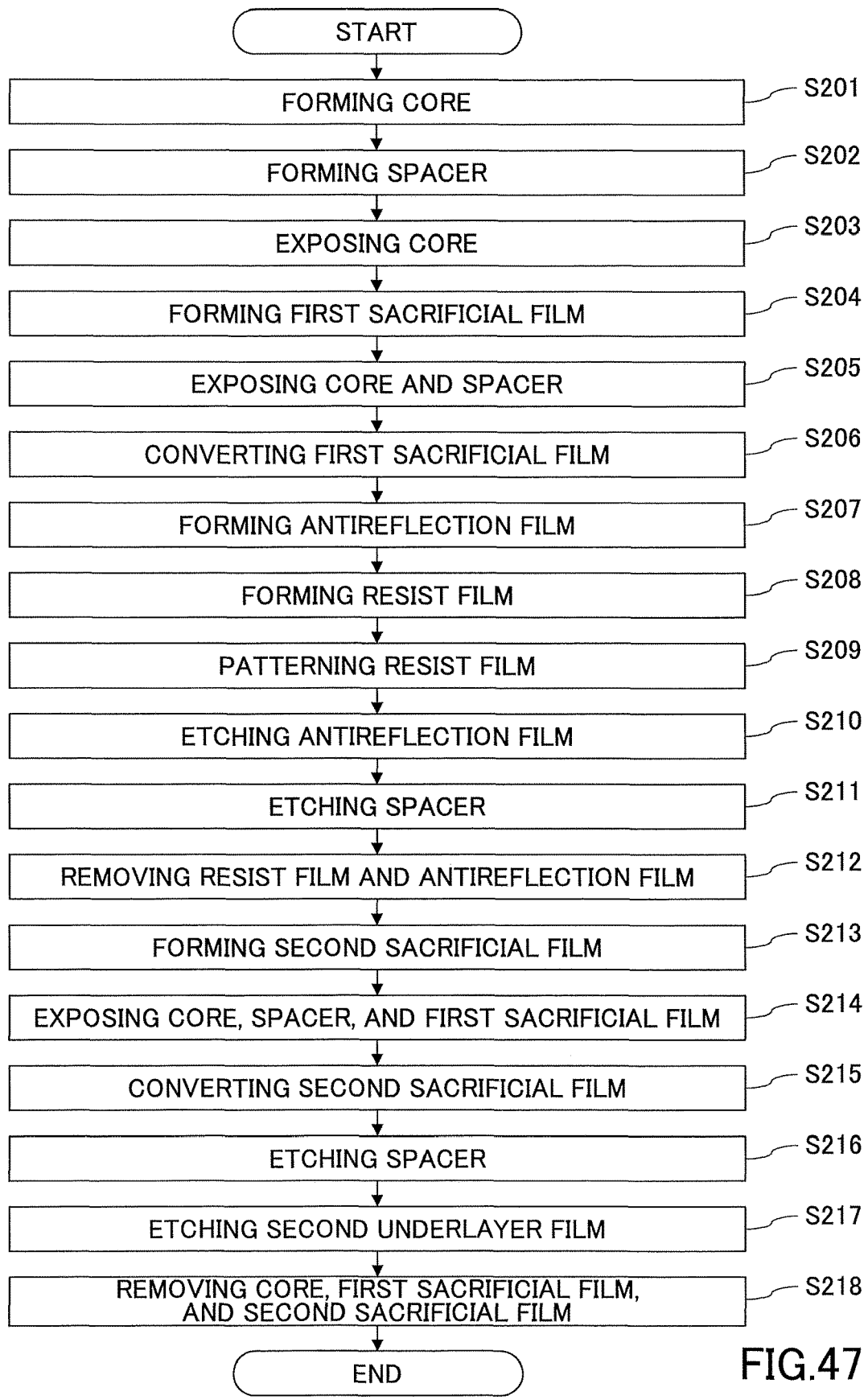
FIG. 47 is a flowchart illustrating an example of the pattern forming method of a second embodiment.

A pattern forming method for forming a pattern according to a second embodiment is described next. FIG. 47 is a flowchart illustrating the pattern forming method of the second embodiment.

As illustrated in FIG. 47, the pattern forming method of the second embodiment includes: forming a core (step S201), forming a spacer (step S202), exposing the core (step S203), forming a first sacrificial film (step S204), exposing the core and spacer (step S205), converting a first sacrificial film (step S206), forming an antireflection film (step S207), forming a resist film (step S208), patterning the resist film (step S209), etching the antireflection film (step S210), etching the spacer (step S211), removing the resist film and the antireflection film (step S212), forming a second sacrificial film (step S213), exposing the core, the spacer, and the first sacrificial film (step S214), converting the second sacrificial film (step S215), etching the spacer (step S216), etching second underlayer film (step S217), removing the core, the first sacrificial film, and the second sacrificial film (step S218).

Figure 48A:
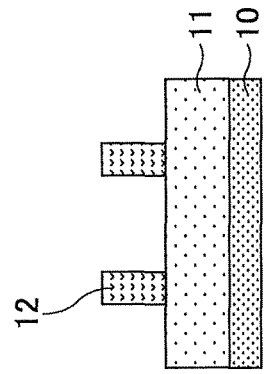
FIGS. 48A, 48B, and 48C illustrate one of processes of the pattern forming method of the second embodiment.
Figure 48B:
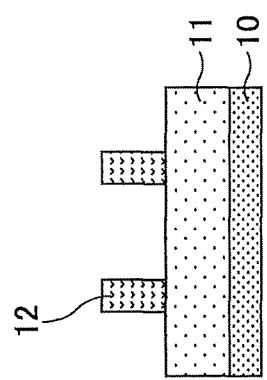
Figure 48C:
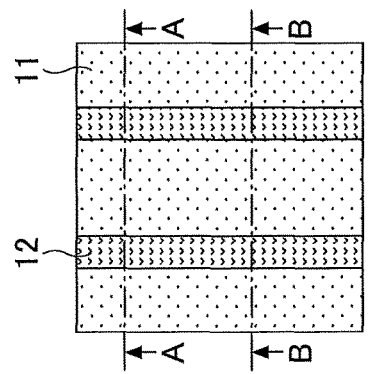
Figure 49A:
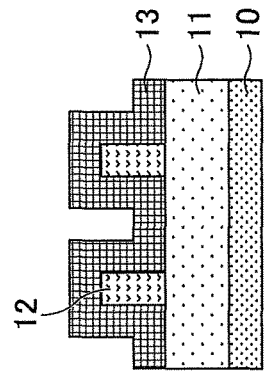
FIGS. 49A, 49B, and 49C illustrate another one of the processes of the pattern forming method of the second embodiment.
Figure 49B:
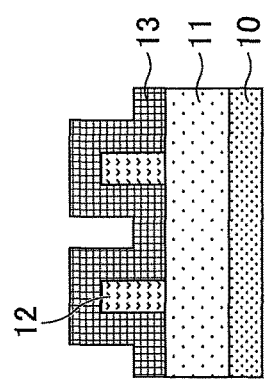
Figure 49C:
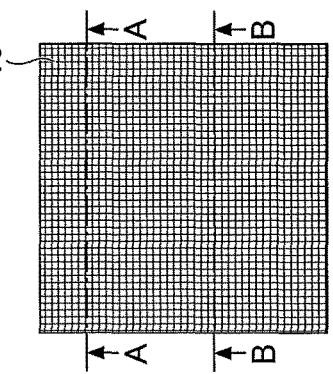

Hereinafter, the steps are described with reference to FIGS. 48A to 65C. FIGS. 48A to 65C schematically illustrate processes of the pattern forming method of the second embodiment. FIGS. 48A, 49A, . . . , 65A are plan views in each of the steps. FIGS. 48B, 49B, . . . , 65B are cross-sectional views taken along a dashed-dotted line A-A respectively of FIGS. 48A, 49A, . . . , 65A. FIGS. 48C, 49C, . . . , 65C are cross-sectional views taken along a dashed-dotted line B-B respectively of 48A, 49A, . . . , 65A.

In step S201, the core is formed. Specifically, as illustrated in FIGS. 48A to 48C, the core 12 is formed on the second underlayer film 11 formed on the first underlayer film 10 by, for example, CVD. Subsequently, light exposure having a wavelength of 193 nm using ArF and development undergo so as to pattern the core 12 to have a line and space shape, which includes lines arranged while interposing a predetermined distance. Next, a slimming processing is conducted to form a fine pattern smaller than the resolution limit in the photolithography technique. The first underlayer film 10 is, for example, ILD and the second underlayer film 11 is, for example, a TiN film. The core 12 is an example of the first film such as polysilicon.

In step S202, the spacer is formed. Specifically, as illustrated in FIGS. 49A to 49C, the spacer 13 having a film thickness substantially the same as the line width of the core 12 is formed so as to cover the surface (the upper surface and the side surface) of the core 12 by, for example, CVD or ALD. The spacer 13 is an example of the second film which is made of, for example, an $SiO_2$ film.

Figure 50B:
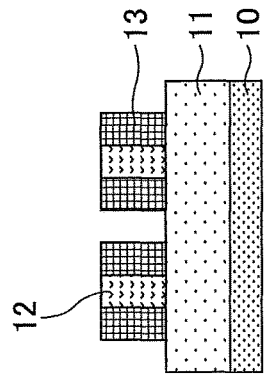
FIGS. 50A, 50B, and 50C illustrate another one of the processes of the pattern forming method of the second embodiment.
Figure 50C:
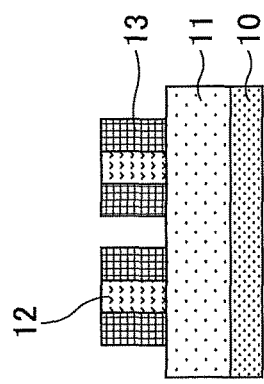
Figure 50A:
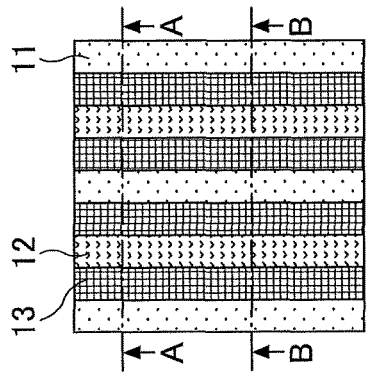

In step S203, the core is exposed. Specifically, as illustrated in FIGS. 50A to 50C, the spacer 13 is etched until the upper surface of the core 12 is exposed by dry etching such as RIE. At this time of etching, the spacer 13 is left on the side surface of the core 12. For example, $CF_4$ can be used as the etching gas.

Figure 51B:
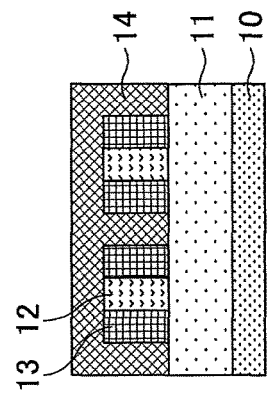
FIGS. 51A, 51B, and 51C illustrate another one of the processes of the pattern forming method of the second embodiment.
Figure 51C:
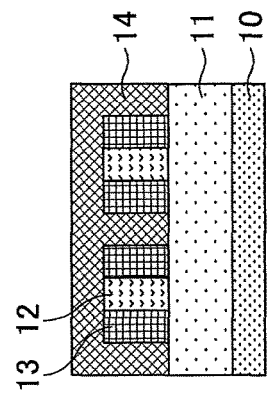
Figure 51A:
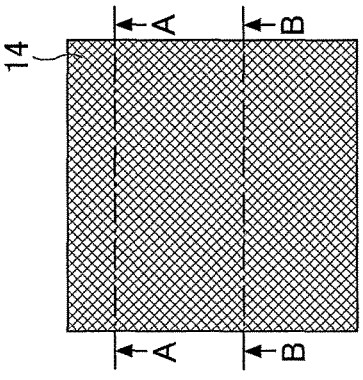

In step S204, a first sacrificial film is formed. Specifically, as illustrated in FIGS. 51A to 51C, the first sacrificial film 14 is formed so as to cover the surface of the core 12 and the surface of the spacer 13 by conducting spin coating of a liquid solution containing the first sacrificial film 14. Because the first sacrificial film 14 is formed by conducting the spin coating, the upper surface of the first sacrificial film can be smoothed to expand a lithography margin. After conducting the spin coating with the liquid solution containing the material of the first sacrificial film 14, the liquid solution may be heated, if necessary, at a low temperature (for example, 100° C.) and then dried. The first sacrificial film 14 is an example of a third film and may be a material the same as the first embodiment.

Figure 52C:
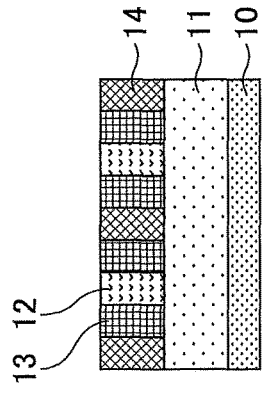
FIGS. 52A, 52B, and 52C illustrate another one of the processes of the pattern forming method of the second embodiment.
Figure 52B:
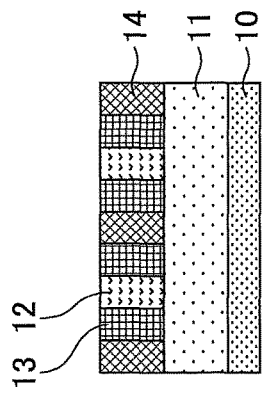
Figure 52A:
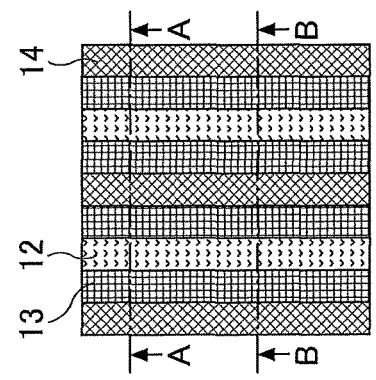

In step S205, the core and the spacer are exposed. Specifically, as illustrated in FIGS. 52A to 52C, the first sacrificial film 14 is etched by wet etching until the upper surface of the core 12 and the upper surface of the spacer 13 are exposed from the first sacrificial film 14. At this time of etching, the first sacrificial film 14 is left on the side surface of the spacer 13. The wet etching is conducted by supplying, for example, an organic solvent to the first sacrificial film 14. The organic solvent may be selected in response to the material of the first sacrificial film 14. The organic solvent is preferably a solvent having a low solution rate for the first sacrificial film 14 from a view point that the etching amount can be easily controlled.

Figure 53C:
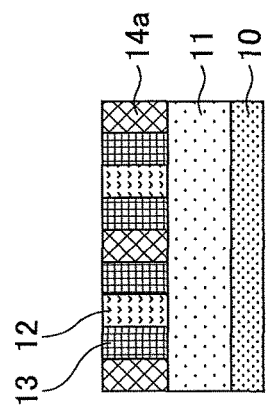
FIGS. 53A, 53B, and 53C illustrate another one of the processes of the pattern forming method of the second embodiment.
Figure 53B:
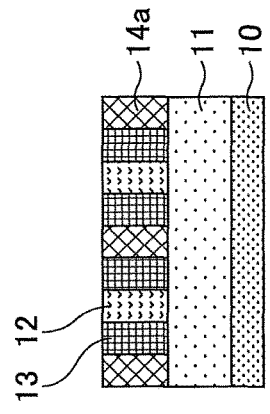
Figure 53A:
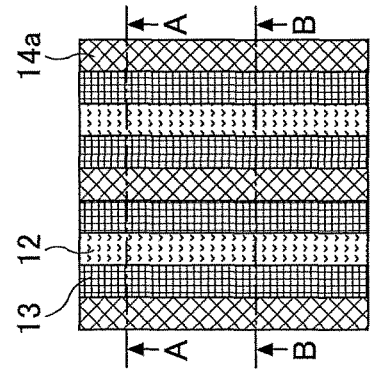

In step S206, the first sacrificial film is converted. Specifically, as illustrated in FIGS. 53A to 53C, a predetermined process is applied to the first sacrificial film 14 so as to improve etching tolerance of the first sacrificial film 14. The predetermined process can be determined depending on the material of the first sacrificial film 14. For example, in a case where the material of the first sacrificial film 14 has improved etching tolerance when it is heated to have a high temperature (e.g., 300° C.), the first sacrificial film 14 is heated at a high temperature so as to convert the first sacrificial film 14. For example, in a case where the material of the first sacrificial film 14 has improved etching tolerance when it is irradiated by an ultraviolet ray, the first sacrificial film 14 is irradiated by the ultraviolet ray so as to convert the first sacrificial film 14.

Figure 54A:
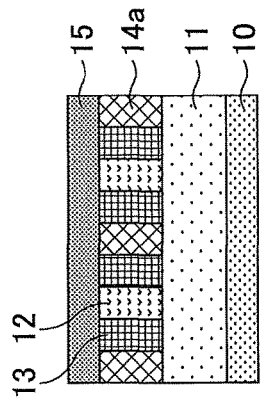
FIGS. 54A, 54B, and 54C illustrate another one of the processes of the pattern forming method of the second embodiment.
Figure 54B:
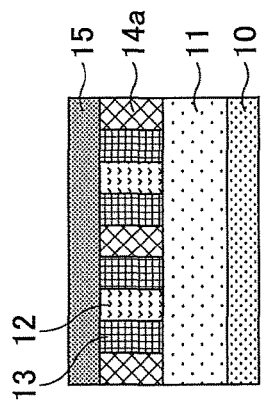
Figure 54C:
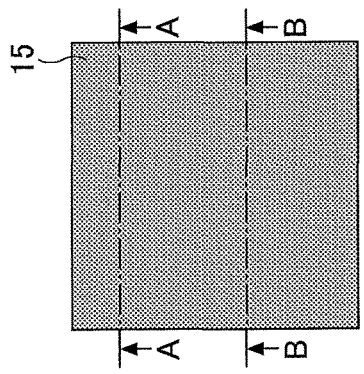

In step S207, an antireflection film is formed. Specifically, as illustrated in FIGS. 54A to 54C, an antireflection film 15 is formed by conducting, for example, spin coating on the core 12, the spacer 13, and the first sacrificial film 14a. The antireflection film 15 is a laminated film of, for example, SiARC and SOC.

Figure 55A:
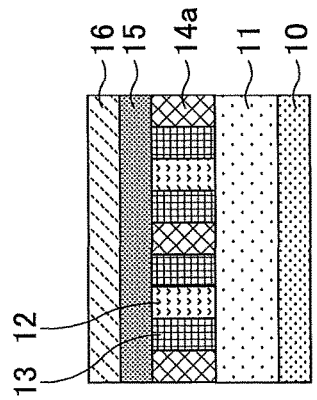
FIGS. 55A, 55B, and 55C illustrate another one of the processes of the pattern forming method of the second embodiment.
Figure 55B:
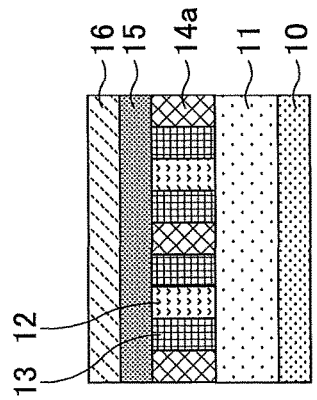
Figure 55C:
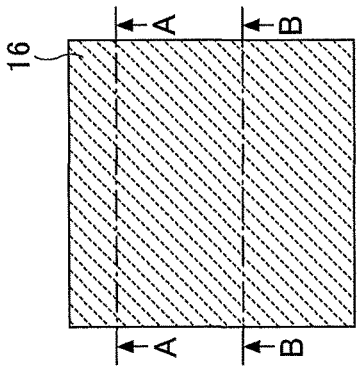

In step S208, the resist film is formed. Specifically, as illustrated in FIGS. 55A to 55C, the resist film 16 is formed on the antireflection film 15. The material of the resist film 16 may be, for example, a chemically amplified resist.

Figure 56C:
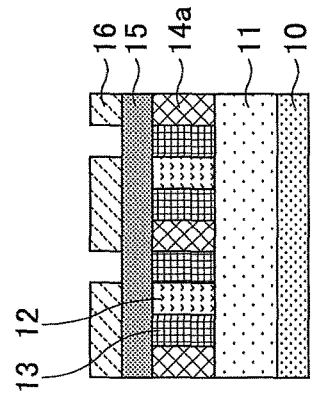
FIGS. 56A, 56B, and 56C illustrate another one of the processes of the pattern forming method of the second embodiment.
Figure 56B:
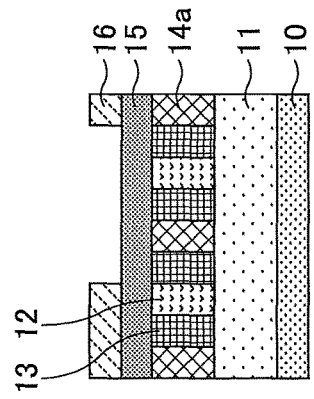
Figure 56A:
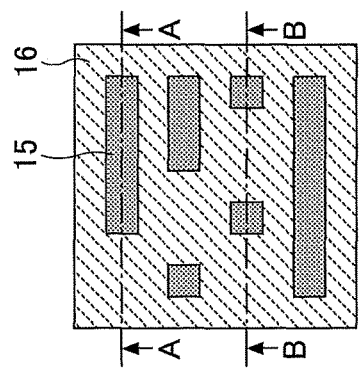

In step S209, the resist film is patterned. Specifically, as illustrated in FIGS. 56A to 56C, the resist film 16 is exposed to light having a wavelength of 193 nm emitted by ArF while intervening, for example, a dark field mask having multiple opening portions at predetermined positions as the exposure mask.

Figure 57C:
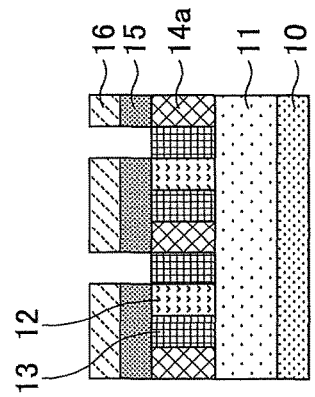
FIGS. 57A, 57B, and 57C illustrate another one of the processes of the pattern forming method of the second embodiment.
Figure 57B:
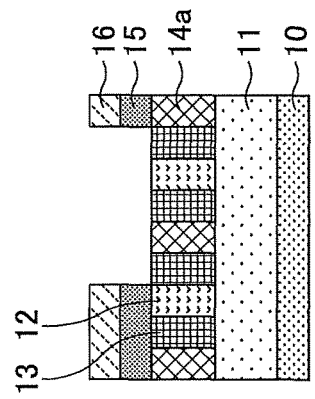
Figure 57A:
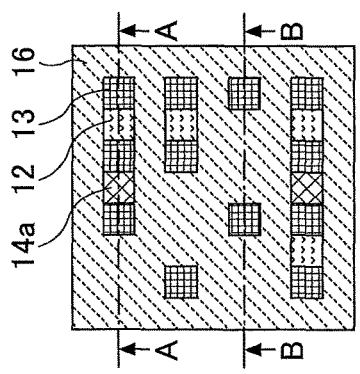

In step S210, the antireflection film is etched. Specifically, as illustrated in FIGS. 57A to 57C, the antireflection film 15 is etched by dry etching such as RIE using the resist film 16 as the etching mask.

In step S211, the spacer is etched. Specifically, as illustrated in FIGS. 58A to 58C, the spacer 13 is etched by dry etching such as RIE using the resist film 16 as the etching mask. With this, a line pattern formed by the spacer 13 is cut. For example, $CF_4$ can be used as the etching gas. At this time, the spacer 13 is formed of an $SiO_2$ film, the core 12 is made of polysilicon, and the first sacrificial film 14a is made of a material having high etching tolerance for $CF_4$. Therefore, the selection ratio of the core 12 for the spacer 13 and the selection ratio of the first sacrificial film 14a for the spacer 13 increase. Therefore, even if the position of the resist film 16 as the etching mask improperly shifts, it is possible to prevent the core 12 and the first sacrificial film 14a from being etched. As a result, the processing accuracy of the patterning is improved.

In step S212, the resist film and the antireflection film are removed. Specifically, as illustrated in FIGS. 59A to 59C, the resist film 16 and the antireflection film 15 remaining on the core 12, the spacer 13, and the first sacrificial film 14a are removed by dry etching such as RIE.

In step S213, a second sacrificial film is formed. Specifically, as illustrated in FIGS. 60A to 60C, the first sacrificial film 18 is formed so as to cover the surface of the core 12, the surface of the spacer 13, and the surface of the first sacrificial film 14a by conducting spin coating of a liquid solution containing the first sacrificial film 14. The second sacrificial film 18 may be made of the same material as that of the first sacrificial film 14. The second sacrificial film 18 is made of an organic metal compound whose etching tolerance is improved by providing a predetermined process. After conducting the spin coating with the liquid solution containing the material of the first sacrificial film 18, the liquid solution may be heated, if necessary, at a low temperature (for example, 100° C.) and then dried.

In step S214, the core, the spacer, and the first sacrificial film are exposed. Specifically, as illustrated in FIGS. 61A to 61C, the second sacrificial film 18 is etched by, for example, wet etching until the upper surface of the core 12, the upper surface of the spacer 13, and the upper surface of the first sacrificial film 14 are exposed from the second sacrificial film 18. At this time of etching, the second sacrificial film 18 remains on the side surface of the core 12, the side surface of the spacer 13, and the side surface of the first sacrificial film 14. The wet etching may be a method of supplying the organic solvent to the second sacrificial film 18, for example. From the view point that the etching amount for the second sacrificial film 18 can be easily controlled, it is preferable to use a solvent having a slow solution rate of solving the second sacrificial film 18. Ashing may be used instead of the wet etching to etch the second sacrificial film 18.

In step S215, the second sacrificial film is converted. Specifically, as illustrated in FIGS. 62A to 62C, a predetermined process is applied to the second sacrificial film 18 so as to improve etching tolerance of the second sacrificial film 18. Hereinafter, the second sacrificial film 18 after the conversion is referred to as a "second sacrificial film 18a". The predetermined process can be determined depending on the material of the second sacrificial film 18 in a manner similar to the first sacrificial film 14.

In step S216, the spacer is etched. Specifically, as illustrated in FIG. 63, the spacer 13 is etched by dry etching such as RIE. For example, $CF_4$ can be used as the etching gas.

Figure 64C:
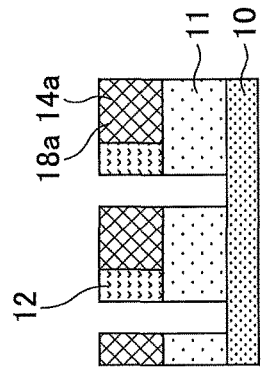
FIGS. 64A, 64B, and 64C illustrate another one of the processes of the pattern forming method of the second embodiment.
Figure 64B:
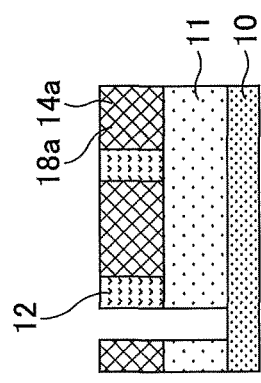
Figure 64A:
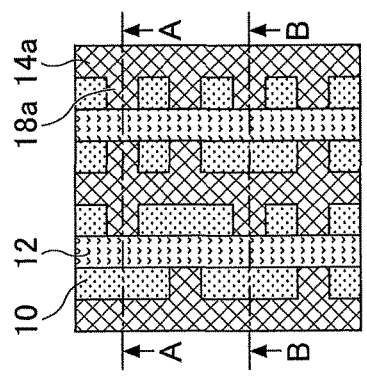

In step S217, the second underlayer film is etched. Specifically, as illustrated in FIGS. 64A to 64C, the second underlayer film 11 is etched by dry etching such as RIE using the core 12, the first sacrificial film 14a, and the second sacrificial film 18a as the etching mask.

Figure 65C:
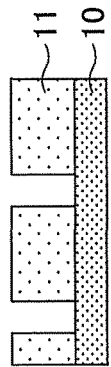
FIGS. 65A, 65B, and 65C illustrate another one of the processes of the pattern forming method of the second embodiment.
Figure 65B:
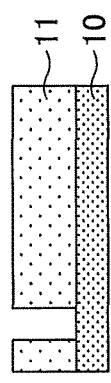
Figure 65A:
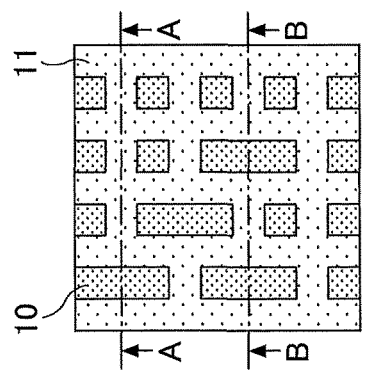

In step S218, the core, the first sacrificial film, and the second sacrificial film are removed. Specifically, as illustrated in FIGS. 65A to 65C, the core 12, the first sacrificial film 14a, and the second sacrificial film 18a are removed by dry etching such as RIE.

With the above processes, a desirable pattern can be formed.

As described above, in the pattern forming method of the second embodiment in a manner similar to the first embodiment, after forming the spacer 13 on the side surface of the core 22, the line pattern formed by the spacer 13 is cut without removing the core 12. Therefore, because the registration mark formed of the core is not etched, the size of the registration mark does not become small. As a result, readout accuracy of the registration mark can be improved in a later process.

Third Embodiment

Figure 66:
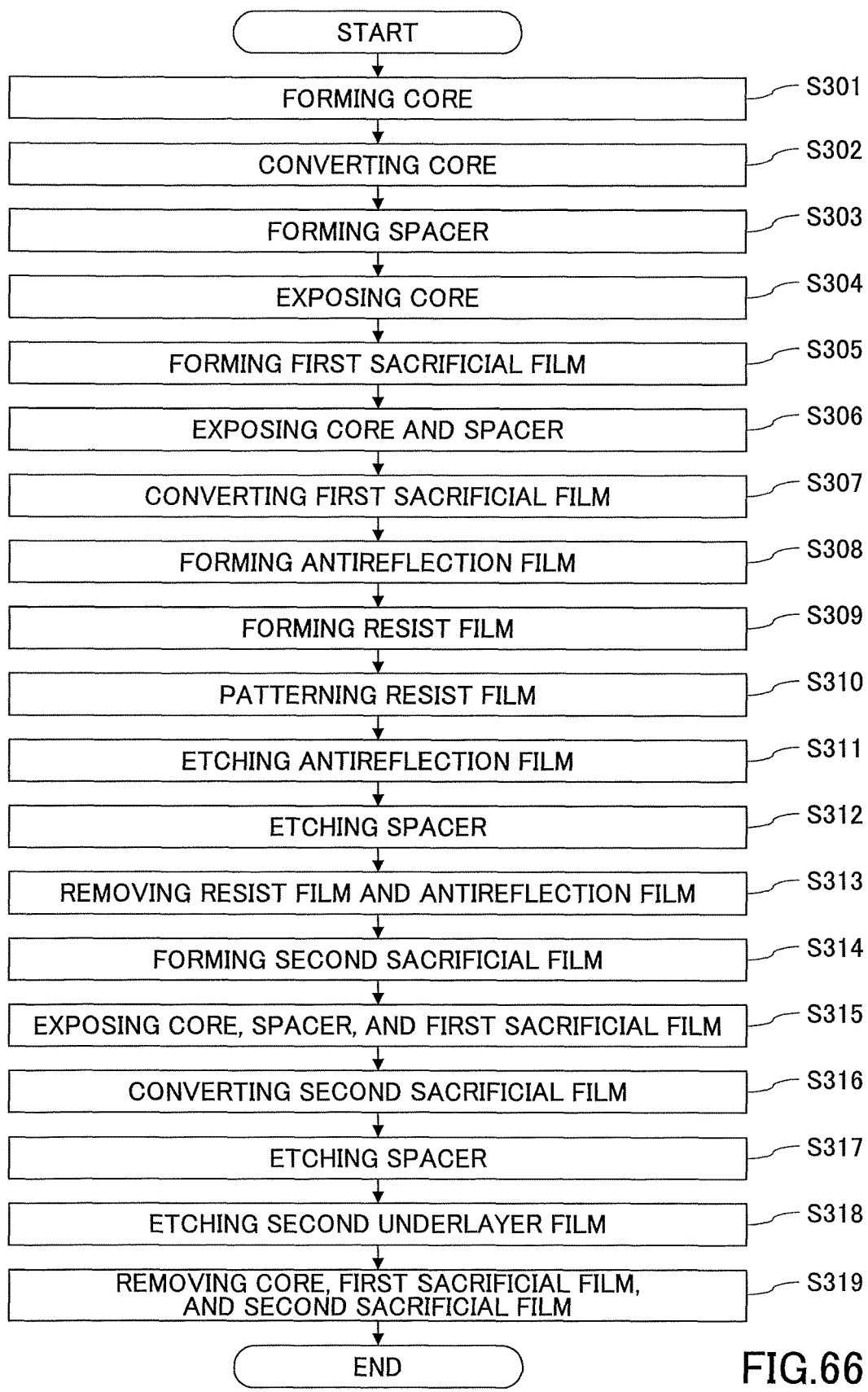
FIG. 66 is a flowchart illustrating an example of the pattern forming method of a third embodiment.

A pattern forming method for forming a pattern according to a third embodiment is described next. FIG. 66 is a flowchart illustrating the pattern forming method of the third embodiment.

The pattern forming method of the third embodiment differs from the pattern forming method of the second embodiment at a point that the core is not made of polysilicon but the same material as that of the first sacrificial film. Said differently, the core is made of an organic metal compound whose etching tolerance for the etching gas used at a time of etching a semiconductor, an insulating film, and an organic film is improved by applying a predetermined process. Hereinafter, a point different from the second embodiment is mainly described.

As illustrated in FIG. 66, the pattern forming method of the third embodiment includes: forming a core (step S301), converting the core (step S302), forming a spacer (step S303), exposing the core (step S304), forming a first sacrificial film (step S305), exposing the core and spacer (step S306), converting a first sacrificial film (step S307), forming an antireflection film (step S308), forming a resist film (step S309), patterning the resist film (step S310), etching the antireflection film (step S311), etching the spacer (step S312), removing the resist film and the antireflection film (step S313), forming a second sacrificial film (step S314), exposing the core, the spacer, and the first sacrificial film (step S315), converting the second sacrificial film (step S316), etching the spacer (step S317), etching second underlayer film (step S318), removing the core, the first sacrificial film, and the second sacrificial film (step S319).

Hereinafter, the steps are described with reference to FIGS. 67A to 85C. FIGS. 67A to 85C schematically illustrate processes of the pattern forming method of the third embodiment. FIGS. 67A, 68A, . . . , 85A are plan views in each of the steps. FIGS. 67B, 68B, . . . , 85B are cross-sectional views taken along a dashed-dotted line A-A respectively of FIGS. 67A, 68A, . . . , 85A. FIGS. 67C, 68C, . . . , 85C are cross-sectional views taken along a dashed-dotted line B-B respectively of 67A, 68A, . . . , 85A.

The materials used in the following steps may be the same as those in the second embodiment.

In step S301, the core is formed. Specifically, as illustrated in FIGS. 67A to 67C, the core 22 is formed by the same material as that of the first sacrificial film 14 on the second embodiment that is formed on the second underlayer film. Said differently, the core 22 is made of an organic metal compound whose etching tolerance for the etching gas used at a time of etching a semiconductor, an insulating film, and an organic film is improved by applying a predetermined process. The core 22 is an example of the first film such as polysilicon. Subsequently, light exposure having a wavelength of 193 nm using ArF and development undergo so as to pattern the core 22 to have a line and space shape, which includes lines arranged while interposing a predetermined distance. Next, a slimming processing is conducted to form a fine pattern smaller than the resolution limit in the photolithography technique.

In step S302, the core is converted. Specifically, as illustrated in FIGS. 68A to 68C, by applying a predetermined process to the core 22, the etching tolerance can be improved. Hereinafter, the core after the conversion is referred to as a "core 22a". The predetermined process can be determined depending on the material of the core 22. For example, in a case where etching tolerance of a material is improved when the core 22 is heated at a high temperature (for example, 300° C.), the core 22 is heated at the high temperature by heater heating or radiational heating so as to convert the core 22. For example, in a case where the material of the core 22 has improved etching tolerance when it is irradiated by an ultraviolet ray, the core 22 is irradiated by the ultraviolet ray so as to convert the core 22.

Steps S303 to S319 may be processes similar to steps S202 to S218 of the second embodiment illustrated in FIG. 47.

In step S303, the spacer is formed. Specifically, as illustrated in FIGS. 69A to 69C, the spacer 13 having a film thickness substantially the same as the line width of the core 22a so as to cover the surface (the upper surface and the side surface) of the core 22a by, for example, CVD or ALD.

In step S304, the core is exposed. Specifically, as illustrated in FIGS. 70A to 70C, the spacer 13 is etched until the upper surface of the core 22a is exposed by dry etching such as RIE. At this time of etching, the spacer 13 is left on the side surface of the core 22a.

In step S305, a first sacrificial film is formed. Specifically, as illustrated in FIGS. 71A to 71C, the first sacrificial film 14 is formed so as to cover the surface of the core 22a and the surface of the spacer 13 by conducting spin coating of a liquid solution containing the first sacrificial film 14.

In step S306, the core and the spacer are exposed. Specifically, as illustrated in FIGS. 72A to 72C, the first sacrificial film 14 is etched by, for example, wet etching until the upper surface of the core 22a and the upper surface of the spacer 13 are exposed from the first sacrificial film 14. At this time of etching, the first sacrificial film 14 is left on the side surface of the spacer 13.

In step S307, the first sacrificial film is converted. Specifically, as illustrated in FIGS. 73A to 73C, a predetermined process is applied to the first sacrificial film 14 so as to improve etching tolerance of the first sacrificial film 14.

In step S308, an antireflection film is formed. Specifically, as illustrated in FIGS. 74A to 74C, an antireflection film 15 is formed by conducting, for example, spin coating on the core 22a, the spacer 13, and the first sacrificial film 14a.

In step S309, the resist film is formed. Specifically, as illustrated in FIGS. 75A to 75C, the resist film 16 is formed on the antireflection film 15.

In step S310, the resist film is patterned. Specifically, as illustrated in FIGS. 76A to 76C, the resist film 16 is exposed to light having a wavelength of 193 nm emitted by ArF while intervening, for example, a dark field mask having multiple opening portions at predetermined positions as an exposure mask.

Figure 77A:
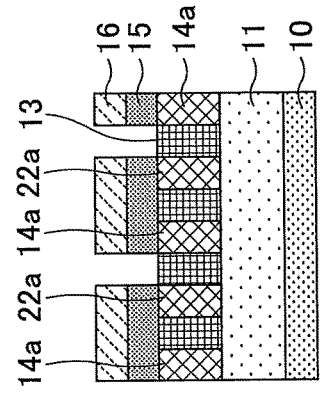
FIGS. 77A, 77B, and 77C illustrate another one of the processes of the pattern forming method of the third embodiment.
Figure 77B:
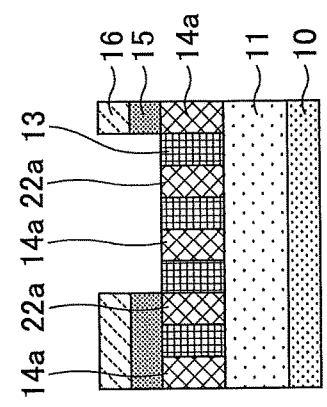
Figure 77C:
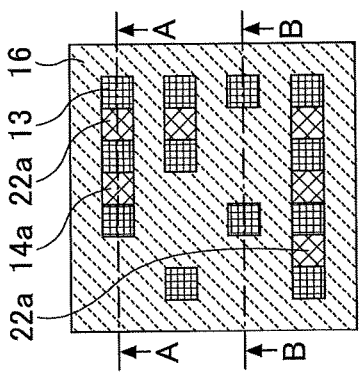

In step S311, the antireflection film is etched. Specifically, as illustrated in FIGS. 77A to 77C, the antireflection film 15 is etched by dry etching such as RIE using the resist film 16 as the etching mask.

Figure 78A:
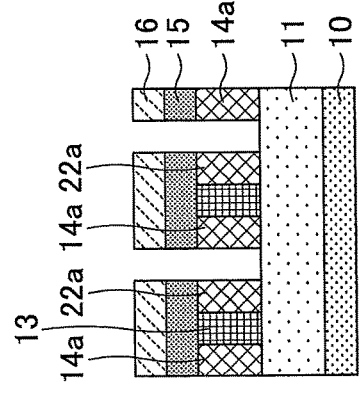
FIGS. 78A, 78B, and 78C illustrate another one of the processes of the pattern forming method of the third embodiment.
Figure 78B:
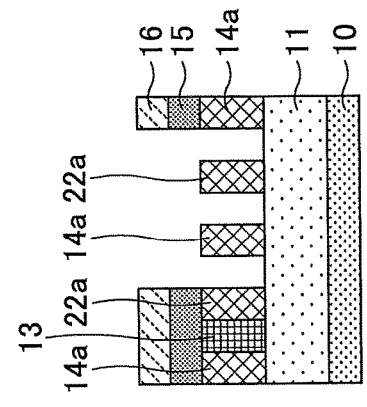
Figure 78C:
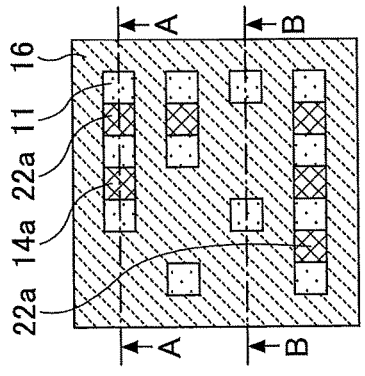

In step S312, the spacer is etched. Specifically, as illustrated in FIGS. 78A to 78C, the spacer 13 is etched by dry etching such as RIE using the resist film 16 as the etching mask. With this, a line pattern formed by the spacer 13 is cut.

Figure 79B:
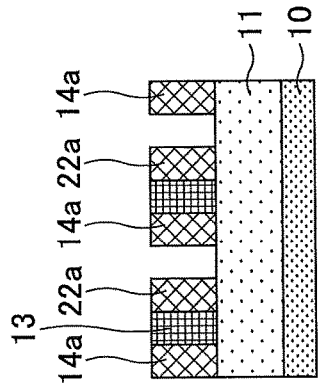
FIGS. 79A, 79B, and 79C illustrate another one of the processes of the pattern forming method of the third embodiment.
Figure 79C:
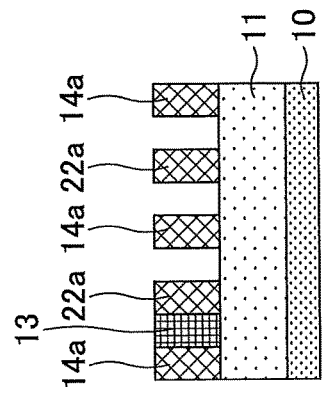
Figure 79A:
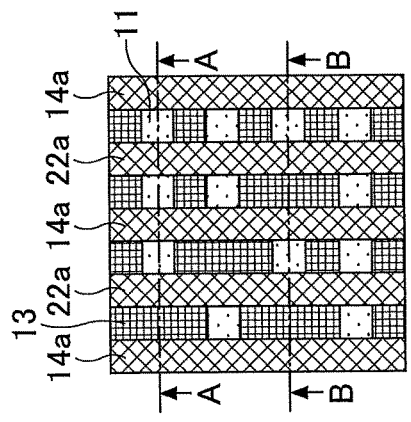

In step S313, the resist film and the antireflection film are removed. Specifically, as illustrated in FIGS. 79A to 79C, the resist film 16 and the antireflection film 15 remaining on the core 22, the spacer 13, and the first sacrificial film 14a are removed by dry etching such as RIE.

Figure 80B:
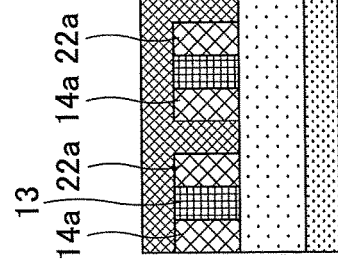
FIGS. 80A, 80B, and 80C illustrate another one of the processes of the pattern forming method of the third embodiment.
Figure 80C:
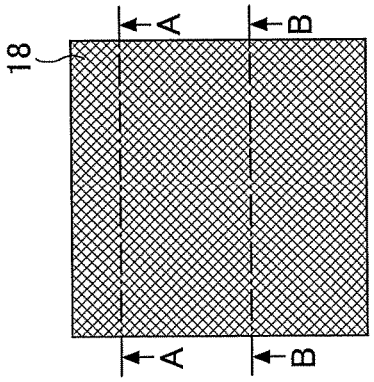
Figure 80A:
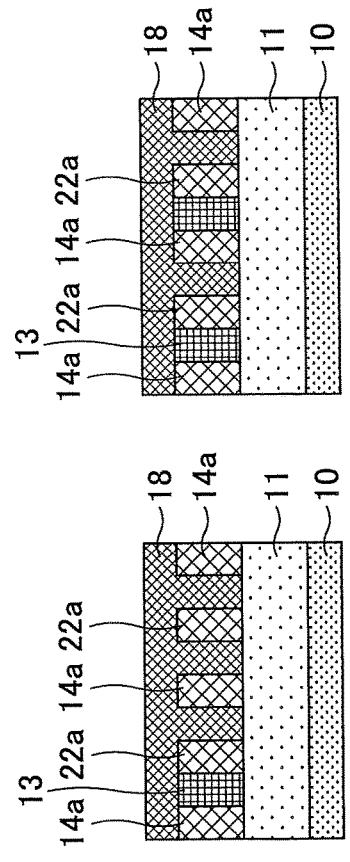

In step S314, a second sacrificial film is formed. Specifically, as illustrated in FIGS. 80A to 80C, the second sacrificial film 18 is formed so as to cover the surface of the core 22a, the surface of the spacer 13, and the surface of the first sacrificial film 14a by conducting spin coating of a liquid solution containing the second sacrificial film 18.

In step S315, the core, the spacer, and the first sacrificial film are exposed. Specifically, as illustrated in FIGS. 81A to 81C, the second sacrificial film 18 is etched by, for example, wet etching until the upper surface of the core 22a, the upper surface of the spacer 13, and the upper surface of the first sacrificial film 14a are exposed from the second sacrificial film 18. At this time of etching, the second sacrificial film 18 remains on the side surface of the core 22a, the side surface of the spacer 13, and the side surface of the first sacrificial film 14a.

In step S316, the second sacrificial film is converted. Specifically, as illustrated in FIGS. 82A to 82C, a predetermined process is applied to the second sacrificial film 18 so as to improve etching tolerance of the second sacrificial film 18.

In step S317, the spacer is etched. Specifically, as illustrated in FIG. 83, the spacer 13 is etched by dry etching such as RIE.

In step S318, an underlayer film is etched. Specifically, as illustrated in FIGS. 84A to 84C, the second underlayer film 11 is etched by dry etching such as RIE using the core 22a, the first sacrificial film 14a, and the second sacrificial film 18a, as the etching mask. At this time, all of the core 22a, the first sacrificial film 14a, and the second sacrificial film 18a are made of the same material, which has high etching tolerance for an etching gas used to etch a semiconductor, an insulating film, and an organic film. Therefore, the selection ratio of the etching mask (the core 22a, the first sacrificial film 14a, and the second sacrificial film 18a) relative to the second underlayer film 11 is high. As a result, a transcription property of transcripting the pattern to the second underlayer film 11 is improved.

In step S319, the core, the first sacrificial film, and the second sacrificial film are removed. Specifically, as illustrated in FIGS. 85A to 85C, the core 22a, the first sacrificial film 14a, and the second sacrificial film 18a are removed by dry etching such as RIE.

With the above processes, a desirable pattern can be formed.

As described above, in the pattern forming method of the third embodiment in a manner similar to the first and second embodiments, after forming the spacer 13 on the side surface of the core 22, the line pattern formed by the spacer 13 is cut without removing the core 13. Therefore, because the registration mark formed of the core 22 is not etched, the size of the registration mark does not become small. As a result, readout accuracy of the registration mark can be improved in a later process.

Especially in the third embodiment, the etching mask at a time of etching the second underlayer film 11 is formed by the same material, which has high etching tolerance for an etching gas used to etch the a semiconductor, an insulating film, and an organic film. Therefore, the selection ratio of the etching mask relative to the second underlayer film 11 becomes high. As a result, a transcription property of transcripting the pattern to the second underlayer film 11 is improved.

Fourth Embodiment

Figure 86:
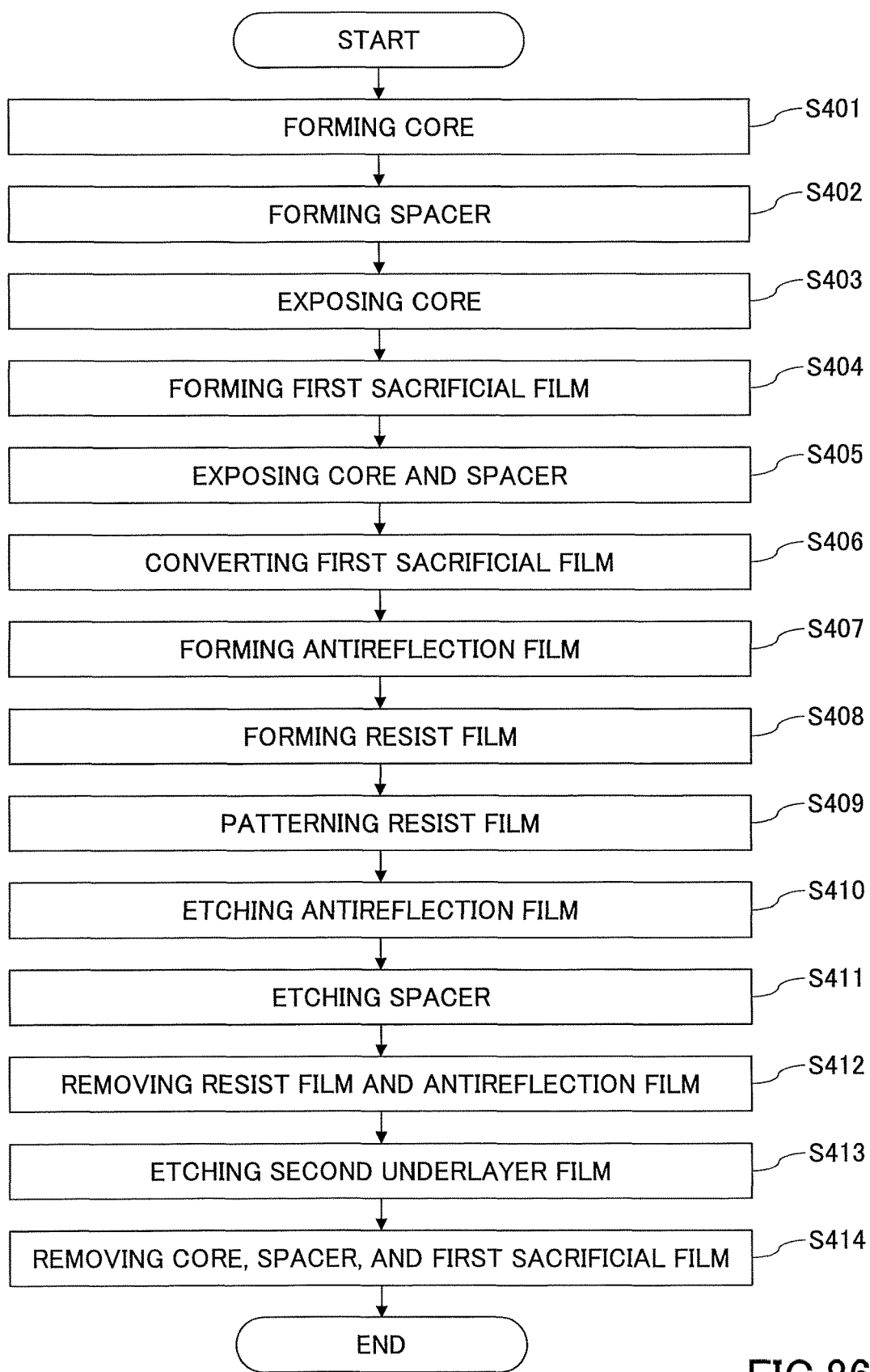
FIG. 86 is a flowchart illustrating an example of the pattern forming method of a fourth embodiment.

A pattern forming method for forming a pattern according to a fourth embodiment is described next. FIG. 86 is a flowchart illustrating the pattern forming method of the fourth embodiment.

The pattern forming method of the fourth embodiment differs from the pattern forming method of the second embodiment at a point that the bright field mask is used as the exposure mask in place of the dark field mask in exposing in a process of patterning the resist film. Hereinafter, a point different from the second embodiment is mainly described.

As illustrated in FIG. 86, the pattern forming method of the third embodiment includes: forming a core (step S401), forming a spacer (step S402), exposing the core (step S403), forming a first sacrificial film (step S404), exposing the core and spacer (step S405), converting a first sacrificial film (step S406), forming an antireflection film (step S407), forming a resist film (step S408), patterning the resist film (step S409), etching the antireflection film (step S410), etching the spacer (step S411), removing the resist film and the antireflection film (step S412), etching second underlayer film (step S413), removing the core, the spacer, and the first sacrificial film (step S414).

Figure 87A:
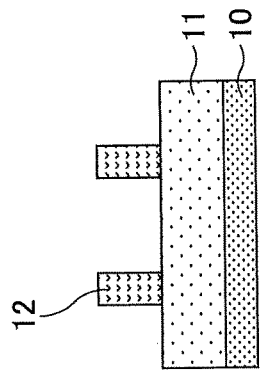
FIGS. 87A, 87B, and 87C illustrate one of processes of the pattern forming method of the fourth embodiment.
Figure 87B:
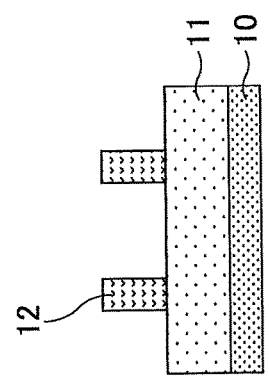
Figure 87C:
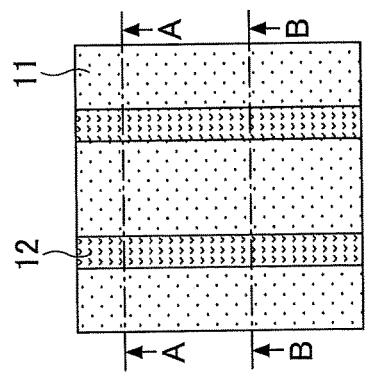
Figure 88A:
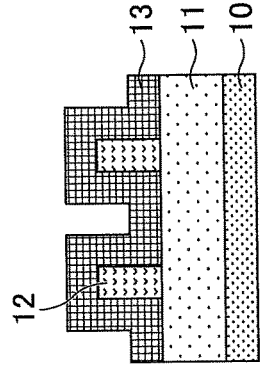
FIGS. 88A, 88B, and 88C illustrate one of processes of the pattern forming method of the fourth embodiment.
Figure 88B:
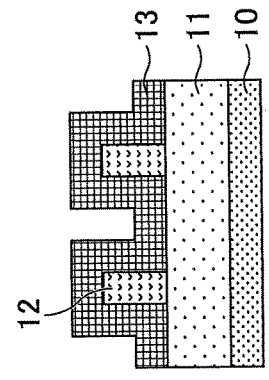
Figure 88C:
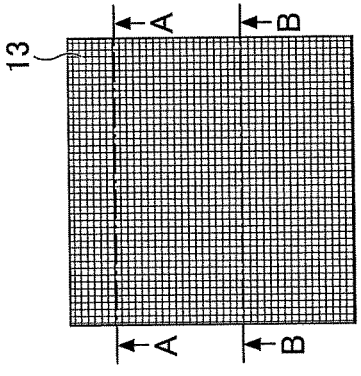

Hereinafter, the steps are described with reference to FIGS. 87A to 100C. FIGS. 87A to 100C schematically illustrate processes of the pattern forming method of the first embodiment. FIGS. 87A, 88A, . . . , 100A are plan views in each of the steps. FIGS. 87B, 88B, . . . , 100B are cross-sectional views taken along a dashed-dotted line A-A respectively of FIGS. 87A, 88A, . . . , 100A. FIGS. 87C, 88C, . . . , 100C are cross-sectional views taken along a dashed-dotted line B-B respectively of 87A, 88A, . . . , 100A.

The materials used in the following steps may be the same as those in the second embodiment.

Steps S401 to S408 may be processes similar to steps S201 to S208 of the second embodiment illustrated in FIG. 47.

In step S401, the core is formed. Specifically, as illustrated in FIGS. 87A to 87C, the core 12 is formed on the second underlayer film 11 formed on the first underlayer film 10 by, for example, CVD. Subsequently, light exposure having a wavelength of 193 nm using ArF and development undergo so as to pattern the core 12 to have a line and space shape, which includes lines arranged while interposing a predetermined distance. Next, a slimming processing is conducted to form a fine pattern smaller than the resolution limit in the photolithography technique.

In step S402, the spacer is formed. Specifically, as illustrated in FIGS. 88A to 88C, the spacer 13 having a film thickness substantially the same as the line width of the core 12 is formed so as to cover the surface (the upper surface and the side surface) of the core 12 by, for example, CVD or ALD.

In step S403, the core is exposed. Specifically, as illustrated in FIGS. 89A to 89C, the spacer 13 is etched until the upper surface of the core 12 is exposed by dry etching such as RIE. At this time of etching, the spacer 13 is left on the side surface of the core 12.

In step S404, a first sacrificial film is formed. Specifically, as illustrated in FIGS. 90A to 90C, the first sacrificial film 14 is formed so as to cover the surface of the core 12 and the surface of the spacer 13 by conducting the spin coating of a liquid solution containing the first sacrificial film 14.

In step S405, the core and the spacer are exposed. Specifically, as illustrated in FIGS. 91A to 91C, the first sacrificial film 14 is etched by wet etching until the upper surface of the core 12 and the upper surface of the spacer 13 are exposed from the first sacrificial film 14. At this time of etching, the first sacrificial film 14 is left on the side surface of the spacer 13.

In step S406, the first sacrificial film is converted. Specifically, as illustrated in FIGS. 92A to 92C, a predetermined process is applied to the first sacrificial film 14 so as to improve etching tolerance of the first sacrificial film 14.

In step S407, an antireflection film is formed. Specifically, as illustrated in FIGS. 93A to 93C, an antireflection film 15 is formed by, for example, spin coating on the core 12, the spacer 13, and the first sacrificial film 14a.

In step S408, the resist film is formed. Specifically, as illustrated in FIGS. 94A to 94C, the resist film 16 is formed on the antireflection film 15.

In step S409, the resist film is patterned. Specifically, as illustrated in FIGS. 95A to 95C, the resist film 16 is exposed to light having a wavelength of 193 nm emitted by ArF while intervening, for example, a bright field mask having multiple light shielding portions at predetermined positions as the exposure mask.

In step S410, the antireflection film is etched. Specifically, as illustrated in FIGS. 96A to 96C, the antireflection film 15 is etched by dry etching such as RIE using the resist film 16 as the etching mask.

In step S411, the spacer is etched. Specifically, as illustrated in FIGS. 97A to 97C, the spacer 13 is etched by dry etching such as RIE using the resist film 16 as the etching mask. With this, a line pattern formed by the spacer 13 is cut.

In step S412, the resist film and the antireflection film are removed. Specifically, as illustrated in FIGS. 98A to 98C, the resist film 16 and the antireflection film 15 remaining on the core 12, the spacer 13, and the first sacrificial film 14a are removed by dry etching such as RIE.

Figure 99B:
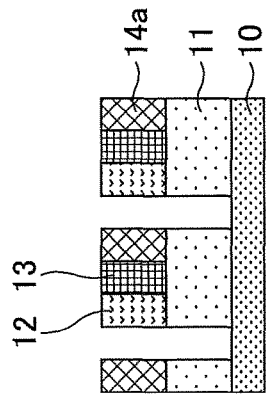
FIGS. 99A, 99B, and 99C illustrate another one of the processes of the pattern forming method of the fourth embodiment.
Figure 99C:
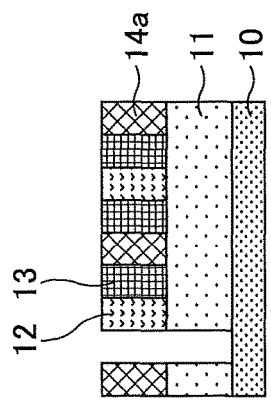
Figure 99A:
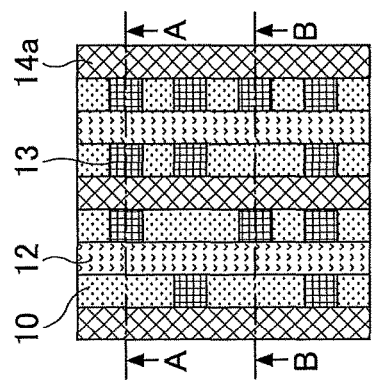

In step S413, the second underlayer film is etched. Specifically, as illustrated in FIGS. 99A to 99C, the second underlayer film 11 is etched by dry etching such as RIE using the core 12, the spacer 13, and the first sacrificial film 14a, as the etching mask.

Figure 100B:
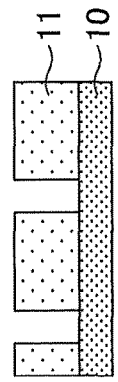
FIGS. 100A, 100B, and 100C illustrate another one of the processes of the pattern forming method of the second embodiment.
Figure 100C:
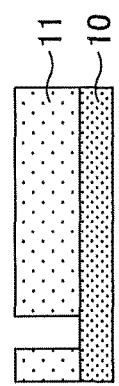
Figure 100A:
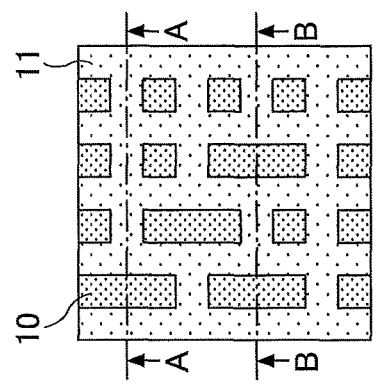

In step S414, the core, the spacer, and the first sacrificial film are removed. Specifically, as illustrated in FIGS. 100A to 100C, the core 12, the spacer 13, and the first sacrificial film 14a are etched by dry etching such as RIE. The order of removing the core 12, the spacer 13, and the first sacrificial film 14a is not specifically limited.

With the above processes, a desirable pattern can be formed.

As described above, in the pattern forming method of the fourth embodiment in a manner similar to the first to third embodiments, after forming the spacer 13 on the side surface of the core 12, the line pattern formed by the spacer 13 is cut without removing the core 12. Therefore, because the registration mark formed of the core 12 is not etched, the size of the registration mark does not become small. As a result, readout accuracy of the registration mark can be improved in a later process.

As described, the disclosed pattern forming method enables readout accuracy of the registration mark to be improved in pattern formation using an 1D layout.

All examples and conditional language recited herein are intended for pedagogical purposes to aid the reader in understanding the invention embodiments and the concepts contributed by the inventor to furthering the art, and are to be construed as being without limitation to such specifically recited examples and conditions, nor does the organization of such examples in the specification relate to a showing of superiority or inferiority of the invention embodiments. Although the pattern forming method have been described in detail, it should be understood that the various changes, substitutions, and alterations could be made hereto without departing from the spirit and scope of the invention.

What is claimed is:

1. A pattern forming method comprising:
    forming a first film patterned in a line and space shape on an underlayer film, the line and space shape including a plurality of lines and a space arranged between the lines;
    forming a second film to cover the first film;
    removing the second film formed on an upper surface of the first film to form the second film on a side surface of the first film in a line shape;
    forming a third film to cover the first film and the second film, the third film being comprised of an organic metal compound having a first etching tolerance;
    removing the third film formed on the upper surface of the first film and an upper surface of the second film to cause the third film to remain on a side surface of the second film; and
    converting, after the removing the third film formed on the upper surface of the first film and the upper surface of the second film, to cause the organic metal compound of the third film remaining on the side surface of the second film to have a second etching tolerance that is greater than the first etching tolerance, an etching tolerance of the organic metal compound having a characteristic of increasing when the organic metal compound has been converted.

2. The pattern forming method according to claim 1, the pattern forming method further comprising:
    patterning a line shape of the second film after the converting the third film.

3. The pattern forming method according to claim 1, wherein the forming the third film includes coating with a liquid solution containing the organic metal compound.

4. The pattern forming method according to claim 3, wherein the removing the third film includes removing the third film by wet etching using an organic solvent.

5. The pattern forming method according to claim 1, wherein the converting the third film includes heating the third film.

6. The pattern forming method according to claim 1, wherein the first film is comprised of an organic metal compound and the forming the first film includes converting the first film.

* * * * *